(12) United States Patent
Mihara

(10) Patent No.: US 11,183,510 B2
(45) Date of Patent: Nov. 23, 2021

(54) MANUFACTURING METHOD OF SEMICONDUCTOR DEVICE AND SEMICONDUCTOR DEVICE

(71) Applicant: Renesas Electronics Corporation, Tokyo (JP)

(72) Inventor: Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/831,123

(22) Filed: Dec. 4, 2017

(65) Prior Publication Data

US 2018/0182768 A1 Jun. 28, 2018

(30) Foreign Application Priority Data

Dec. 22, 2016 (JP) .............................. JP2016-249185

(51) Int. Cl.
*H01L 21/8239* (2006.01)
*H01L 27/1157* (2017.01)
(Continued)

(52) U.S. Cl.
CPC ...... *H01L 27/1157* (2013.01); *H01L 21/3086* (2013.01); *H01L 21/32134* (2013.01);
(Continued)

(58) Field of Classification Search
CPC ......... H01L 29/42344; H01L 29/66545; H01L 29/66833; H01L 29/792; H01L 29/4916
See application file for complete search history.

(56) References Cited

U.S. PATENT DOCUMENTS

| 8,536,007 B2 | 9/2013 | Hall et al. |
| 8,569,141 B2 * | 10/2013 | Huang .................... H01L 28/20 |
| | | 257/E21.09 |

(Continued)

FOREIGN PATENT DOCUMENTS

| JP | 2006-041354 A | 2/2006 |
| JP | 2015-026870 A | 2/2015 |

(Continued)

OTHER PUBLICATIONS

Japanese Office Action dated Feb. 18, 2020, in Japanese Patent Application No. 2016-249185 with an English translation.

(Continued)

*Primary Examiner* — Cuong Q Nguyen
*Assistant Examiner* — Peter M Albrecht
(74) *Attorney, Agent, or Firm* — McGinn IP Law Group, PLLC

(57) ABSTRACT

After a dummy control gate electrode and a memory gate electrode are formed and an interlayer insulating film is formed so as to cover the gate electrodes, the interlayer insulating film is polished to expose the dummy control gate electrode and the memory gate electrode. Thereafter, the dummy control gate electrode is removed by etching, and then a control gate electrode is formed in a trench which is a region from which the dummy control gate electrode has been removed. The dummy control gate electrode is made of a non-doped or n type silicon film, and the memory gate electrode is made of a p type silicon film. In the process of removing the dummy control gate electrode, the dummy control gate electrode is removed by performing etching under the condition that the memory gate electrode is less likely to be etched compared with the dummy control gate electrode, in the state where the dummy control gate electrode and the memory gate electrode are exposed.

20 Claims, 48 Drawing Sheets

(51) Int. Cl.

| | |
|---|---|
| *H01L 29/792* | (2006.01) |
| *H01L 29/78* | (2006.01) |
| *H01L 21/3213* | (2006.01) |
| *H01L 29/423* | (2006.01) |
| *H01L 29/49* | (2006.01) |
| *H01L 21/28* | (2006.01) |
| *H01L 27/11568* | (2017.01) |
| *H01L 27/11573* | (2017.01) |
| *H01L 21/308* | (2006.01) |
| *H01L 29/66* | (2006.01) |
| *H01L 27/092* | (2006.01) |
| *H01L 21/8238* | (2006.01) |

(52) U.S. Cl.
CPC .. *H01L 21/823821* (2013.01); *H01L 27/0924* (2013.01); *H01L 27/11568* (2013.01); *H01L 27/11573* (2013.01); *H01L 29/40117* (2019.08); *H01L 29/42344* (2013.01); *H01L 29/4933* (2013.01); *H01L 29/66545* (2013.01); *H01L 29/7851* (2013.01); *H01L 29/7855* (2013.01); *H01L 29/792* (2013.01)

(56) References Cited

U.S. PATENT DOCUMENTS

| | | | |
|---|---|---|---|
| 9,543,314 | B2 | 1/2017 | Mihara |
| 2005/0136677 | A1* | 6/2005 | Brask .................. H01L 21/0337 438/706 |
| 2006/0022260 | A1 | 2/2006 | Hisamoto et al. |
| 2006/0151842 | A1* | 7/2006 | Kapoor .................. G11C 11/412 257/391 |
| 2014/0187051 | A1* | 7/2014 | Wasyluk ........... H01L 21/32134 438/745 |
| 2015/0145023 | A1 | 5/2015 | Arigane et al. |
| 2015/0249145 | A1 | 9/2015 | Yoshimori et al. |
| 2015/0348786 | A1* | 12/2015 | Loiko .................. H01L 29/7883 257/316 |
| 2015/0349096 | A1* | 12/2015 | Winstead .......... H01L 29/66833 438/591 |
| 2016/0064389 | A1* | 3/2016 | Mihara ............... H01L 27/1157 257/314 |
| 2016/0141396 | A1 | 5/2016 | Arigane et al. |
| 2017/0278856 | A1 | 9/2017 | Yamaguchi |
| 2018/0286875 | A1* | 10/2018 | Okada ............... H01L 27/11521 |
| 2019/0341395 | A1 | 11/2019 | Yamaguchi |

FOREIGN PATENT DOCUMENTS

| | | |
|---|---|---|
| JP | 2015-103698 A | 6/2015 |
| JP | 2015-162621 A | 9/2015 |
| JP | 2016-051735 A | 4/2016 |
| WO | WO 2016/147316 A1 | 9/2016 |

OTHER PUBLICATIONS

Taiwanese Office Action dated Sep. 28, 2020, in Taiwanese Patent Application No. 106122168 with an English translation.

* cited by examiner

FIG. 36

| | OPERATION METHOD WRITE/ERASE | WRITE OPERATION VOLTAGE (V) Vmg/Vs/Vcg/Vd | ERASE OPERATION VOLTAGE (V) Vmg/Vs/Vcg/Vd | READ OPERATION VOLTAGE (V) Vmg/Vs/Vcg/Vd |
|---|---|---|---|---|
| A | SSI(WRITE)/BTBT(ERASE) | 10/5/1/0.5 | −6/6/0/open | 0/0/1.5/1.5 |
| B | SSI(WRITE)/FN(ERASE) | 10/5/1/0.5 | 12/0/0/0 | 0/0/1.5/1.5 |
| C | FN(WRITE)/BTBT(ERASE) | −12/0/0/0 | −6/6/0/open | 0/0/1.5/1.5 |
| D | FN(WRITE)/FN(ERASE) | −12/0/0/0 | 12/0/0/0 | 0/0/1.5/1.5 |

MANUFACTURING METHOD OF SEMICONDUCTOR DEVICE AND SEMICONDUCTOR DEVICE

CROSS-REFERENCE TO RELATED APPLICATION

The present application claims priority from Japanese Patent Application No. 2016-249185 filed on Dec. 22, 2016, the content of which is hereby incorporated by reference into this application.

TECHNICAL FIELD OF THE INVENTION

The present invention relates to a manufacturing method of a semiconductor device and a semiconductor device, and can be effectively applied to, for example, a manufacturing method of a semiconductor device having a non-volatile memory and a semiconductor device having a non-volatile memory.

BACKGROUND OF THE INVENTION

An EEPROM (Electrically Erasable and Programmable Read Only Memory) has been widely used as an electrically writable and erasable non-volatile semiconductor memory device. These memory devices represented by a flash memory which has been widely used at present include a conductive floating gate electrode or a trap insulating film surrounded by an oxide film under a gate electrode of a MISFET, and are configured to store the charge accumulation state of the floating gate electrode or the trap insulating film as memory information and read the memory information as a threshold of the transistor. This trap insulating film indicates an insulating film which is capable of accumulating a charge, and examples thereof include a silicon nitride film and the like. The threshold of the MISFET is shifted by injecting or releasing the charge into or from such a charge accumulating region, thereby operating the MISFET as the memory element. Examples of the flash memory include a split gate cell using a MONOS (Metal-Oxide-Nitride-Oxide-Semiconductor) film.

In addition, a fin-type transistor (FINFET: Fin Field Effect Transistor) has been known as a field effect transistor having high operation speed and capable of achieving the reduction in leakage current and power consumption and the miniaturization. The fin-type transistor is, for example, a semiconductor element including a plate-shaped (wall-shaped) semiconductor layer pattern projecting on the substrate as a channel layer and a gate electrode formed so as to be laid over the pattern.

Japanese Patent Application Laid-Open Publication No. 2006-41354 (Patent Document 1), Japanese Patent Application Laid-Open Publication No. 2015-162621 (Patent Document 2) and U.S. Pat. No. 8,536,007 (Patent Document 3) disclose techniques related to a non-volatile semiconductor memory device.

SUMMARY OF THE INVENTION

It is desired to reduce the manufacturing cost of a semiconductor device having a non-volatile memory or to improve the reliability of the semiconductor device. Alternatively, it is desired to reduce the manufacturing cost of a semiconductor device and to improve the reliability of a semiconductor device.

Other problems and novel features will be apparent from the description of the present specification and the attached drawings.

According to an embodiment, a manufacturing method of a semiconductor device includes: a step of forming a dummy gate electrode on a semiconductor substrate via a first insulating film; and a step of forming a first gate electrode for a memory cell of a non-volatile memory on the semiconductor substrate via a second insulating film having a charge accumulating portion therein so as to be adjacent to the dummy gate electrode. The manufacturing method of a semiconductor device further includes: a step of forming a first interlayer insulating film so as to cover the dummy gate electrode and the first gate electrode; a step of polishing the first interlayer insulating film to expose the dummy gate electrode and the first gate electrode; and a step of removing the dummy gate electrode by etching. The manufacturing method of a semiconductor device further includes: a step of forming a second gate electrode for the memory cell in a first trench which is a region from which the dummy gate electrode has been removed. The dummy gate electrode is made of a non-doped or n type silicon film, the first gate electrode is made of a p type silicon film, and in the step of removing the dummy gate electrode, the dummy gate electrode is removed by performing the etching under a condition that the first gate electrode is less likely to be etched compared with the dummy gate electrode, in the state where the dummy gate electrode and the first gate electrode are exposed.

According to an embodiment, it is possible to reduce the manufacturing cost of a semiconductor device or to improve the reliability of the semiconductor device. Alternatively, it is desired to reduce the manufacturing cost of a semiconductor device and to improve the reliability of a semiconductor device.

BRIEF DESCRIPTIONS OF THE DRAWINGS

FIG. 36 is a table showing an example of application conditions of voltages to each part of a selection memory cell at the time of "write", "erase" and "read";

DESCRIPTIONS OF THE PREFERRED EMBODIMENTS

Figure 1:
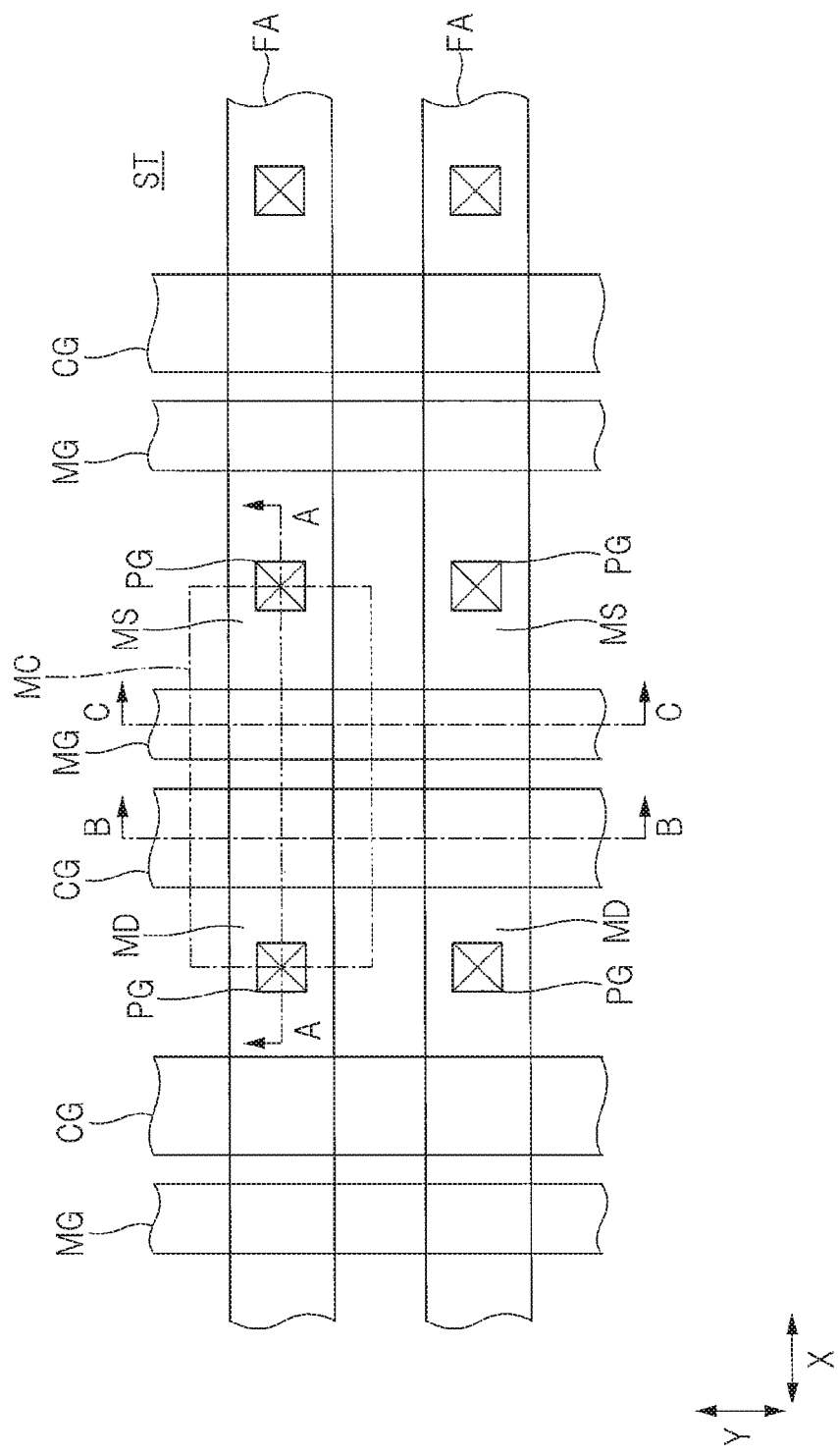
FIG. 1 is a plan view showing the principal part of a semiconductor device according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive descriptions thereof are omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

First Embodiment

<Structure of Semiconductor Device>

The semiconductor device according to the present embodiment and the subsequent embodiment is a semiconductor device including a non-volatile memory (non-volatile memory element, flash memory, non-volatile semiconductor memory device). In the present embodiment and the subsequent embodiment, the non-volatile memory will be described on the basis of a memory cell basically configured of an n channel MISFET (Metal Insulator Semiconductor Field Effect Transistor). Also, the polarity (polarity of an applied voltage at the time of write, erase and read or polarity of carrier) in the present embodiment and the subsequent embodiment is for describing the operation in the case of the memory cell basically configured of the n channel MISFET, and the same operation can be achieved in principle by reversing all the polarities including those of an applied potential, carrier conductivity type and others in the case of the memory cell basically configured of a p channel MISFET.

Figure 2:
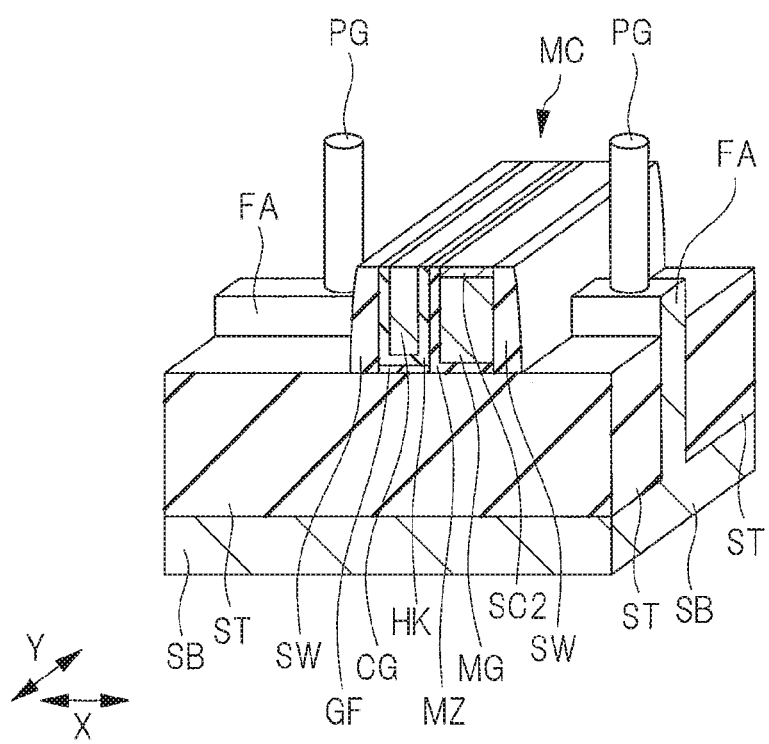
FIG. 2 is a perspective view showing the principal part of the semiconductor device according to the embodiment.
Figure 3:
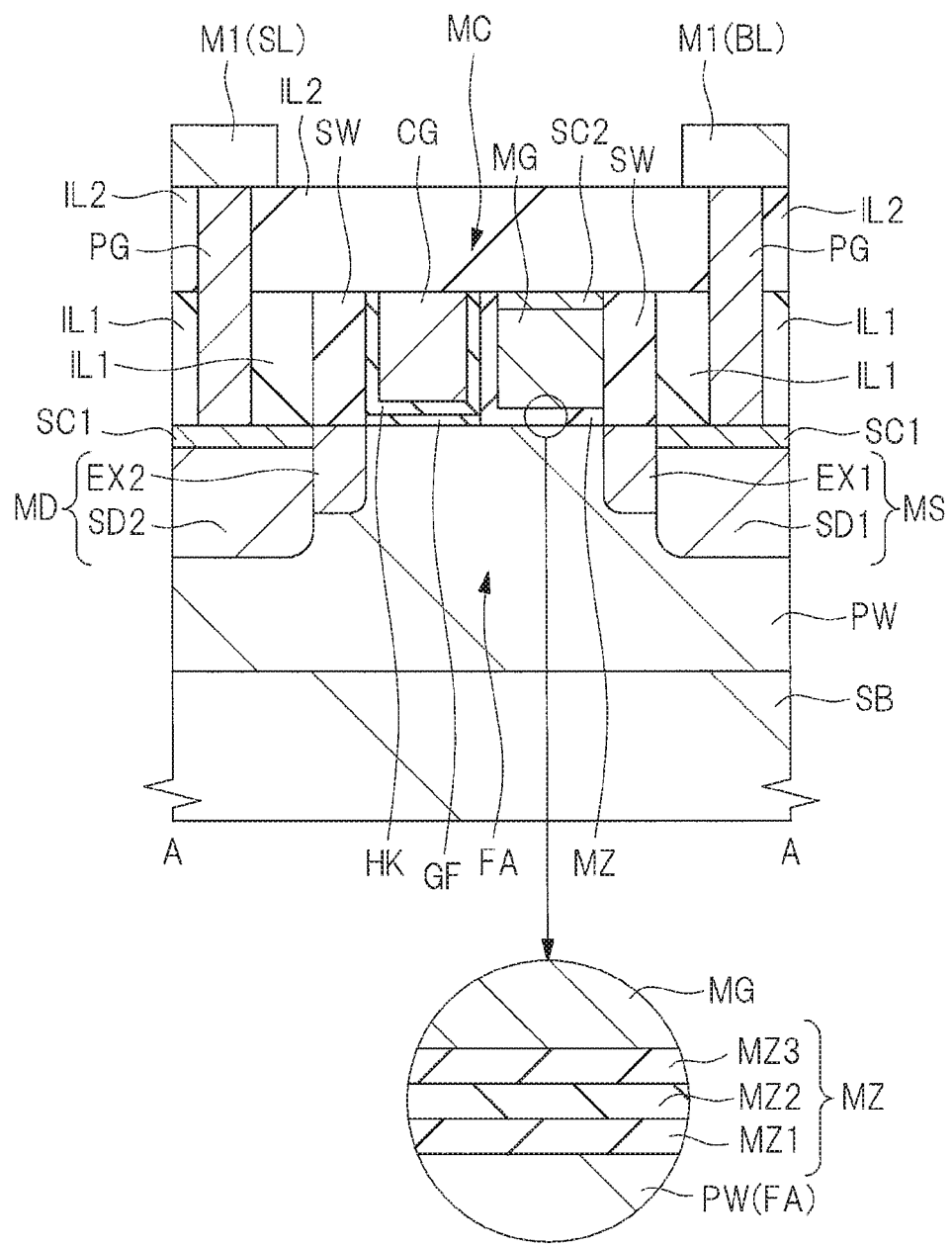
FIG. 3 is a cross-sectional view showing the principal part of the semiconductor device according to the embodiment.
Figure 4:
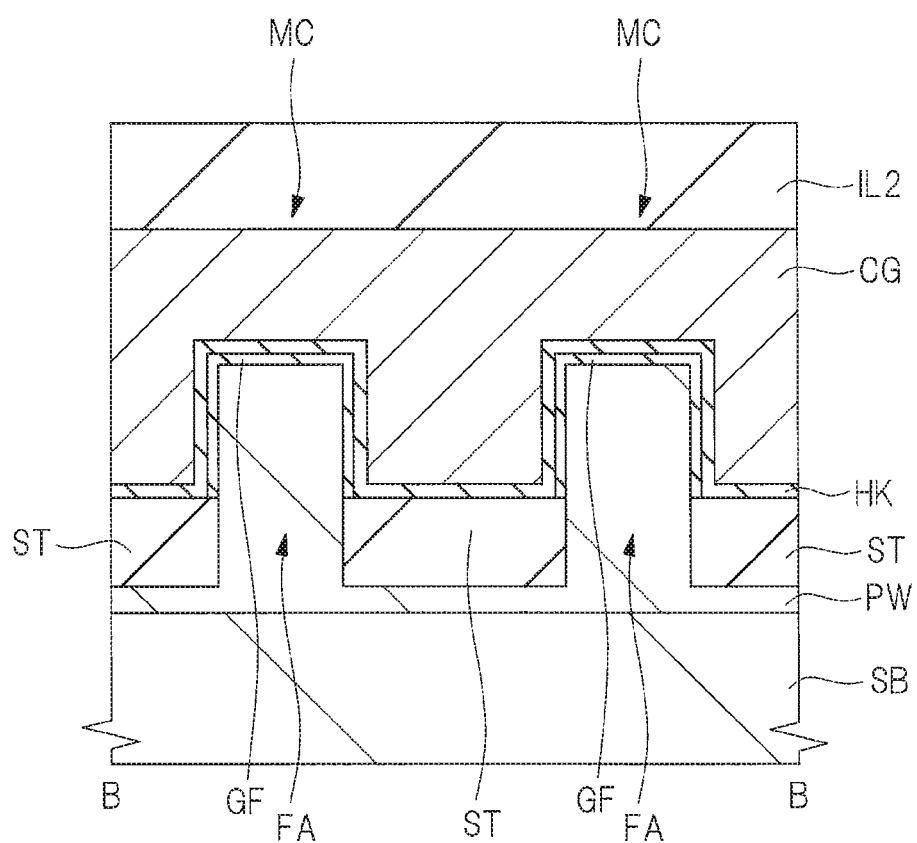
FIG. 4 is a cross-sectional view showing the principal part of the semiconductor device according to the embodiment.
Figure 5:
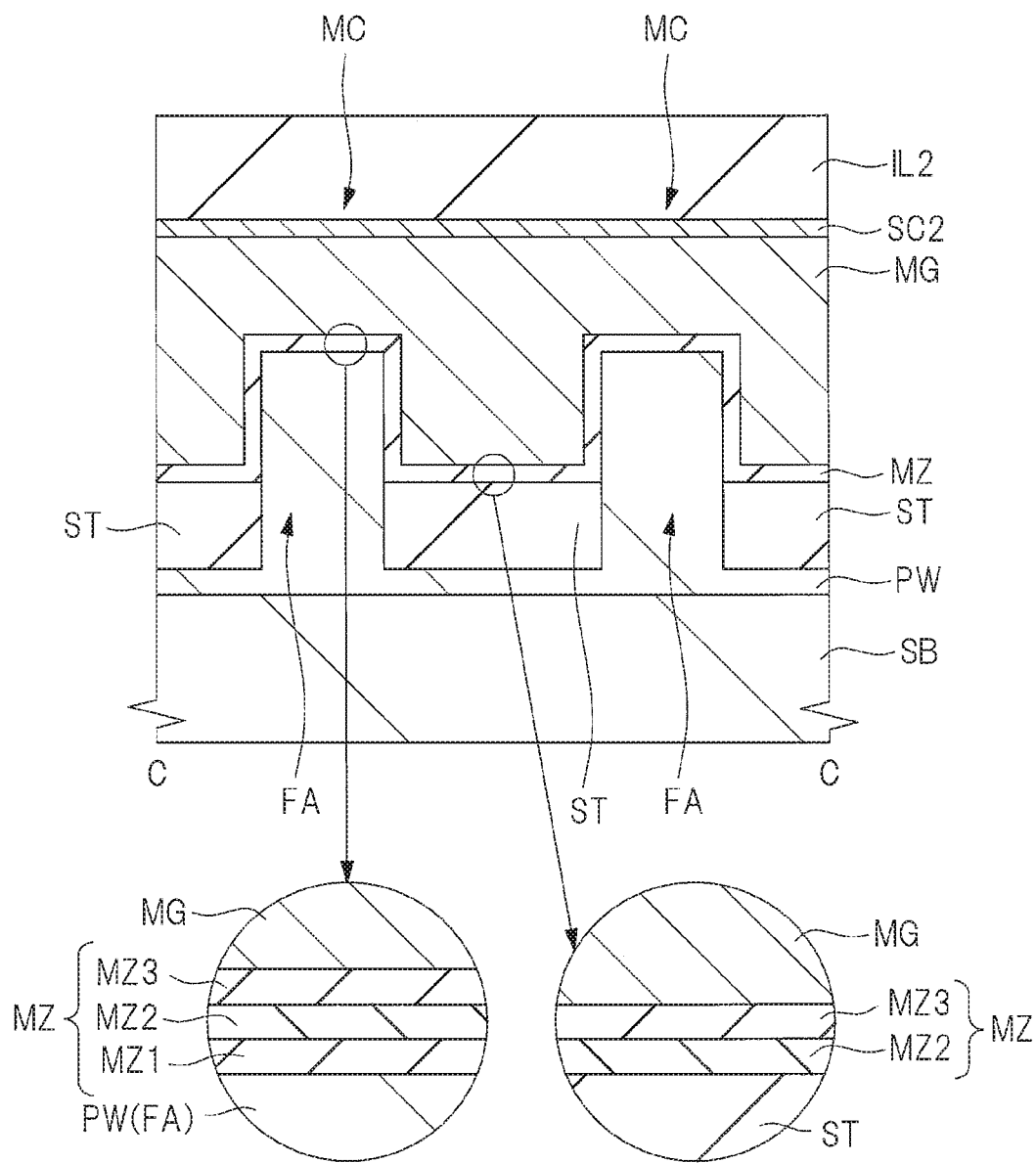
FIG. 5 is a cross-sectional view showing the principal part of the semiconductor device according to the embodiment.

The structure of the semiconductor device according to the present embodiment will be described with reference to FIGS. 1 to 5. FIG. 1 is a plan view showing the principal part of a semiconductor device according to the present embodiment, FIG. 2 is perspective view showing the principal part of the semiconductor device according to the present embodiment, and FIGS. 3 to 5 are cross-sectional views each showing the principal part of the semiconductor device according to the present embodiment. FIG. 1 shows a part of a memory region (memory cell array region) in which a plurality of memory cells of a non-volatile memory are formed in an array form. FIG. 2 schematically shows a perspective view of one memory cell in the plurality of memory cells formed in the memory cell region. In addition, FIG. 3 approximately corresponds to a cross-sectional view taken along a line A-A of FIG. 1, FIG. 4 approximately corresponds to a cross-sectional view taken along a line B-B of FIG. 1, and FIG. 5 approximately corresponds to a cross-sectional view taken along a line C-C of FIG. 1. Note that illustration of an insulating film IL3 to be described later is omitted in FIGS. 3 to 5.

As shown in FIGS. 1 to 5, a plurality of memory cells MC are arranged in an array form in a memory region of a semiconductor device. Note that the region (planar region) in which the plurality of memory cells MC are arranged in an array form in the semiconductor device is referred to as a memory region.

In the memory region, a plurality of fins (projecting portions) FA each extending in an X direction are arranged in a Y direction at equal intervals. Note that the X direction and the Y direction are directions along a main surface of a semiconductor substrate SB, and the X direction and the Y direction cross each other and more specifically are orthogonal to each other. Though not shown, the fin FA terminates at the end of the memory region and has both ends in the X direction.

Each of the fins FA is, for example, a projecting portion (convex portion) of a rectangular parallelepiped selectively projecting from the main surface of the semiconductor substrate SB, and has a wall shape (plate shape). The fin FA is a part of the semiconductor substrate SB, and functions as an active region of the semiconductor substrate SB. In a plan view, a gap between the fins FA adjacent in the Y direction is filled with an element isolation film (element isolation region) ST, and the fin FA is surrounded by the element isolation film ST. The fin FA is an active region for forming the memory cell MC. The semiconductor substrate SB is made of p type single crystal silicon having a specific resistance of, for example, about 1 to 10 Ωcm or the like.

Note that a part (upper part) of each fin FA is located at a position higher than an upper surface of the element isolation film ST. Thus, a lower part of each fin FA is surrounded by the element isolation film ST that covers the main surface of the semiconductor substrate SB in a plan view, whereas another part (upper part) of each fin FA projects upward above the element isolation film ST. Namely, all the region between the adjacent fins FA is not filled with the element isolation film ST, but the lower part of each fin FA is buried in (surrounded by) the element isolation film ST, and the upper part of each fin FA projects upward above the upper surface of the element isolation film ST and is not surrounded by the element isolation film ST. Each fin FA is made of a part of the semiconductor substrate SB, and is thus integrally connected to the semiconductor substrate SB present below the element isolation film ST.

In addition, a plurality of control gate electrodes CG and a plurality of memory gate electrodes MG each extending in the Y direction are arranged in the memory region. Namely, the plurality of control gate electrodes CG and the plurality of memory gate electrodes MG extending in the Y direction are arranged on the plurality of fins FA. Each of the control gate electrodes CG and each of the memory gate electrodes MG extend in the Y direction on the plurality of fins FA and on the element isolation film ST between the fins FA. Accordingly, in a plan view, each of the control gate electrodes CG and each of the memory gate electrodes MG extend in the Y direction so as to cross the plurality of fins FA extending in the X direction.

The control gate electrode CG and the memory gate electrode MG extend in the Y direction in a state of being adjacent to each other. However, since insulating films MZ and HK are interposed between the control gate electrode CG and the memory gate electrode MG, the control gate electrode CG and the memory gate electrode MG are not in contact with each other. Also, the fin FA and the control gate electrode CG are not in contact with each other, and insulating films GF and HK are interposed between the fin FA and the control gate electrode CG. Further, the fin FA and the memory gate electrode MG are not in contact with each other, and the insulating film MZ is interposed between the fin FA and the memory gate electrode MG. The insulating films GF and HK are insulating films used for a gate insulating film of a control transistor, and the insulating film MZ is an insulating film used for a gate insulating film of a memory transistor.

For each of the fins FA, a semiconductor region MD for drain is formed on a side of the control gate electrode CG and a semiconductor region MS for source is formed on a side of the memory gate electrode MG such that the semiconductor region MD and the semiconductor region MS sandwich in the X direction the control gate electrode CG and the memory gate electrode MG that are adjacent to each other and extend in the Y direction. Namely, one control gate electrode CG and one memory gate electrode MG that are adjacent to each other are located between the semiconductor region MS and the semiconductor region MD in the X direction. The semiconductor region MD and the semiconductor region MS are n type semiconductor regions formed in the fin FA. Each semiconductor region MD is formed between the two control gate electrodes CD adjacent in the X direction with the semiconductor region MD interposed therebetween. Also, each semiconductor region MS is formed between the two memory gate electrodes MG adjacent in the X direction with the semiconductor region MS interposed therebetween.

Each memory cell MC is formed at each intersection between the fin FA extending in the X direction and the control gate electrode CG and the memory gate electrode MG that are adjacent to each other and extend in the Y direction. Each memory cell MC includes the control gate electrode CG, the memory gate electrode MG, the semiconductor region MD, and the semiconductor region MS.

The two memory cells MC adjacent in the X direction share the semiconductor region MD or the semiconductor region MS. The two memory cells MC that share the semiconductor region MD are mirror symmetrical in the X direction with respect to the semiconductor region MD, and the two memory cells MC that share the semiconductor region MS are mirror symmetrical in the X direction with respect to the semiconductor region MS. Also, the control gate electrodes CG of the plurality of memory cells MC arranged in the Y direction are formed of one control gate electrode CG extending in the Y direction, and the memory gate electrodes MG of the plurality of memory cells MC arranged in the Y direction are formed of one memory gate electrode MG extending in the Y direction.

For each of the fins FA, the plurality of memory cells MC are formed in the X direction, and each of the semiconductor regions MD of the plurality of memory cells MC arranged in the X direction is electrically connected to a source line SL made of a wiring extending in the X direction through a plug (contact plug) PG formed in a contact hole penetrating through interlayer insulating films IL1 and IL2. Also, each of the semiconductor regions MS of the plurality of memory cells MC arranged in the Y direction is electrically connected to a bit line BL made of a wiring extending in the Y direction through a plug PG formed in a contact hole penetrating through the interlayer insulating films IL1 and IL2. A wiring in a layer different from that of the bit line BL may be used for the source line SL. For example, the source line SL may be configured of a wiring in a layer above the bit line BL.

The fin FA is, for example, a projecting portion of a rectangular parallelepiped projecting from the main surface of the semiconductor substrate SB in a direction perpendicular to the main surface. The fin FA has an arbitrary length in a long side direction (X direction), an arbitrary width in a short side direction (Y direction), and an arbitrary height in a height direction. The fin FA is not necessarily rectangular parallelepiped, and corners of the rectangle may be rounded in a cross-sectional view in the short side direction. Further, a side surface of each fin FA may be perpendicular to the main surface of the semiconductor substrate SB, or may have an inclined angle close to vertical. Namely, the cross-sectional shape of each fin FA may be rectangular parallelepiped or may be trapezoidal. In addition, the direction in which the fin FA extends in a plan view is the long side direction of the fin FA, and the direction orthogonal to the long side direction is the short side direction of the fin FA. Namely, the length (dimension in the X direction) of the fin FA is larger than the width (dimension in the Y direction) of the fin FA. Further, the shape of the fin FA is not limited as long as it is a projecting portion having a length, a width, and a height. For example, the fin FA may be a meandering pattern in a plan view.

In FIG. 2, illustration of the interlayer insulating films IL1 and IL2 and the wiring (source line SL and bit line BL) is omitted. The memory cell MC is formed on the fin FA constituting the semiconductor substrate SB in the memory region. As shown in FIG. 2, the control gate electrode CG and the memory gate electrode MG extend in the Y direction so as to be laid over the fin FA.

Next, the structure of the memory cell MC will be further described with reference to FIGS. 3 to 5.

Although the plurality of memory cells MC arranged in the X direction are formed on one fin FA, FIG. 3 shows one memory cell MC.

The fin FA which is a projecting portion of the semiconductor substrate SB is formed in the semiconductor substrate SB in the memory region. The lower part of the fin FA is surrounded by the element isolation film ST formed on the main surface of the semiconductor substrate SB. Namely, the fins FA are isolated from each other by the element isolation film ST. Each of the fins FA locally projects upward from the main surface of the semiconductor substrate SB.

In the fin FA, a p type well PW which is a p type semiconductor region is formed from the upper surface of the fin FA to the lower part thereof. In other words, the fin FA is formed in the p type well PW of the semiconductor substrate SB. The semiconductor regions MD and MS are formed in the fin FA, and thus are formed in the p type well PW.

The control gate electrode CG is formed on the upper surface and the side surface of the fin FA via the insulating film GF, and the memory gate electrode MG is formed in a region adjacent to the control gate electrode CG in the long side direction (X direction) of the fin FA via the insulating film MZ. The insulating film MZ is interposed between the control gate electrode CG and the memory gate electrode MG, and the control gate electrode CG and the memory gate electrode MG are electrically isolated from each other by the insulating film MZ. Also, the insulating film MZ is interposed between the memory gate electrode MG and the upper surface and the side surface of the fin FA. The insulating film MZ continuously extends in both of the region between the memory gate electrode MG and (the upper surface and the side surface of) the fin FA and the region between the memory gate electrode MG and the control gate electrode CG.

The insulating film GF is a silicon oxide film (thermal oxide film) formed by thermally oxidizing the upper surface and the side surface of the fin FA which is the projecting portion of the semiconductor substrate SB made of silicon, and is formed between the control gate electrode CG and the surface (upper surface and side surface) of the fin FA. In addition, the insulating film MZ is composed of a stacked film including an insulating film (silicon oxide film) MZ1, an insulating film (silicon nitride film) MZ2 formed on the insulating film MZ1, and an insulating film (silicon oxide film) MZ3 formed on the insulating film MZ2. Among them, the insulating film MZ1 is made of a silicon oxide film (thermal oxide film) formed by thermally oxidizing the upper surface and the side surface of the fin FA which is the projecting portion of the semiconductor substrate SB made of silicon. In addition, the insulating film MZ2 is made of a silicon nitride film, and the insulating film MZ3 is made of a silicon oxide film.

Figure 28:
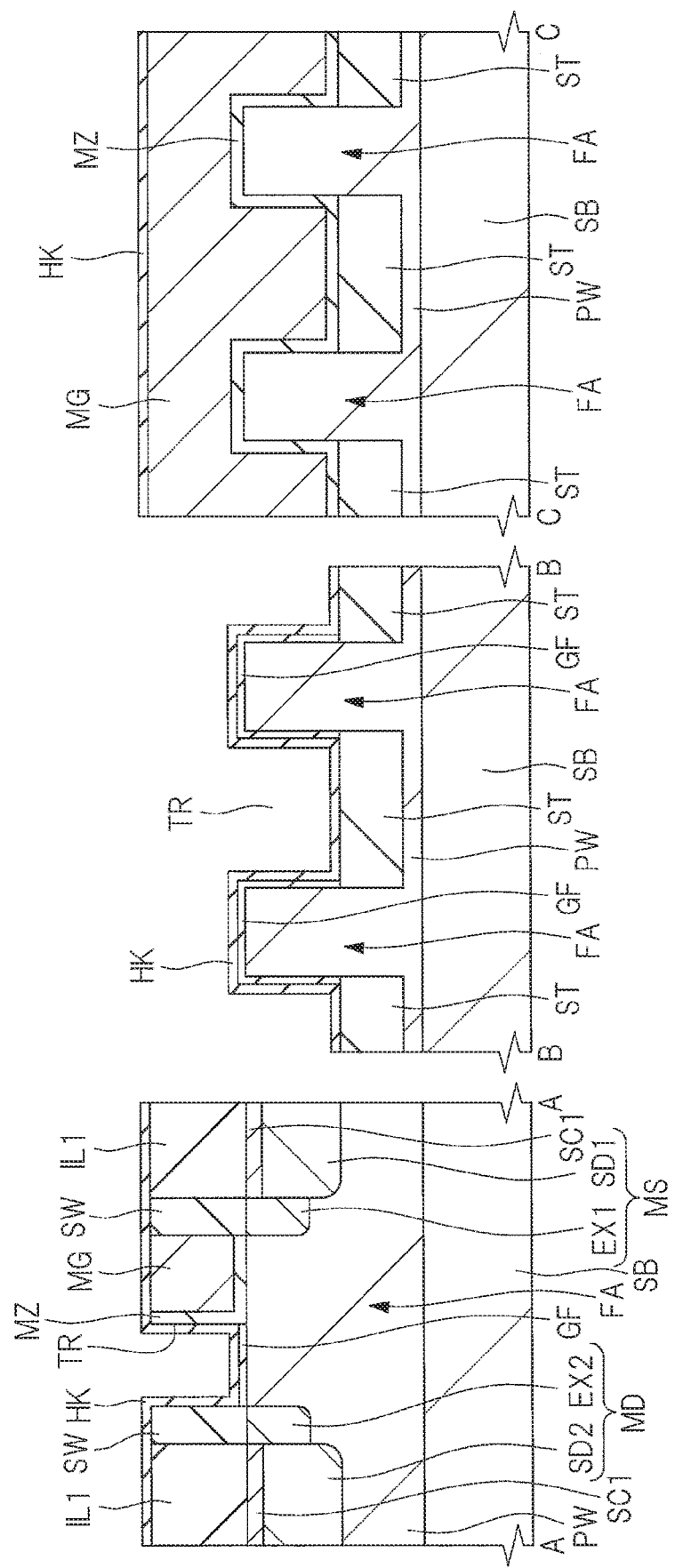
FIG. 28 is a cross-sectional view showing the principal part in the manufacturing process of the semiconductor device continued from FIG. 27.

Further, when the insulating film HK made of a high dielectric constant insulating film is formed as shown in FIG. 28 to be described later, the insulating film HK is formed so as to be in contact with a lower surface and a side surface of the control gate electrode CG. In this case, a stacked film of the insulating film GF and the insulating film HK on the insulating film GF is interposed between the control gate electrode CG and the surface (upper surface and side surface) of the fin FA, the insulating film GF is in contact with the fin FA, and the insulating film HK is in contact with the control gate electrode CG. Also, a stacked film of the insulating film HK and the insulating film MZ is interposed between the control gate electrode CG and the memory gate electrode MG, the insulating film HK is in contact with the control gate electrode CG, and the insulating film MZ is in contact with the memory gate electrode MG. In this case, the memory gate electrode MG is adjacent to the control gate electrode CG via the stacked film of the insulating film HK and the insulating film MZ. In addition, the insulating film HK is interposed between the control gate electrode CG and a sidewall spacer SW, and the insulating film HK is interposed between the control gate electrode CG and the element isolation film. A stacked film of the insulating film GF and the insulating film HK interposed between the control gate electrode CG and the fin FA functions as the gate insulating film of the control gate electrode CG (control transistor).

The insulating film MZ functions as the gate insulating film of the memory gate electrode MG (memory transistor) and has a charge retaining (charge accumulating) function. Namely, the insulating film MZ2 is a charge accumulating portion (charge accumulating layer) of the memory cell MC, and the insulating film MZ is an insulating film having the charge accumulating portion (charge accumulating layer). Since the insulating film MZ needs to have the charge retaining function, the insulating film MZ has the structure in which the charge accumulating layer (insulating film MZ2 in this case) is sandwiched between charge blocking layers (insulating films MZ1 and MZ3 in this case), and potential barrier height of each of the charge blocking layers (insulating films MZ1 and MZ3 in this case) is higher than that of the charge accumulating layer (insulating film MZ2 in this case). Namely, the insulating film MZ2 is an insulating film (trapping insulating film) having a charge accumulating function, and band gaps of the insulating film MZ1 and the insulating film MZ3 are larger than a band gap of the insulating film MZ2. However, apart of the insulating film MZ interposed between the memory gate electrode MG and the surface (upper surface and side surface) of the fin FA functions as the gate insulating film, and another part of the insulating film MZ interposed between the memory gate electrode MG and the control gate electrode CG functions as the insulating film for electrically isolating the memory gate electrode MG and the control gate electrode CG. Similarly, a part of the insulating film HK interposed between the control gate electrode CG and the surface (upper surface and side surface) of the fin FA functions as the gate insulating film, and another part of the insulating film HK interposed between the memory gate electrode MG and the control gate electrode CG functions as the insulating film for electrically isolating the memory gate electrode MG and the control gate electrode CG.

In the short side direction (Y direction) of the fin FA, the control gate electrode CG extends along the upper surface and both side surfaces of the fin FA, and further extends on the element isolation film ST surrounding (sandwiching) the fin FA. Similarly, in the short side direction (Y direction) of the fin FA, the memory gate electrode MG extends along the upper surface and both side surfaces of the fin FA, and further extends on the element isolation film ST surrounding (sandwiching) the fin FA.

In addition, the insulating film MZ is interposed between the element isolation film ST and the memory gate electrode MG. However, since no thermal oxide film is formed on the element isolation film ST, when the insulating film MZ1 is formed by the thermal oxidation method, the insulating film MZ interposed between the element isolation film ST and the memory gate electrode MG does not have the insulating film MZ1, and is thus composed of a stacked film of the insulating film (silicon nitride film) MZ2 on the element isolation film ST and the insulating film (silicon oxide film) MZ3 on the insulating film MZ2.

A sidewall spacer (sidewall, sidewall insulating film) SW made of an insulating film is formed on each of a side surface of the control gate electrode CG and a side surface of the memory gate electrode MG (side surfaces on opposite sides of the insulating film MZ between the control gate electrode CG and the memory gate electrode MG adjacent to each other). The sidewall spacer SW on the side surface of the control gate electrode CG extends along the control gate electrode CG, and the sidewall spacer SW on the side surface of the memory gate electrode MG extends along the memory gate electrode MG. The interlayer insulating film IL1 is formed next to the sidewall spacers SW. The interlayer insulating film IL1 is formed on the fin FA and the element isolation film ST in the region where the structure composed of the control gate electrode CG, the memory gate electrode MG, and the sidewall spacer SW is not formed. An upper surface of the interlayer insulating film IL1 is planarized.

The control gate electrode CG is a so-called metal gate electrode, and is made of a metal film (conductive film showing metallic conduction). The memory gate electrode MG is a so-called silicon gate electrode, and is made of a silicon film (polysilicon film). A metal silicide layer SC2 is formed on the memory gate electrode MG.

In the present embodiment, the memory gate electrode MG is made of a p type silicon film into which a p type impurity is introduced. More specifically, the memory gate electrode MG is made of a p type polysilicon film.

Herein, "semiconductor shows n type conductivity", "conductivity type of semiconductor is n type", and "n type semiconductor" mean that majority carrier of the semiconductor is electron. Also, "semiconductor shows p type conductivity", "conductivity type of semiconductor is p type", and "p type semiconductor" mean that majority carrier of the semiconductor is hole.

The semiconductor region MD for drain and the semiconductor region MS for source are provided outside the control gate electrode CG and the memory gate electrode MG so as to sandwich the control gate electrode CG and the memory gate electrode MG. Of the semiconductor regions MD and MS sandwiching the pair of the control gate electrode CG and the memory gate electrode MG, the semiconductor region MD is located on a side closer to the control gate electrode CG and the semiconductor region MS is located on a side closer to the memory gate electrode MG. The semiconductor region MS includes an n⁻ type semiconductor region (extension region) EX1 and an n⁺ type semiconductor region SD1 having an impurity concentration higher than that of the n⁻ type semiconductor region EX1, and the semiconductor region MD includes an n⁻ type semiconductor region (extension region) EX2 and an n⁺ type semiconductor region SD2 having an impurity concentration higher than that of the n⁻ type semiconductor region EX2. Thus, the semiconductor region MS and the semiconductor region MD each have an LDD (Lightly Doped Drain) structure.

In the fin FA, the n⁻ type semiconductor regions EX1 and EX2 are formed below the respective sidewall spacers SW. Namely, in the fin FA, the n⁻ type semiconductor region EX1 is adjacent to the channel region of the memory transistor (region immediately below the memory gate electrode MG in the fin FA), and the n⁻ type semiconductor region EX2 is adjacent to the channel region of the control transistor (region immediately below the control gate electrode CG in the fin FA). In the fin FA, the n⁺ type semiconductor region SD1 is formed at a position adjacent to the n⁻ type semiconductor region EX1 (adjacent in the X direction), and the n⁺ type semiconductor region SD2 is formed at a position adjacent to the n⁻ type semiconductor region EX2 (adjacent in the X direction).

A metal silicide layer SC1 is formed in a surface layer portion of the n⁺ type semiconductor region SD1 and in a surface layer portion of the n⁺ type semiconductor region SD2. Namely, the metal silicide layer SC1 is formed on the upper surface and the side surface of the fin FA in the region where the n⁺ type semiconductor region SD1 is formed and on the upper surface and the side surface of the fin FA in the region where the n⁺ type semiconductor region SD2 is formed.

The interlayer insulating film IL2 is formed over the interlayer insulating film IL1 so as to cover the control gate electrode CG, the memory gate electrode MG, the sidewall spacers SW, the semiconductor region MS, the semiconductor region MD, the metal silicide layer SC1, and the metal silicide layer SC2. An upper surface of the interlayer insulating film IL2 is planarized. A wiring M1 is formed on the interlayer insulating film IL2, and the wiring M1 is electrically connected to the semiconductor region MS, the semiconductor region MD or the like through a plug PG provided in a contact hole penetrating through the interlayer insulating films IL2 and IL1. Note that a plug is connected to the control gate electrode CG in a power supply region (not shown) of the control gate electrode CG and a plug is connected to the memory gate electrode MG in a power supply region (not shown) of the memory gate electrode MG.

The memory cell MC is a split gate memory cell in which two MISFETs such as the control transistor (selection transistor) having the control gate electrode (selection gate electrode) CG and the memory transistor having the memory gate electrode MG are connected.

Herein, the MISFET provided with the gate insulating film (insulating film MZ in this case) including the charge accumulating portion and the memory gate electrode MG is referred to as a memory transistor, and the MISFET provided with the gate insulating film (insulating films GF and HK in this case) and the control gate electrode CG is referred to as a control transistor. Note that the control transistor is a transistor for selecting memory cell, and thus it may be regarded as a selection transistor. Each of the control gate electrode CG and the memory gate electrode MG is a gate electrode constituting the memory cell of the non-volatile memory. Also, a pair of the semiconductor regions MD and MS functions as both of the source/drain regions for memory transistor (source or drain region) and the source/drain regions for control transistor.

A distance between the semiconductor region MD and the semiconductor region MS in the long side direction (X direction) of the fin FA corresponds to a channel length of the memory cell MC, and a region where the control gate electrode CG or the memory gate electrode MG in the short side direction (Y direction) of the fin FA faces (overlaps) the upper surface and the side surface of the fin FA corresponds to a channel width of the memory cell MC. The control transistor and the memory transistor are FINFETs that use the surface (upper surface and side surface) of the fin FA as a channel.

<Manufacturing Process of Semiconductor Device>

A manufacturing method of a semiconductor device according to the present embodiment will be described with reference to drawings.

FIGS. 6 to 34 are cross-sectional views each showing the principal part in a manufacturing process of the semiconductor device according to the present embodiment. FIGS. 6 to 10 show the cross section corresponding to FIG. 4 (cross section at the position corresponding to the line B-B of FIG. 1). In each process stage of FIGS. 6 to 10, the cross section at the position corresponding to the line B-B of FIG. 1 is the same as the cross section at the position corresponding to the line C-C of FIG. 1. Also, in each of FIGS. 11 to 34, a cross section corresponding to FIG. 3 (cross section at the position corresponding to the line A-A of FIG. 1), across section corresponding to FIG. 4 (cross section at the position corresponding to the line B-B of FIG. 1), and a cross section corresponding to FIG. 5 (cross section at the position corresponding to the line C-C of FIG. 1) are shown sequentially from the left in each drawing.

Figure 6:
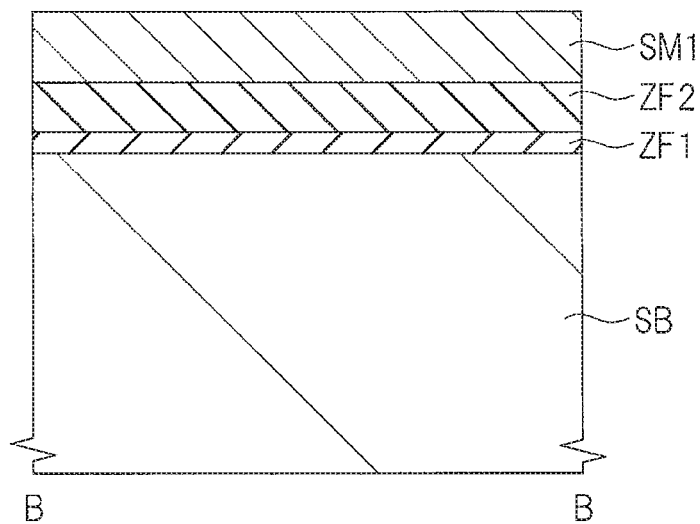
FIG. 6 is a cross-sectional view showing the principal part in a manufacturing process of the semiconductor device according to the embodiment.

For the manufacture of the semiconductor device, first, the semiconductor substrate (semiconductor wafer) SB made of p type single crystal silicon or the like having a specific resistance of, for example, about 1 to 10 Ωcm is prepared as shown in FIG. 6.

Next, an insulating film ZF1, an insulating film ZF2, and a semiconductor film SM1 are sequentially formed over the main surface of the semiconductor substrate SB. The insulating film ZF1 is made of, for example, a silicon oxide film and can be formed by, for example, the oxidation method or the CVD (Chemical Vapor Deposition) method. The insulating film ZF2 is made of, for example, a silicon nitride film and can be formed by, for example, the CVD method. The semiconductor film SM1 is made of, for example, a silicon film (polysilicon film) and can be formed by, for example, the CVD method. At this stage, the stacked film of the insulating film ZF1, the insulating film ZF2 on the insulating film ZF1, and the semiconductor film SM1 on the insulating film ZF2 is formed over the entire main surface of the semiconductor substrate SB.

Figure 7:
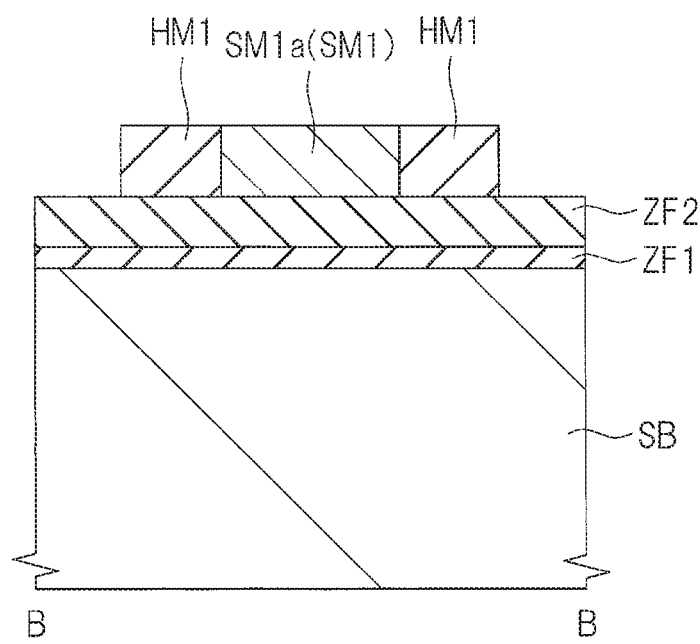
FIG. 7 is a cross-sectional view showing the principal part in the manufacturing process of the semiconductor device continued from FIG. 6.

Next, the semiconductor film SM1 is patterned (processed) by using the photolithography technique and the etching technique. At this time, the insulating film ZF2 functions as an etching stopper. A semiconductor film pattern SM1a is formed from the patterned semiconductor film SM1 as shown in FIG. 7. As a result, a plurality of semiconductor film patterns SM1a extending in the X direction are arranged in the Y direction on the insulating film ZF2. Since FIG. 7 is a cross-sectional view taken along the short side direction (Y direction) of the semiconductor film pattern SM1a, each of the semiconductor film patterns SM1a extends in the direction approximately perpendicular to the sheet of FIG. 7 (that is, X direction). The interval between the fins FA to be formed later (interval in the Y direction) can be determined depending on the width (width in the Y direction) of the semiconductor film pattern SM1a formed here.

Next, a hard mask HM1 is formed on each of the side surfaces of the plurality of semiconductor film patterns SM1a. FIG. 7 shows this stage. For example, the hard mask HM1 may be formed in the following manner. That is, an insulating film (for example, silicon oxide film) for forming the hard mask HM1 is formed over the insulating film ZF2 by the CVD method or the like so as to cover the plurality of semiconductor film patterns SM1a, and then this insulating film is etched back by using the anisotropic dry etch technique. As a result, the insulating film for forming the hard mask HM1 is selectively left in the form of a sidewall spacer on each side surface of the plurality of semiconductor film patterns SM1a, thereby forming the hard mask HM1. At this time, the upper surface of the semiconductor film pattern SM1a is exposed, and the insulating film ZF2 is made of a material different from that of the hard mask HM1 and thus functions as an etching stopper. The hard mask HM1 does not completely fill the gap between the adjacent semiconductor film patterns SM1a. The hard mask HM1 is formed to have an annular shape so as to surround each semiconductor film pattern SM1a in a plan view.

Figure 8:
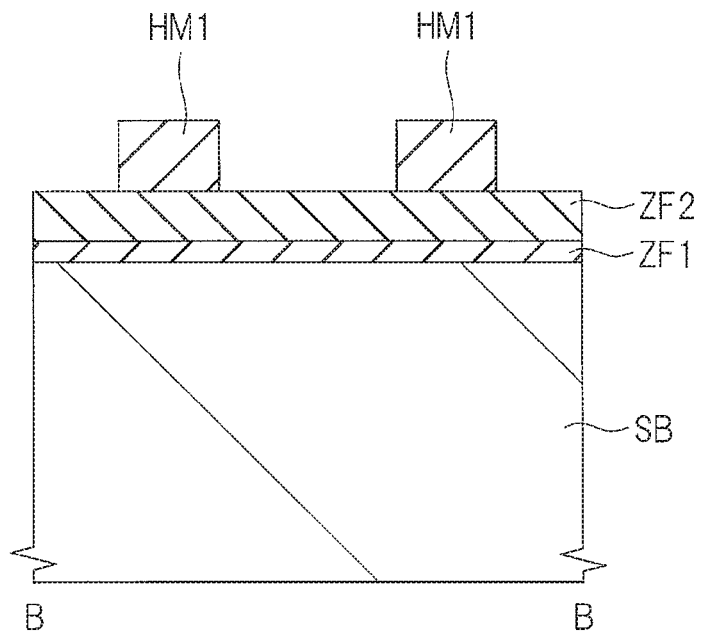
FIG. 8 is a cross-sectional view showing the principal part in the manufacturing process of the semiconductor device continued from FIG. 7.

Next, as shown in FIG. 8, the semiconductor film pattern SM1a is selectively removed by using the wet etching technique. At this time, the hard mask HM1 and the insulating film ZF2 are left as they are without being etched. Thereafter, a part of the hard mask HM1 is removed by using the photolithography technique and the etching technique. Namely, a part of the hard mask MH1 extending in the X direction is left, and the other part, that is, the part extending in the Y direction is removed. As a result, the hard mask HM1 no longer has the annular structure, and only the pattern extending in the X direction is left. Namely, the plurality of hard masks HM1 which are the patterns extending in the X direction are arranged in the Y direction on the insulating film ZF2.

Figure 9:
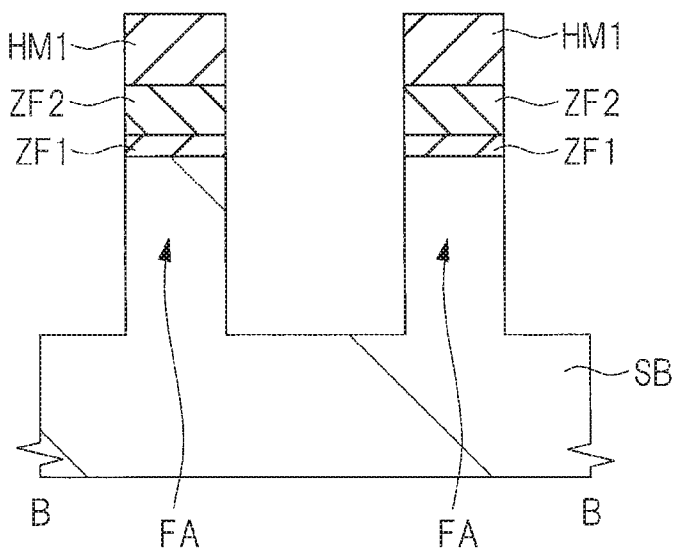
FIG. 9 is a cross-sectional view showing the principal part in the manufacturing process of the semiconductor device continued from FIG. 8.

Next, as shown in FIG. 9, anisotropic dry etching is performed to the insulating film ZF2, the insulating film ZF1, and the semiconductor substrate SB with using the hard mask HM1 as an etching mask. At this time, the insulating film ZF2, the insulating film ZF1, and the semiconductor substrate SB in the region exposed without being covered with the hard mask HM1 are sequentially etched and removed, but the etching to the semiconductor substrate SB is performed to the middle of the thickness. As a result, the insulating film ZF2, the insulating film ZF1, and the semiconductor substrate SB are processed (patterned) to have the same planar shape as the hard mask HM1, and the fin FA is formed immediately below the hard mask HM1. The fin FA is made of a part of the semiconductor substrate SB, and is a pattern made of the semiconductor substrate SB processed to have a plate shape (wall shape). For example, it is possible to form the fin FA having a height of 100 to 250 nm from the main surface of the semiconductor substrate SB by digging down the main surface of the semiconductor substrate SB by 100 to 250 nm in the region exposed without being covered with the hard mask HM1. At this stage, the insulating film ZF1, the insulating film ZF2, and the hard mask HM1 are left on the fin FA.

In the manner described above, the plurality of fins (projecting portions) FA which are made of a part of the semiconductor substrate SB and extend in the X direction along the upper surface of the semiconductor substrate SB are formed on the upper surface of the semiconductor substrate SB.

Figure 10:
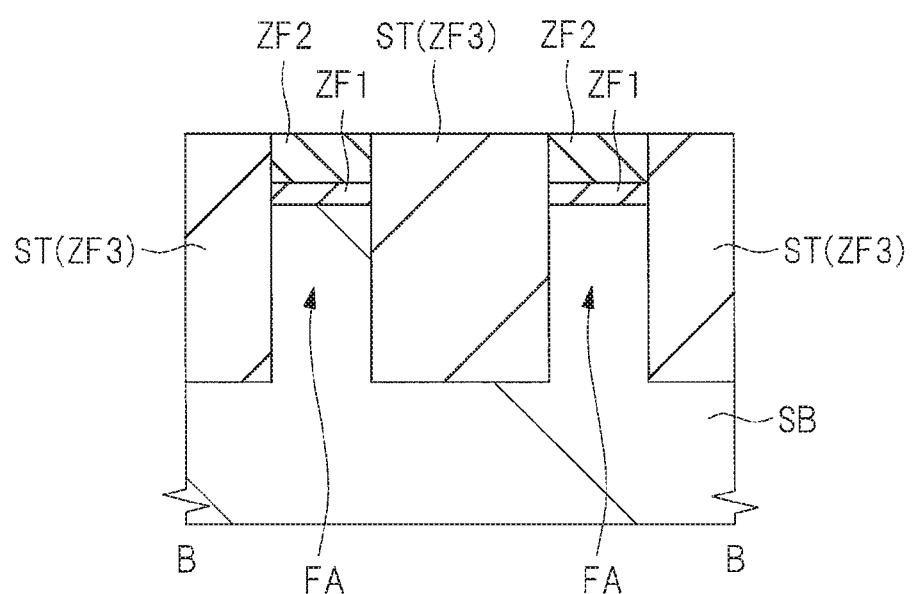
FIG. 10 is a cross-sectional view showing the principal part in the manufacturing process of the semiconductor device continued from FIG. 9.

Next, as shown in FIG. 10, an insulating film ZF3 made of a silicon oxide film or the like is deposited over the semiconductor substrate SB by the CVD method or the like so as to cover the patterns each composed of the fin FA, the insulating film ZF1, and the insulating film ZF2 and fill the gaps between the patterns. Then, the insulating film ZF3 is polished by the CMP (Chemical Mechanical Polishing) method to expose the upper surface of the insulating film ZF2. In this manner, the element isolation film ST made of the insulating film ZF3 is formed. The hard mask HM1 is removed by the polishing process at this time. FIG. 10 shows this stage. Note that it is also possible to remove the hard mask HM1 before forming the insulating film ZF3 and then perform the deposition and polishing of the insulating film ZF3. The element isolation film ST has a flat upper surface. In addition, at this stage, the height position of the flat upper surface of the element isolation film ST is substantially equal to the height position of the upper surface of the insulating film ZF2.

Figure 11:
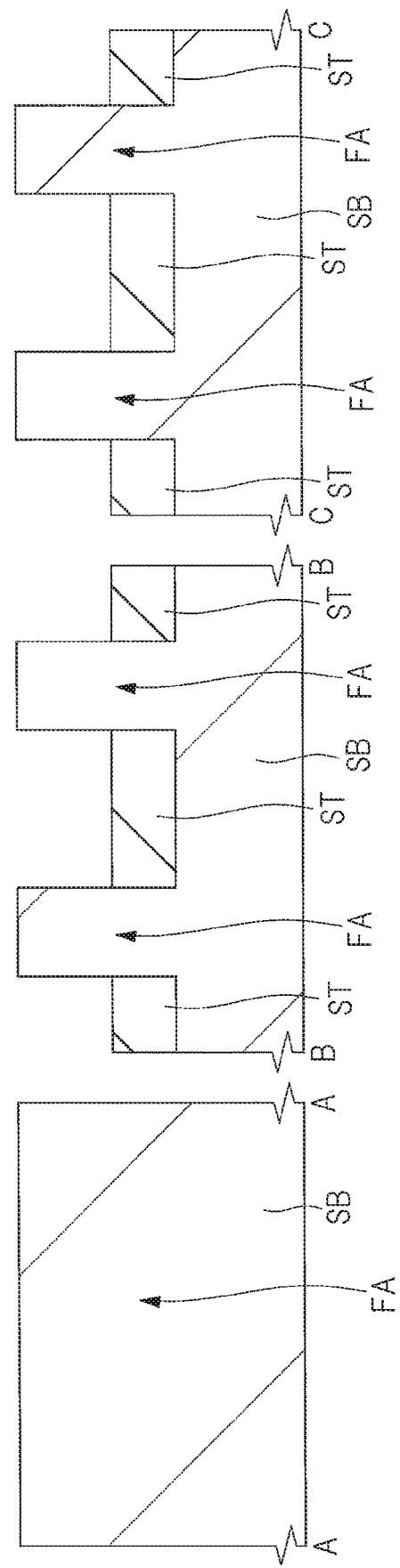
FIG. 11 is a cross-sectional view showing the principal part in the manufacturing process of the semiconductor device continued from FIG. 10.

Next, as shown in FIG. 11, the insulating film ZF2 and the insulating film ZF1 are removed by etching or the like.

Next, the element isolation film ST is etched to reduce the height of the upper surface of the element isolation film ST. Namely, the upper surface of the element isolation film ST is recessed (lowered) by performing the etching process to the element isolation film ST. At this time, the upper surface of the element isolation film ST is recessed (lowered) in a direction perpendicular to the main surface of the semiconductor substrate SB, and the height position of the upper surface of the element isolation film ST becomes lower than the height position of the upper surface of the fin FA. As a result, a part (upper part) of the side surface of the fin FA projects upward from the upper surface of the element isolation film ST, and the part (upper part) of the side surface of the fin FA and the entire upper surface of the fin FA are exposed. FIG. 11 shows this stage. At this stage, the element isolation film ST is formed on the main surface of the semiconductor substrate SB, and the fins FA project from the element isolation film ST. Also at this stage, the upper surface of the element isolation film ST is flat.

In the manner described above, the element isolation film ST is formed on the semiconductor substrate SB so as to surround each of the fins FA. A part of each of the fins FA projects from the upper surface of the element isolation film ST.

Figure 12:
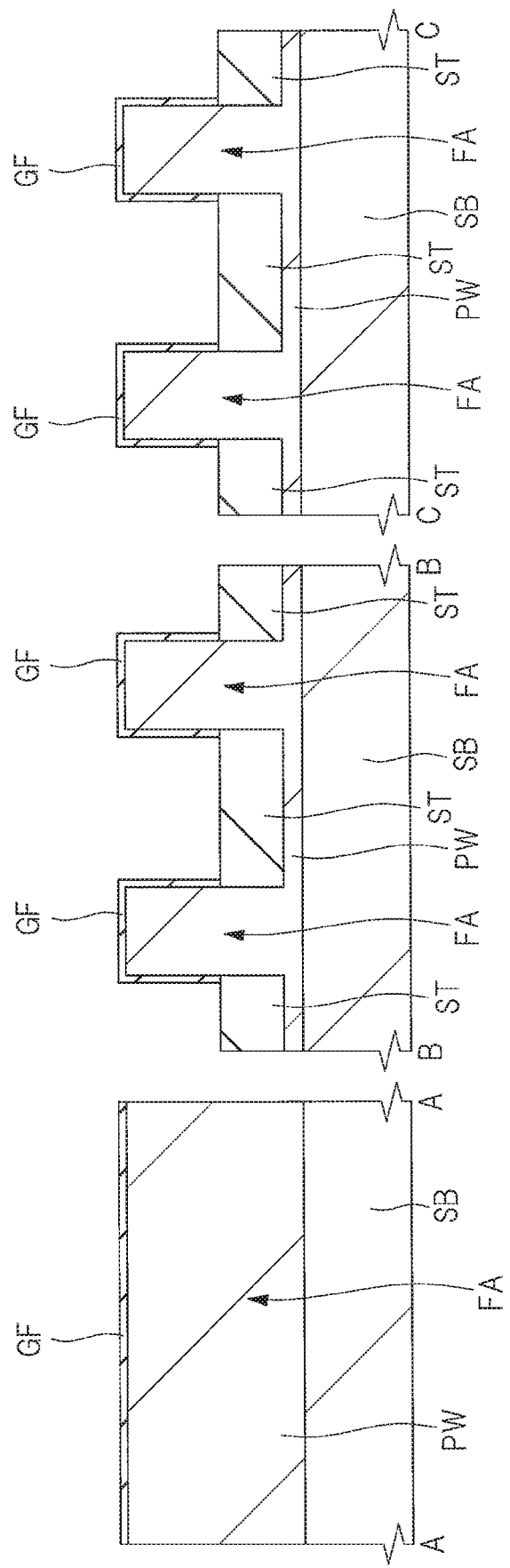
FIG. 12 is a cross-sectional view showing the principal part in the manufacturing process of the semiconductor device continued from FIG. 11.

Next, as shown in FIG. 12, the p type well (p type semiconductor region) PW is formed by introducing a p type impurity (for example, boron (B)) into the semiconductor substrate SB by the ion implantation method. The p type well PW is formed so as to spread in the entire fins FA and a part of the semiconductor substrate SB below the fins FA.

Next, the insulating film GF is formed on the surface of the exposed portion of each fin FA by using the thermal oxidation method or the like. Namely, the insulating film GF is formed on the upper surface and the side surface (part of the side surface not covered with the element isolation film ST) of each fin FA. As a result, the part of the fin FA projecting from the element isolation film ST is covered with the insulating film GF. The insulating film GF is made of a silicon oxide film, and has a film thickness of, for example, about 2 nm. The insulating film GF is an insulating film for the gate insulating film of the control transistor.

Figure 13:
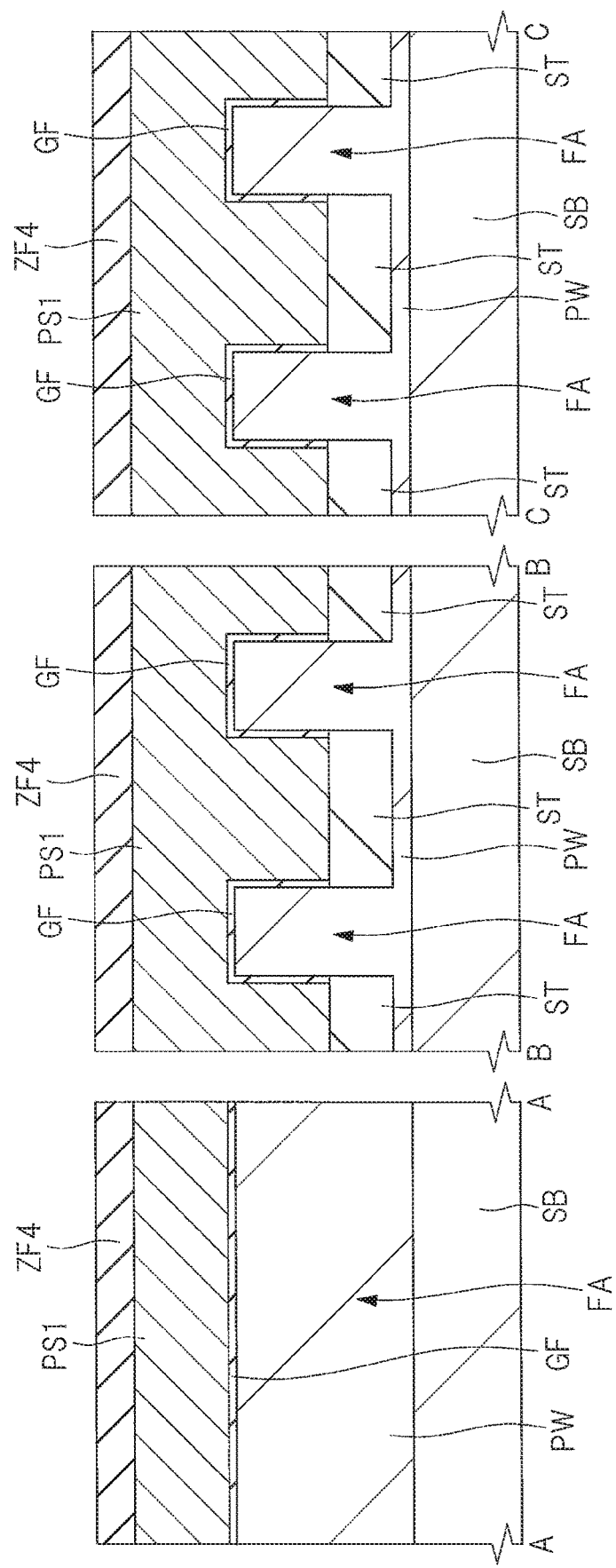
FIG. 13 is a cross-sectional view showing the principal part in the manufacturing process of the semiconductor device continued from FIG. 12.

Next, as shown in FIG. 13, a silicon film PS1 is formed (deposited) over the main surface of the semiconductor substrate SB, that is, on the element isolation film ST so as to cover the fins FA and the insulating film GF.

The silicon film PS1 is made of a polycrystalline silicon film (polysilicon film), and can be formed by the CVD method or the like. A film thickness (deposition thickness) of the silicon film PS1 may be, for example, about 100 to 200 nm. It is also possible to form the silicon film PS1 by converting an amorphous silicon film into a polycrystalline silicon film to be the silicon film PS1 by subsequent heat treatment. The same is true of silicon films PS2, PS2a, and PS2b to be described later.

Next, the upper surface of the silicon film PS1 is planarized by polishing the silicon film PS1 by the CMP method or the like. Even when the silicon film PS1 is polished, the fin FA, the insulating film GF, and the element isolation film ST are not exposed, and the silicon film PS1 is left over the fin FA.

Next, an n type impurity (for example, phosphorus (P) or arsenic (As)) is introduced into the silicon film PS1 by the ion implantation method or the like. Thereafter, it is also possible to diffuse the impurity introduced into the silicon film PS1 by performing the heat treatment (annealing process) to the semiconductor substrate SB as needed.

Also, although the case where an n type impurity is introduced into the silicon film PS1 by ion implantation after forming the silicon film PS1 has been described here, it is also possible to introduce an n type impurity into the silicon film PS1 at the time of forming the silicon film PS1 as another embodiment. In the case of introducing an n type impurity at the time of forming the silicon film PS1, the silicon film PS1 in which an n type impurity has been introduced can be formed by using the gas containing doping gas (gas for adding an n type impurity) as the gas for forming the silicon film PS1. In the case of introducing an n type impurity at the time of forming the silicon film PS1, it is possible to omit the ion implantation of an n type impurity into the silicon film PS1. Also, in the case where an n type impurity is introduced into the silicon film PS1 by the ion implantation after forming the silicon film PS1, a non-doped silicon film can be formed at the time of forming the silicon film PS1.

In any case, the silicon film PS1 is an n type silicon film into which an n type impurity has been introduced (doped polysilicon film) at this stage.

Next, an insulating film ZF4 is formed over the silicon film PS1, that is, over the flat upper surface of the silicon film PS1. The insulating film ZF4 is made of, for example, a silicon nitride film, and can be formed by the CVD method or the like. A film thickness (deposition thickness) of the insulating film ZF4 may be, for example, about 50 to 100 nm.

Figure 14:
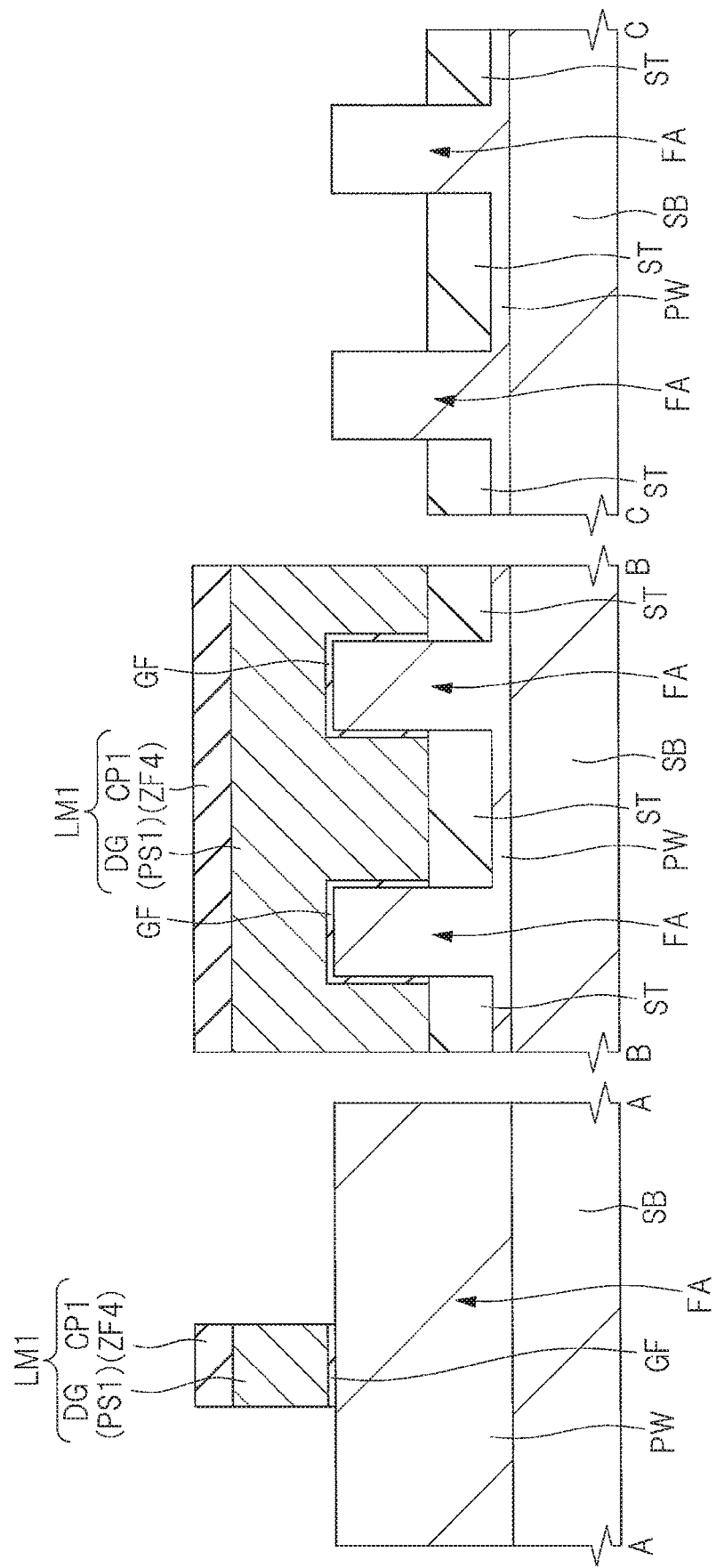
FIG. 14 is a cross-sectional view showing the principal part in the manufacturing process of the semiconductor device continued from FIG. 13.

Next, a photoresist pattern is formed on the insulating film ZF4 by using a photolithography technique, and then the insulating film ZF4 and the silicon film PS1 are etched with using the photoresist pattern as an etching mask. As a result, as shown in FIG. 14, the stacked film of the silicon film PS1 and the insulating film ZF4 is patterned to form a stacked body (stacked structure) LM1 composed of a dummy control gate electrode DG and a cap insulating film CP1 thereon. The dummy control gate electrode DG is made of the patterned silicon film PS1, and the cap insulating film CP1 is made of the patterned insulating film ZF4. The cap insulating film CP1 has the same planar shape as that of the dummy control gate electrode DG. Thereafter, the photoresist pattern is removed.

The dummy control gate electrode DG is a dummy gate electrode (pseudo gate electrode), and is later replaced with the control gate electrode CG. Therefore, the dummy control gate electrode DG is not a gate electrode used in the manufactured semiconductor device.

The stacked body LM1 extends in the Y direction, and a plurality of the stacked bodies LM1 extending in the Y direction are arranged (arrayed) in the X direction. In a plan view, each stacked body LM1 extends in the Y direction so as to intersect with the plurality of fins FA extending in the X direction. Each stacked body LM1 extends in the Y direction on the plurality of fins FA and on the element isolation film ST between the fins FA. The position where the stacked body LM1 is formed coincides with the position where the control gate electrode CG is formed later.

When the stacked body LM1 has been formed, the fin FA and the element isolation film ST in the region not covered with the stacked body LM1 are exposed. Namely, the surface (upper surface and side surface) of the fin FA and the upper surface of the element isolation film ST are exposed in the region not covered with the stacked body LM1. The insulating film GF on the surface of the fin FA in the region not covered with the stacked body LM1 can be removed by dry etching at the time of forming the stacked body LM1, subsequent wet etching and the like.

Meanwhile, the insulating film GF in the region covered with the stacked body LM1 is left without being etched. Therefore, the insulating film GF is interposed between the stacked body LM1 and (upper surface and side surface of) the fin FA. Namely, the insulating film GF is interposed between the dummy control gate electrode DG constituting the stacked body LM1 and (upper surface and side surface of) the fin FA. In addition, since the insulating film GF is not formed on the element isolation film ST when the insulating film GF is formed by the thermal oxidation method, the insulating film GF is not formed between the stacked body LM1 (dummy control gate electrode DG) and the element isolation film ST, and the stacked body LM1 is directly formed on the element isolation film ST.

Figure 15:
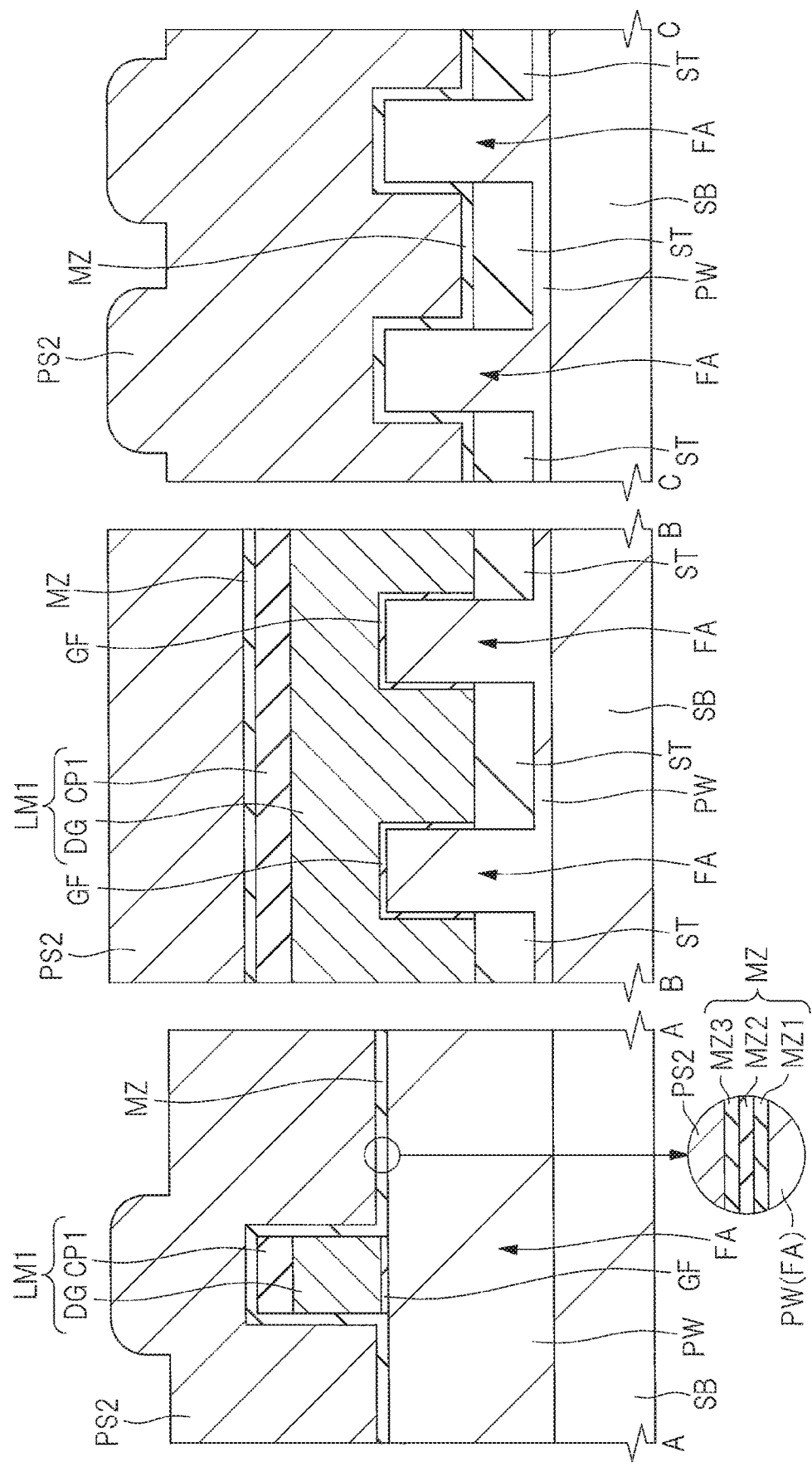
FIG. 15 is a cross-sectional view showing the principal part in the manufacturing process of the semiconductor device continued from FIG. 14.

Next, as shown in FIG. 15, the insulating film MZ is formed by sequentially forming the insulating film MZ1, the insulating film MZ2, and the insulating film MZ3 over the semiconductor substrate SB.

The insulating film MZ1 is made of a silicon oxide film, and can be formed by the thermal oxidation method. The insulating film MZ2 is made of a silicon nitride film, and can be formed by the CVD method or the like. The insulating film MZ3 is made of a silicon oxide film, and can be formed by the thermal oxidation method, the CVD method, or the combination thereof. A film thickness of the insulating film MZ1 is, for example, about 4 nm, a film thickness of the insulating film MZ2 is, for example, about 7 nm, and a film thickness of the insulating film MZ3 is, for example, about 9 nm. It is also possible to use a silicon oxynitride film as the insulating film MZ3 instead of the silicon oxide film.

The insulating film MZ is continuously formed on the surface (upper surface and side surface) of the fin FA in the region not covered with the stacked body LM1, on the upper surface of the element isolation film ST in the region not covered with the stacked body LM1, and on the surface (upper surface and side surface) of the stacked body LM1. When the insulating film MZ has been formed, the element isolation film ST, the fin FA, and the stacked body LM1 are covered with the insulating film MZ.

The insulating film MZ is composed of the stacked film including the insulating film MZ1, the insulating film MZ2 on the insulating film MZ1, and the insulating film MZ3 on the insulating film MZ2. Namely, the insulating film MZ is a stacked insulating film in which a plurality of insulating films are stacked.

However, when the insulating film MZ1 is formed by the thermal oxidation method, the insulating film MZ1 is formed on the surface (upper surface and side surface) of the fin FA in the region not covered with the stacked body LM1, but the insulating film MZ1 is not formed on the element isolation film ST. In this case, the insulating film MZ other than a part of the insulating film MZ formed on the element isolation film ST is composed of the stacked film including the insulating film MZ1, the insulating film MZ2 on the insulating film MZ1, and the insulating film MZ3 on the insulating film MZ2, and the part of the insulating film MZ formed on the element isolation film ST is composed of the stacked film including the insulating film MZ2 and the insulating film MZ3 on the insulating film MZ2. On the other hand, when the insulating film MZ1 is formed by the CVD method, the insulating film MZ1 is formed also on the element isolation film ST in the region not covered with the stacked body LM1, and thus the insulating film MZ is entirely composed of the stacked film including the insulating film MZ1, the insulating film MZ2 on the insulating film MZ1, and the insulating film MZ3 on the insulating film MZ2.

Next, as shown in FIG. 15, a silicon film PS2 is formed (deposited) as a film for forming the memory gate electrode MG over the semiconductor substrate SB, that is, on the insulating film MZ so as to cover the stacked body LM1. The silicon film PS2 is made of a polycrystalline silicon film, and can be formed by the CVD method or the like. A deposition thickness of the silicon film PS2 is set such that the height position of an upper surface of the silicon film PS2 on the element isolation film ST in the region not covered with the stacked body LM1 is higher than the height position of the upper surface of the stacked body LM1. Namely, the deposition thickness of the silicon film PS2 is larger than the height of the stacked body LM1, and may be set to, for example, about 200 to 300 nm.

Figure 16:
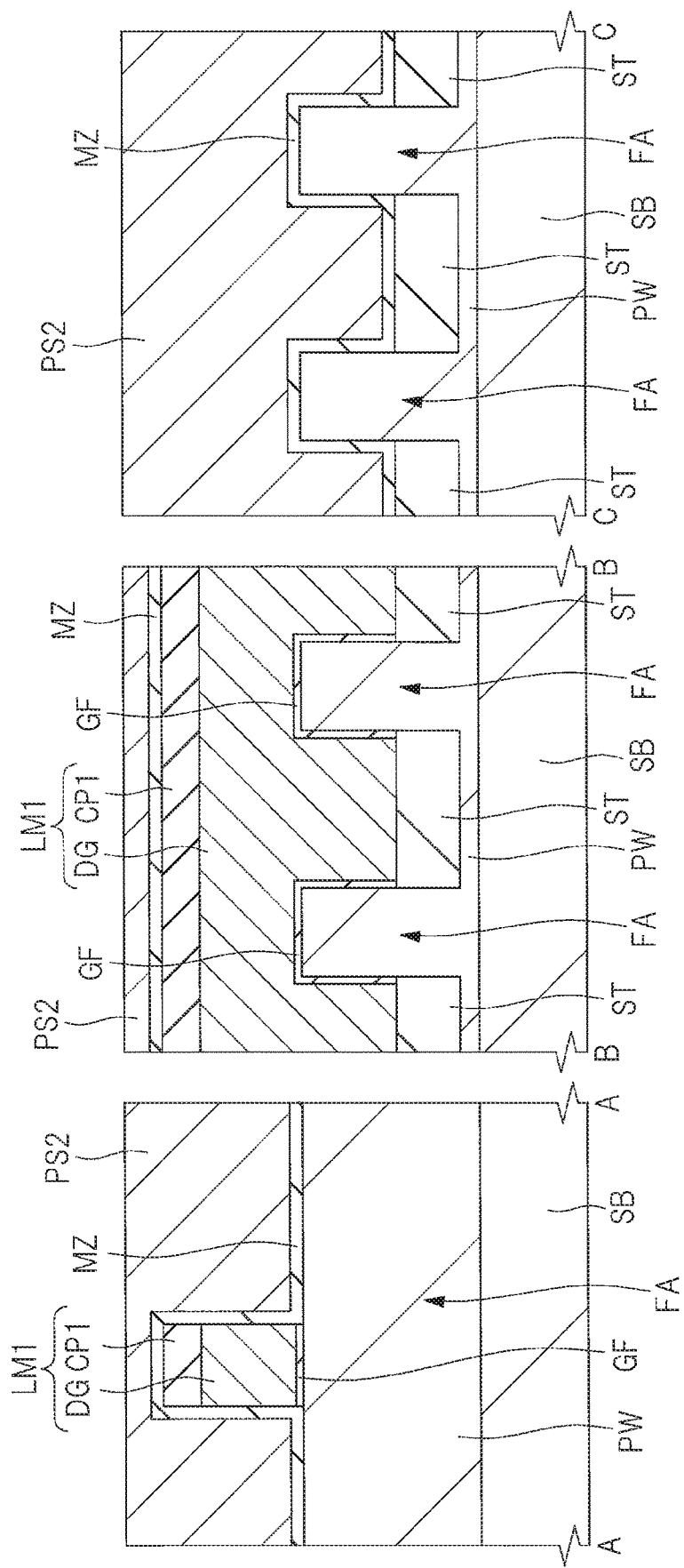
FIG. 16 is a cross-sectional view showing the principal part in the manufacturing process of the semiconductor device continued from FIG. 15.

Next, as shown in FIG. 16, the upper surface of the silicon film PS2 is planarized by polishing the silicon film PS2 by the CMP method or the like. At the stage where the silicon film PS2 has been formed, unevenness that reflects the stacked body LM1 and the fin FA is formed on the upper surface of the silicon film PS2, but the upper surface of the silicon film PS2 is planarized by polishing the upper surface of the silicon film PS2. As a result, the silicon film PS2 has the flat upper surface.

Figure 17:
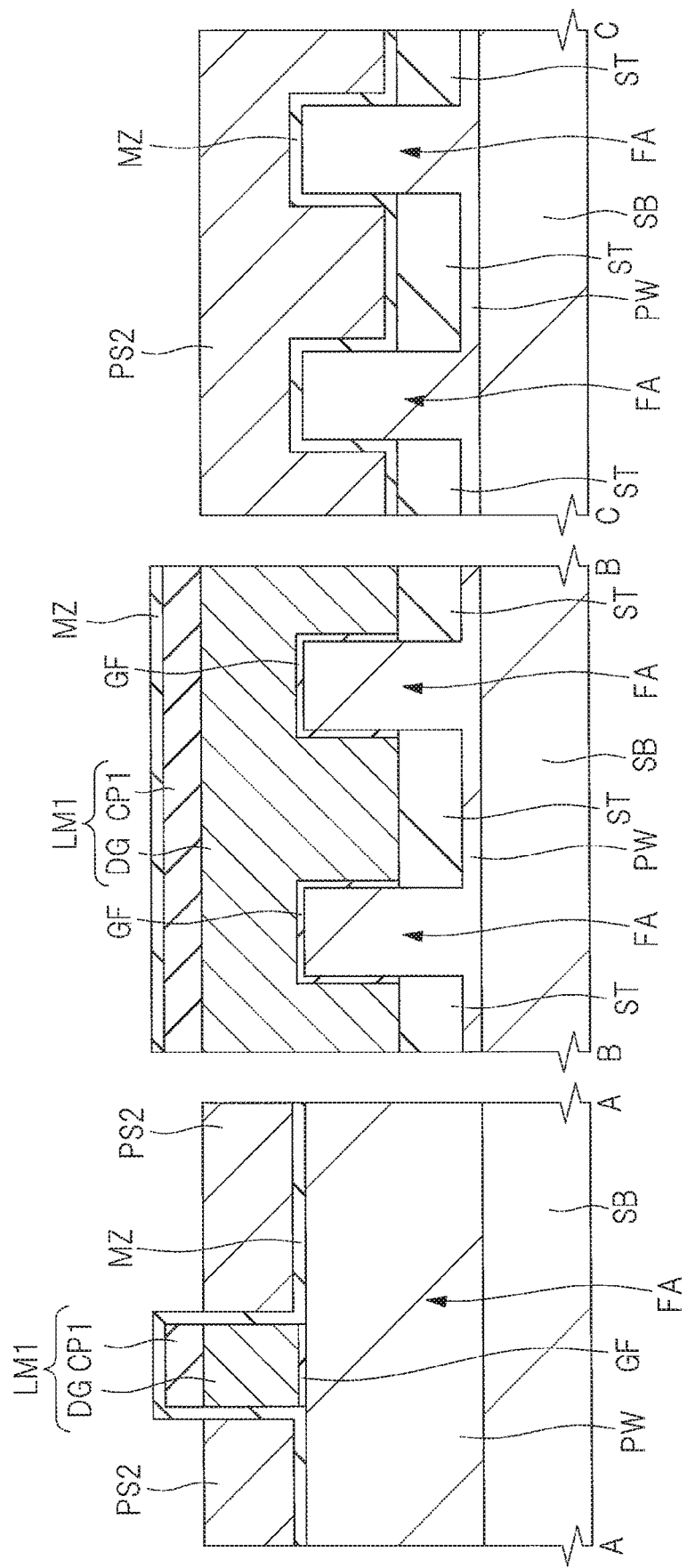
FIG. 17 is a cross-sectional view showing the principal part in the manufacturing process of the semiconductor device continued from FIG. 16.

Next, as shown in FIG. 17, the silicon film PS2 is etched to reduce the height of the upper surface of the silicon film PS2. Namely, the upper surface of the silicon film PS2 is recessed (lowered) by performing the etching process to the silicon film PS2. As a result, the upper surface of the silicon film PS2 is recessed (lowered) in the direction perpendicular to the main surface of the semiconductor substrate SB, and the height position of the upper surface of the silicon film PS2 becomes lower than the height position of the upper surface of the stack body LM1 (i.e., the upper surface of the cap insulating film CP1 constituting the stacked body LM1). At this stage, it is more preferable that the height position of the upper surface of the silicon film PS2 is substantially equal to the height position of the upper surface of the dummy control gate electrode DG constituting the stacked body LM1. Thus, a part of the stacked body LM1 (cap insulating film CP1) and the insulating film MZ on the surface thereof project upward from the flat upper surface of the silicon film PS2, and the insulating film MZ on the surface of the projecting part of the stacked body LM1 is exposed. Also at this stage, the upper surface of the silicon film PS2 is flat.

Next, a p type impurity (for example, boron (B)) is introduced into the silicon film PS2 by the ion implantation method or the like, Thereafter, it is also possible to diffuse the impurity introduced into the silicon film PS2 by performing the heat treatment (annealing process) to the semiconductor substrate SB as needed.

Note that it is preferable that the p type impurity is not implanted into the dummy control gate electrode DG constituting the stacked body LM1 when implanting the p type impurity into the silicon film PS2. For this reason, when the ion implantation of the p type impurity into the silicon film PS2 is performed, the implantation energy with which the p type impurity is blocked by the insulating film MZ and the cap insulating film CP1 and is not implanted into the dummy control gate electrode DG is preferably used instead of the implantation energy with which the p type impurity penetrates through the insulating film MZ and the cap insulating film CP1 and is implanted into the dummy control gate electrode DG. From another point of view, it is preferable that the thickness of the cap insulating film CP1 is set such that the p type impurity does not penetrate through the cap insulating film CP1 and is not implanted into the dummy control gate electrode DG when the p type impurity is ion-implanted into the silicon film PS2. Thus, although there is the case where the p type impurity is implanted into a relatively shallow position (position close to the upper surface) in the silicon film PS2 in the ion implantation, even in such a case, the p type impurity can be diffused to the entire silicon film PS2 by performing the heat treatment (annealing process) after the ion implantation. In addition, the concentration distribution of the p type impurity in the silicon film PS2 can be easily made uniform by ion-implanting the p type impurity into the silicon film PS2 after the etch back process of the silicon film PS2.

Also, although the case where a p type impurity is introduced into the silicon film PS2 by ion implantation after forming the silicon film PS2 has been described here, it is also possible to introduce a p type impurity into the silicon film PS2 at the time of forming the silicon film PS2 as another embodiment. In the case of introducing a p type impurity at the time of forming the silicon film PS2, the silicon film PS2 in which a p type impurity has been introduced can be formed by using the gas containing doping gas (gas for adding a p type impurity) as the gas for forming the silicon film PS2. In the case of introducing a p type impurity at the time of forming the silicon film PS2, it is possible to omit the ion implantation of a p type impurity into the silicon film PS2. Also, in the case where a p type impurity is introduced into the silicon film PS2 by the ion implantation after forming the silicon film PS2, a non-doped silicon film can be formed at the time of forming the silicon film PS2.

In any case, the silicon film PS2 is a p type silicon film into which a p type impurity has been introduced (doped polysilicon film) at this stage. On the other hand, the dummy control gate electrode DG is made of an n type silicon film into which an n type impurity has been introduced (doped polysilicon film).

Figure 18:
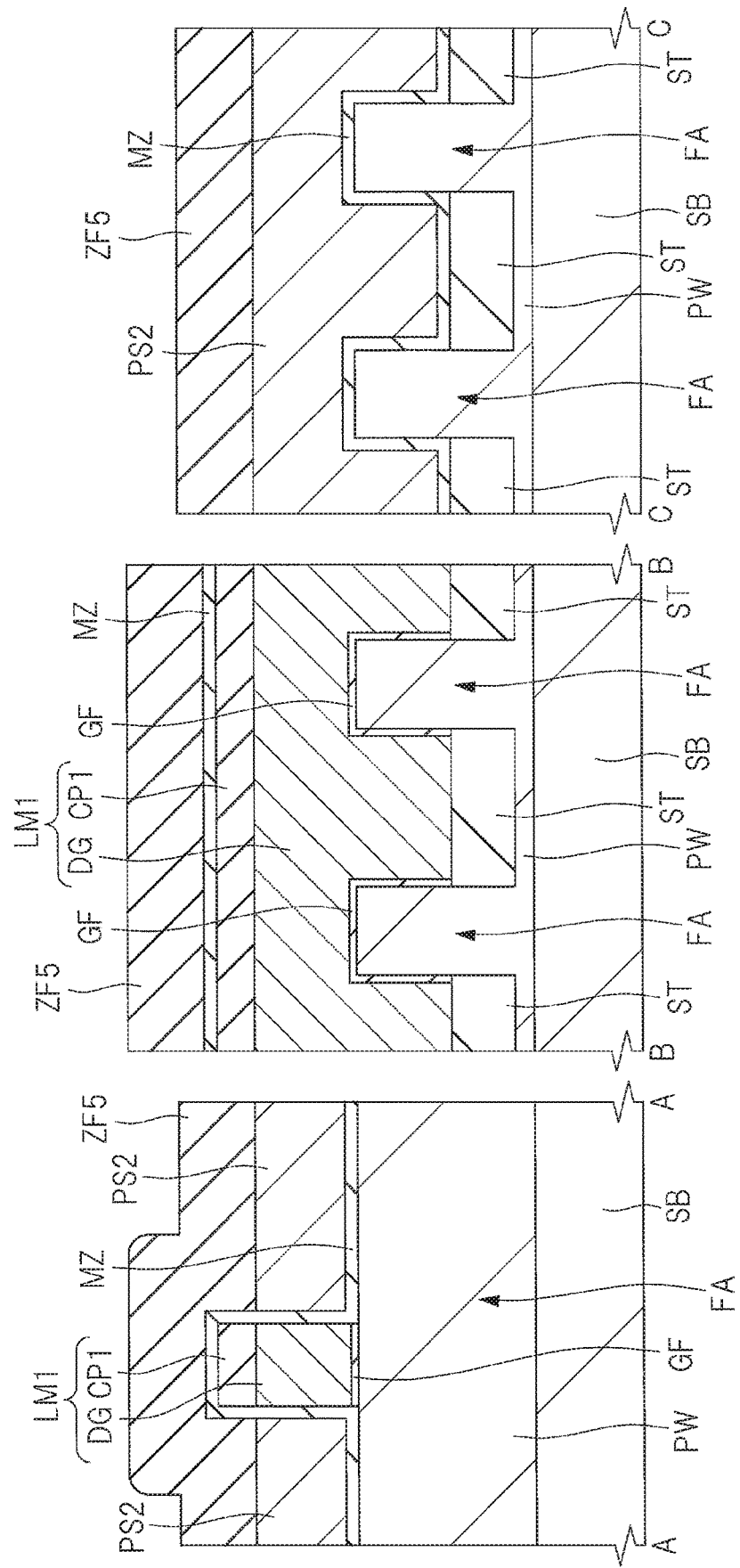
FIG. 18 is a cross-sectional view showing the principal part in the manufacturing process of the semiconductor device continued from FIG. 17.

Next, as shown in FIG. 18, an insulating film ZF5 is formed over the semiconductor substrate SB, that is, on the silicon film PS2 so as to cover the stacked body LM1 and the insulating film MZ projecting from the flat upper surface of the silicon film PS2. The insulating film ZF5 is an insulating film for forming a cap insulating film CP2 described later, is made of, for example, a silicon nitride film, and can be formed by the CVD method or the like. The insulating film ZF5 is formed on the upper surface of the silicon film PS2 and on the insulating film MZ on the surface of the stacked body LM1 projecting from the upper surface of the silicon film PS2.

Figure 19:
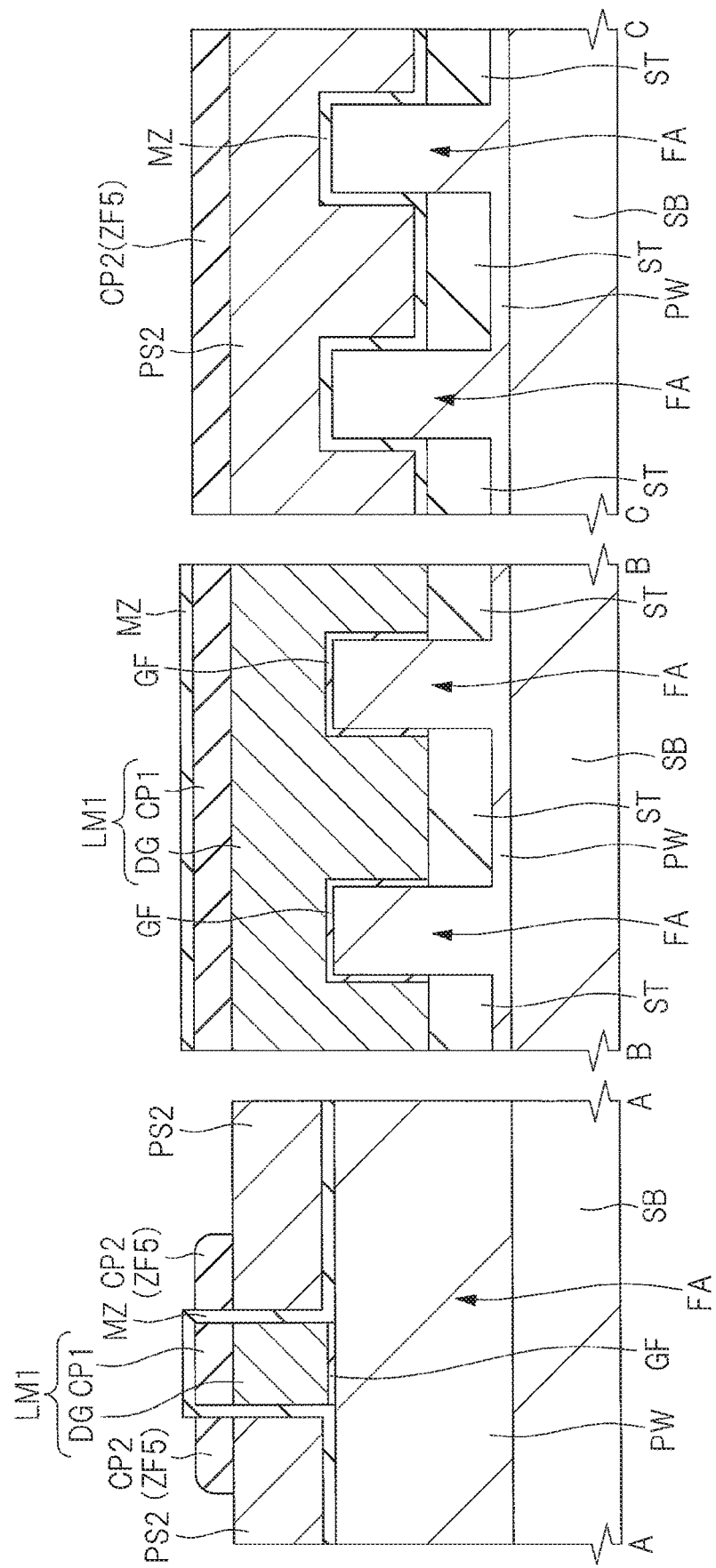
FIG. 19 is a cross-sectional view showing the principal part in the manufacturing process of the semiconductor device continued from FIG. 18.

Next, as shown in FIG. 19, the insulating film ZF5 is etched back (etching process) by using the anisotropic etching technique. As a result, the insulating film ZF5 is left to have a shape of sidewall spacer on the silicon film PS2 and on the side surface of the stacked body LM1 via the insulating film MZ, thereby forming the cap insulating film CP2. At this time, the insulating film ZF5 other than the part to be the cap insulating film CP2 is removed, and the silicon film PS2 can function as an etching stopper. The cap insulating film CP2 is formed on the upper surface of the silicon film PS2 so as to be adjacent to the part of the stacked body LM1 projecting from the upper surface of the silicon film PS2 via the insulating film MZ. The upper surface of the part of the silicon film PS2 not covered with the cap insulating film CP2 is exposed.

Figure 20:
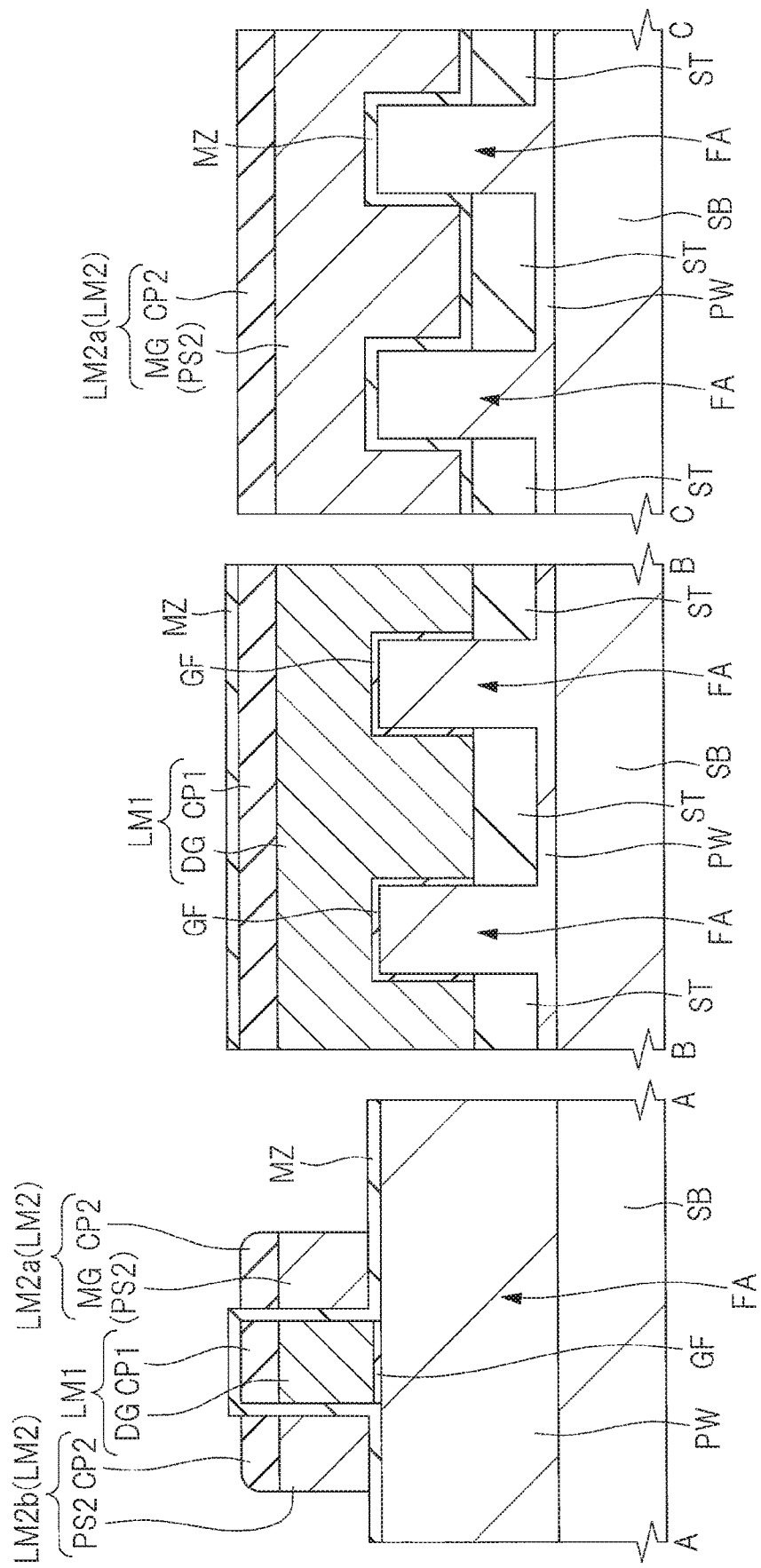
FIG. 20 is a cross-sectional view showing the principal part in the manufacturing process of the semiconductor device continued from FIG. 19.

Next, as shown in FIG. 20, the memory gate electrode MG is formed by etching the silicon film PS2 with using the cap insulating film CP2 as an etching mask. Anisotropic etching (dry etching) is preferable for the etching at this time.

Since the silicon film PS2 is etched with using the cap insulating film CP2 as an etching mask, the silicon film PS2 in the region not covered with the cap insulating film CP2 is etched and removed, and the silicon film PS2 below the cap insulating film CP2 is left without being etched. Namely, a stacked body (stacked structure) LM2 composed of the cap insulating film CP2 and the silicon film PS2 left below the cap insulating film CP2 is formed. At this stage, the stacked body LM2 is formed on each of both side surfaces of the stacked body LM1 via the insulating film MZ. In the stacked body (stacked structure) LM2a which is one of the stacked bodies LM2 formed on both side surfaces of the stacked body LM1, the silicon film PS2 left below the cap insulating film CP2 serves as the memory gate electrode MG. Thus, the stacked body LM2a is composed of the memory gate electrode MG and the cap insulating film CP2 thereon. The stacked body LM2b which is the other of the stacked bodies LM2 formed on both side surfaces of the stacked body LM1 is removed later. The stacked body LM2a and the stacked body LM2b have substantially symmetrical structures with the stacked body LM1 interposed therebetween.

Figure 21:
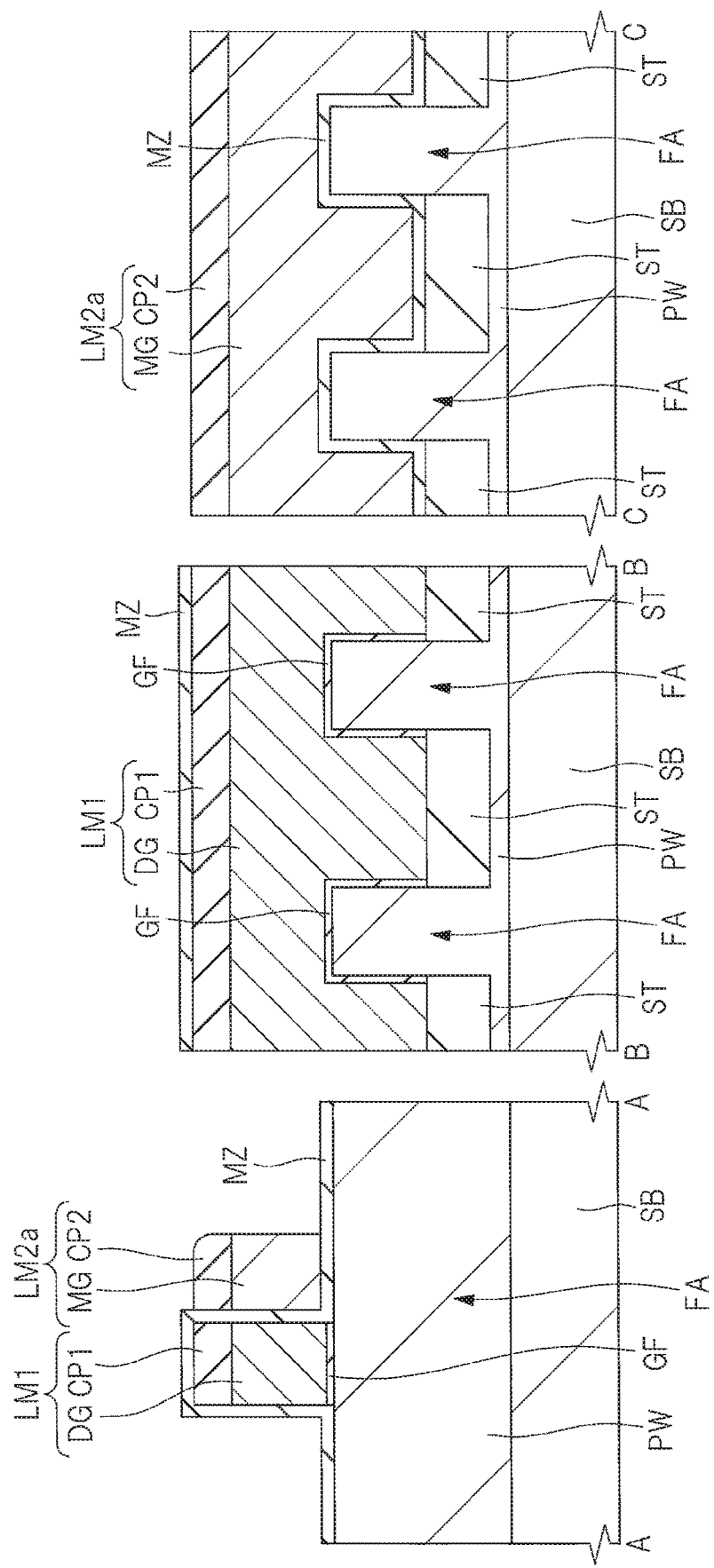
FIG. 21 is a cross-sectional view showing the principal part in the manufacturing process of the semiconductor device continued from FIG. 20.

Next, as shown in FIG. 21, a photoresist pattern (not shown) that covers the stacked body LM2a and exposes the stacked body LM2b is formed by using the photolithography technique, and then the stacked body LM2b (cap insulating film CP2 and silicon film PS2 constituting the stacked body LM2b) is removed by etching with using the photoresist pattern as an etching mask. At this time, the stacked body LM2a is covered with the photoresist pattern and is thus left without being etched. Thereafter, the photoresist pattern is removed, and FIG. 21 shows this stage. At this stage, the stacked body LM2a is formed on one of both side surfaces of the stacked body LM1 via the insulating film MZ.

Figure 22:
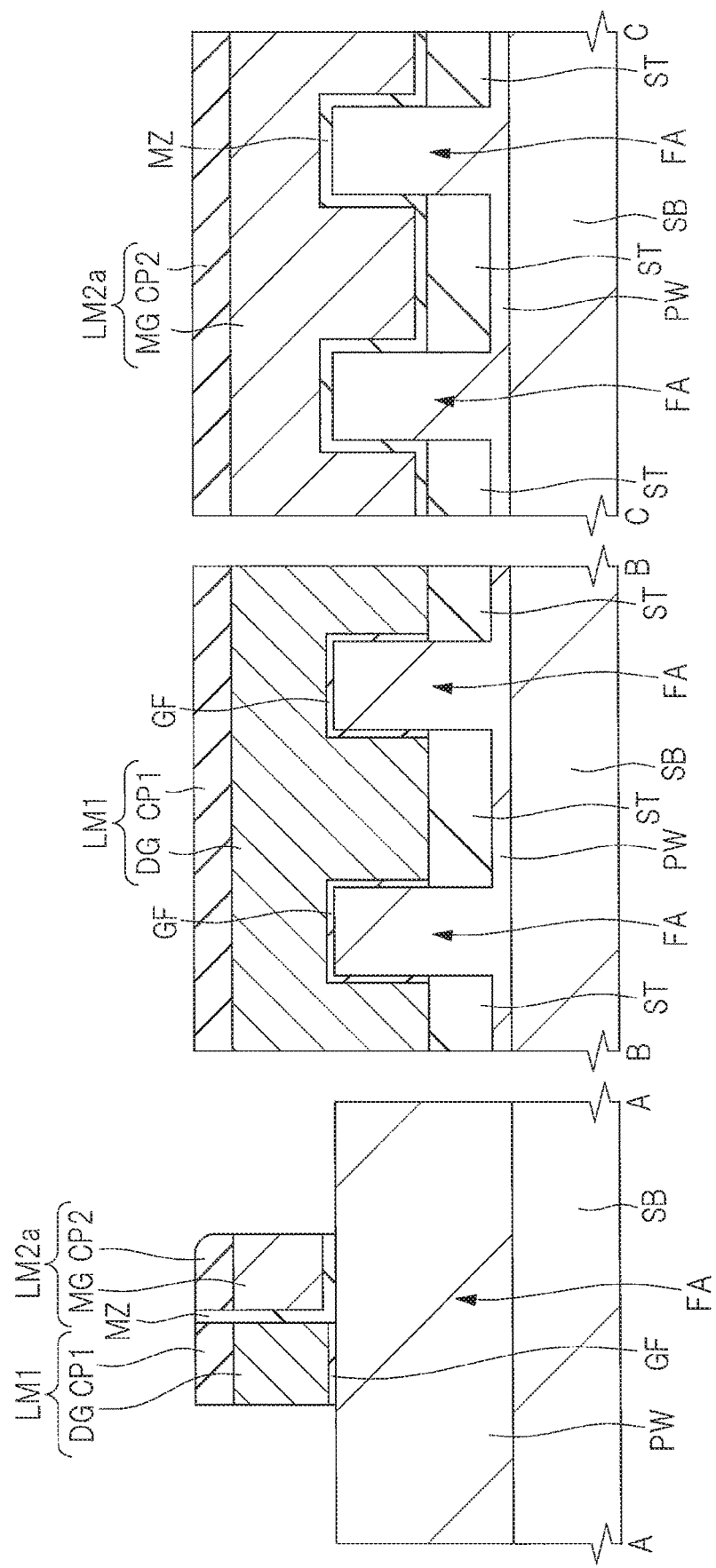
FIG. 22 is a cross-sectional view showing the principal part in the manufacturing process of the semiconductor device continued from FIG. 21.

Next, as shown in FIG. 22, a part of the insulating film MZ exposed without being covered with the stacked body LM2a is removed by etching (for example, wet etching). At this time, the insulating film MZ located below the stacked body LM2a and between the stacked body LM2a and the stacked body LM1 is left without being removed, and the insulating film MZ in the other region is removed. As a result, the fin FA and the element isolation film ST in the region not covered with the stacked bodies LM1 and LM2 are exposed. In addition, although there may be the case where the insulating films MZ3 and MZ2 in the insulating film MZ are removed and the insulating film MZ1 is left, even in such a case, the insulating film MZ1 in the region not covered with the stacked body LM2a is also removed before forming the metal silicide layer SC1 later.

As is apparent from FIG. 22, the insulating film MZ continuously extends over the region between the stacked body LM2a (memory gate electrode MG) and the fin FA, the region between the stacked body LM2a (memory gate electrode MG) and the element isolating film ST, and the region between the stacked body LM2a (memory gate electrode MG) and the stacked body LM1 (dummy control gate electrode DG). The stacked body LM1 and the stacked body LM2a are adjacent to each other with the insulating film MZ interposed therebetween, and thus the dummy control gate electrode DG and the memory gate electrode MG are adjacent to each other with the insulating film MZ interposed therebetween.

Therefore, at this stage, the memory gate electrode MG is formed on one side surface of the dummy control gate electrode DG (stacked body LM1) in the gate length direction (X direction) via the insulating film MZ, and the insulating film MZ continuously extends below the memory gate electrode MG (stacked body LM2a) and between the memory gate electrode MG (stacked body LM2a) and the dummy control gate electrode DG (stacked body LM1). Further, the dummy control gate electrode DG (stacked body LM1) and the memory gate electrode MG (stacked body LM2a) adjacent to each other with the insulating film MZ interposed therebetween extend in the Y direction so as to be laid over the plurality of fins FA.

Figure 23:
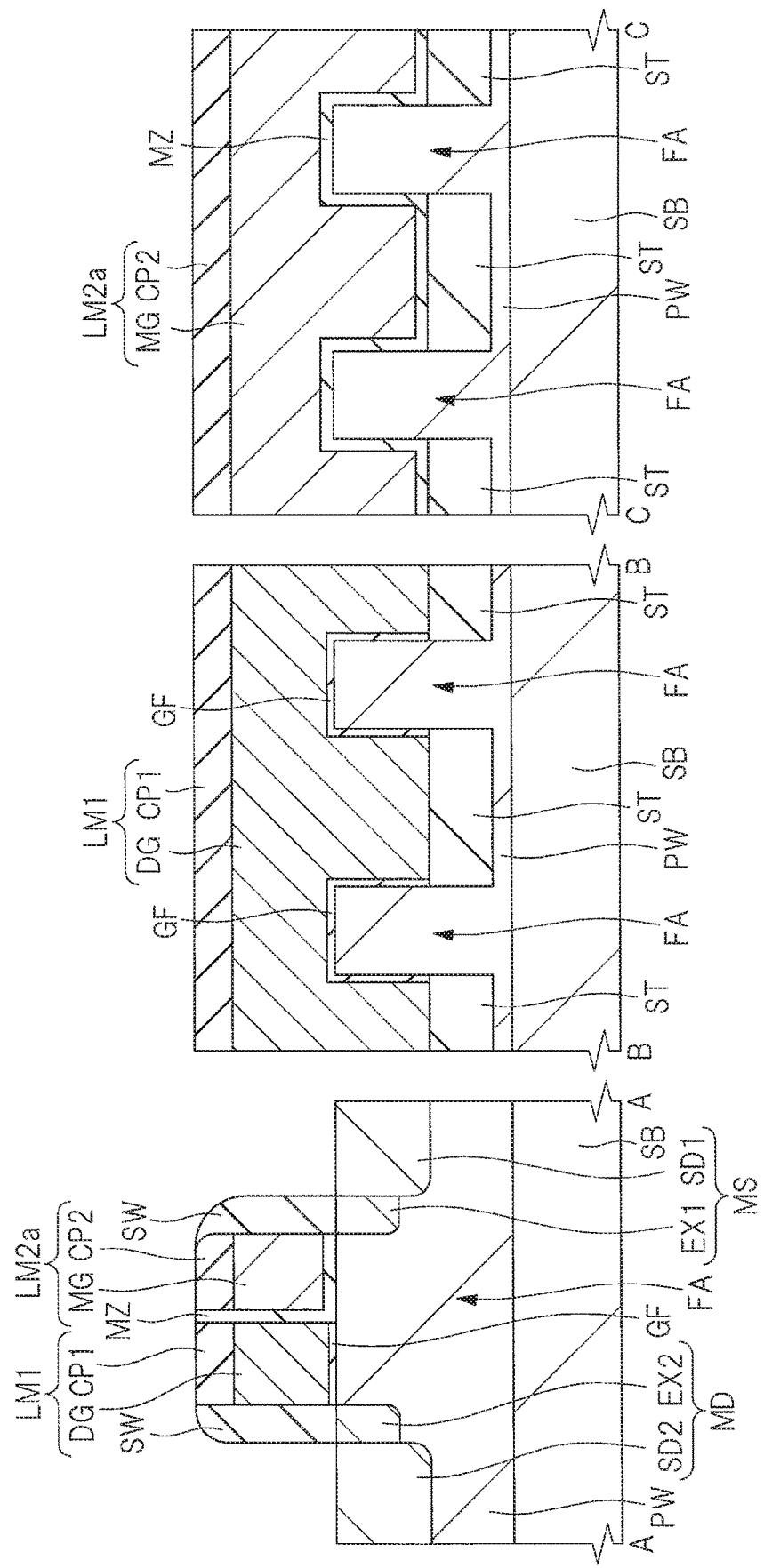
FIG. 23 is a cross-sectional view showing the principal part in the manufacturing process of the semiconductor device continued from FIG. 22.

Next, as shown in FIG. 23, an n type impurity such as arsenic (As) or phosphorus (P) is ion-implanted into the fin FA in the region not covered with the stacked bodies LM1 and LM2 with using the stacked bodies LM1 and LM2 as a mask (ion implantation blocking mask), thereby forming n$^-$ type semiconductor regions EX1 and EX2 in the fin FA. The n$^-$ type semiconductor region EX1 is formed in the fin FA so as to be adjacent to the memory gate electrode MG in the gate length direction (X direction), and the n$^-$ type semiconductor region EX2 is formed in the fin FA so as to be adjacent to the dummy control gate electrode DG in the gate length direction (X direction).

Next, a sidewall spacer SW made of an insulating film is formed on each of the side surface of the stacked body LM1 and the side surface of the stacked body LM2a (side surfaces on opposite sides of the insulating film MZ between the stacked body LM1 and the stacked body LM2a).

The process of forming the sidewall spacer SW may be performed as follows. That is, an insulating film (for example, silicon nitride film) for forming the sidewall spacer SW is formed (deposited) by the CVD method or the like over the semiconductor substrate SB, that is, on the element isolation film ST and the fin FA so as to cover the stacked bodies LM1 and LM2a. Then, by etching back the insulating film by using the anisotropic etching technique, the insulating film is left on the side surfaces of the stacked body LM1 and the stacked body LM2a, thereby forming the sidewall spacers SW as shown in FIG. 23.

Next, as shown in FIG. 23, an n type impurity such as arsenic (As) or phosphorus (P) is ion-implanted into the fin FA in the region not covered with the stacked bodies LM1 and LM2 and the sidewall spacer SW with using the stacked bodies LM1 and LM2 and the sidewall spacer SW as a mask (ion implantation blocking mask), thereby forming $n^+$ type semiconductor regions SD1 and SD2 in the fin FA. The $n^+$ type semiconductor region SD1 is formed in the fin FA so as to be adjacent to the sidewall spacer SW on the side wall of the stacked body LM2a in the gate length direction (X direction). Also, the $n^+$ type semiconductor region SD2 is formed in the fin FA so as to be adjacent to the sidewall spacer SW on the side wall of the stacked body LM1 in the gate length direction (X direction). The $n^+$ type semiconductor region SD1 has an impurity concentration higher than that of the $n^-$ type semiconductor region EX1, and the $n^+$ type semiconductor region SD2 has an impurity concentration higher than that of the $n^-$ type semiconductor region EX2.

In the manner described above, the semiconductor region for source or drain of the memory transistor, that is, the n type semiconductor region MS which functions as a source region in this case is formed from the $n^-$ type semiconductor region EX1 and the $n^+$ type semiconductor region SD1 having an impurity concentration higher than that of the $n^-$ type semiconductor region EX1. Also, the semiconductor region for source or drain of the control transistor, that is, the n type semiconductor region MD which functions as a drain region in this case is formed from the $n^-$ type semiconductor region EX2 and the $n^+$ type semiconductor region SD2 having an impurity concentration higher than that of the $n^-$ type semiconductor region EX2.

As another embodiment, it is also possible to form the $n^+$ type semiconductor regions SD1 and SD2 by forming an epitaxial semiconductor layer (not shown) on the surface of the fin FA in the region not covered with the stacked bodies LM1 and LM2a and the sidewall spacer SW after forming the sidewall spacer SW, and then performing the ion implantation of an n type impurity to the epitaxial semiconductor layer and the fin FA. In this case, the $n^+$ type semiconductor regions SD1 and SD2 are formed in the combined structure of the fin FA and the epitaxial semiconductor layer on the surface thereof.

Also, at the time of the ion implantation for forming the $n^-$ type semiconductor regions EX1 and EX2 and at the time of the ion implantation for forming the $n^+$ type semiconductor regions SD1 and SD2, the cap insulating films CP1 and CP2 are preferably made to function as a mask so as to prevent an n type impurity from being ion-implanted into the dummy control gate electrode DG and the memory gate electrode MG. In particular, it is preferable to prevent an n type impurity from being ion-implanted into the memory gate electrode MG. For this reason, it is preferable that the thickness of the cap insulating film CP2 is set such that an n type impurity does not penetrate through the cap insulating film CP2 and is not implanted into the memory gate electrode MG. In addition, it is preferable that the concentration of the p type impurity introduced into the silicon film PS2 is set to the concentration with which the memory gate electrode MG can maintain the p conductivity type even after forming the $n^+$ type semiconductor regions SD1 and SD2. In any case, at this stage, the memory gate electrode MG is made of a p type silicon film and the dummy control gate electrode DG is made of an n type silicon film.

Next, an activation annealing that is the heat treatment for activating the impurity introduced into the semiconductor regions for source and drain ($n^-$ type semiconductor regions EX1 and EX2 and $n^+$ type semiconductor regions SD1 and SD2) and others is performed.

Figure 24:
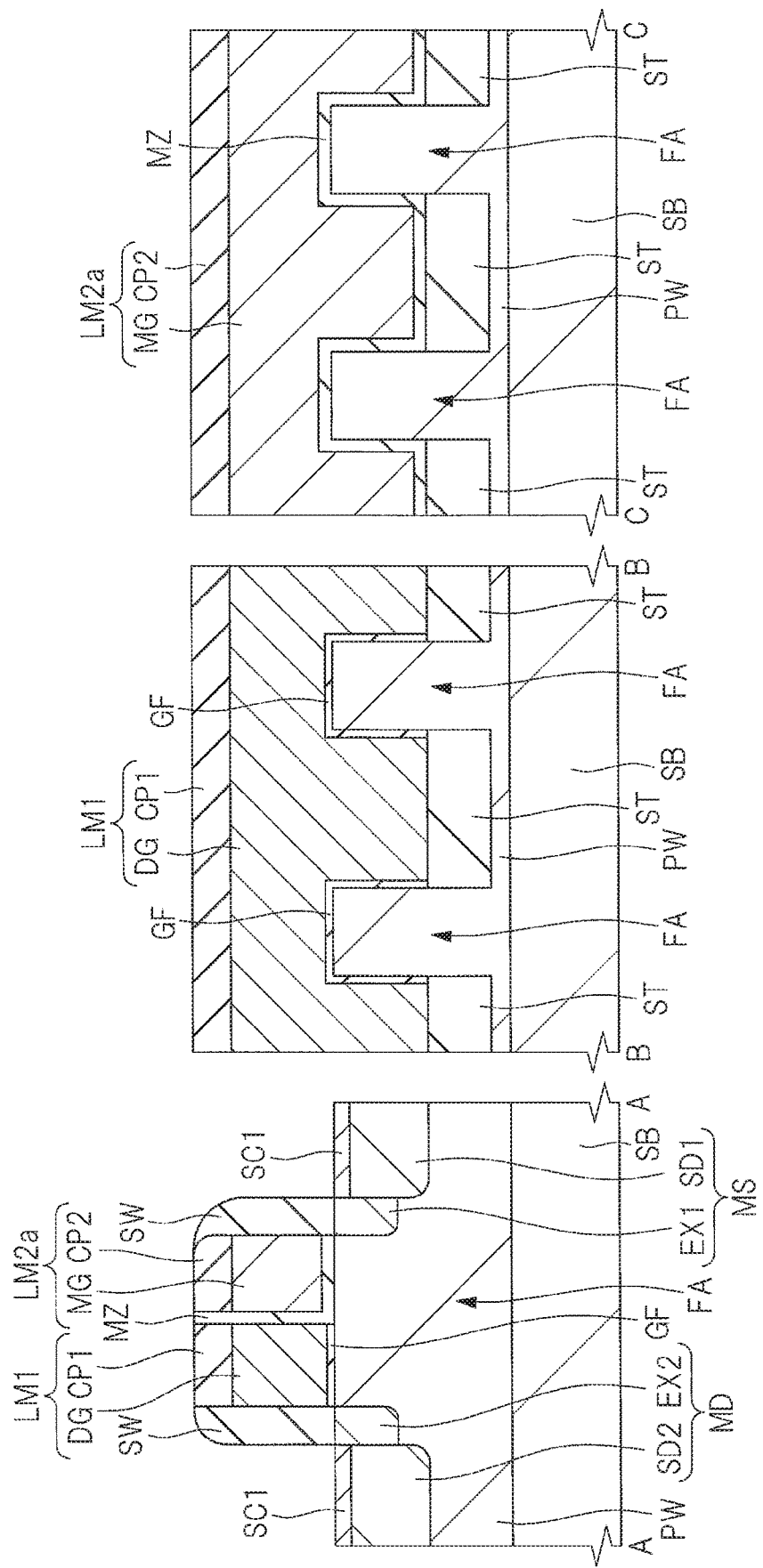
FIG. 24 is a cross-sectional view showing the principal part in the manufacturing process of the semiconductor device continued from FIG. 23.

Next, as shown in FIG. 24, a so-called salicide (Self Aligned Silicide) process is performed to form the metal silicide layer SC1 in the surface layer portion of each of the $n^+$ type semiconductor regions SD1 and SD2.

The process of forming the metal silicide layer SC1 may be performed as follows. That is, a metal film (for example, nickel film) that covers the surface of each of the $n^+$ type semiconductor regions SD1 and SD2 is first formed by the sputtering method or the like. Then, the heat treatment is performed to react the surface layer portion of each of the $n^+$ type semiconductor regions SD1 and SD2 with the metal film, thereby forming the metal silicide layer SC1 in the surface layer portion of each of the $n^+$ type semiconductor regions SD1 and SD2. The metal silicide layer SC1 is a nickel silicide layer when the metal film is a nickel film. Thereafter, the unreacted (excessive) metal film is removed. FIG. 24 shows a cross-sectional view at this stage. The second heat treatment may be performed after the unreacted metal film is removed. Also, since the cap insulating films CP1 and CP2 are present, the metal silicide layer SC1 is not formed in the surface layer portion of each of the dummy control gate electrode DG and the memory gate electrode MG.

Also, when the epitaxial semiconductor layer (not shown) is formed on the surface of the fin FA in the region not covered with the stacked bodies LM1 and LM2 and the sidewall spacer SW after forming the sidewall spacer SW as described above, the metal silicide layer SC1 may be formed in the epitaxial semiconductor layer.

Figure 25:
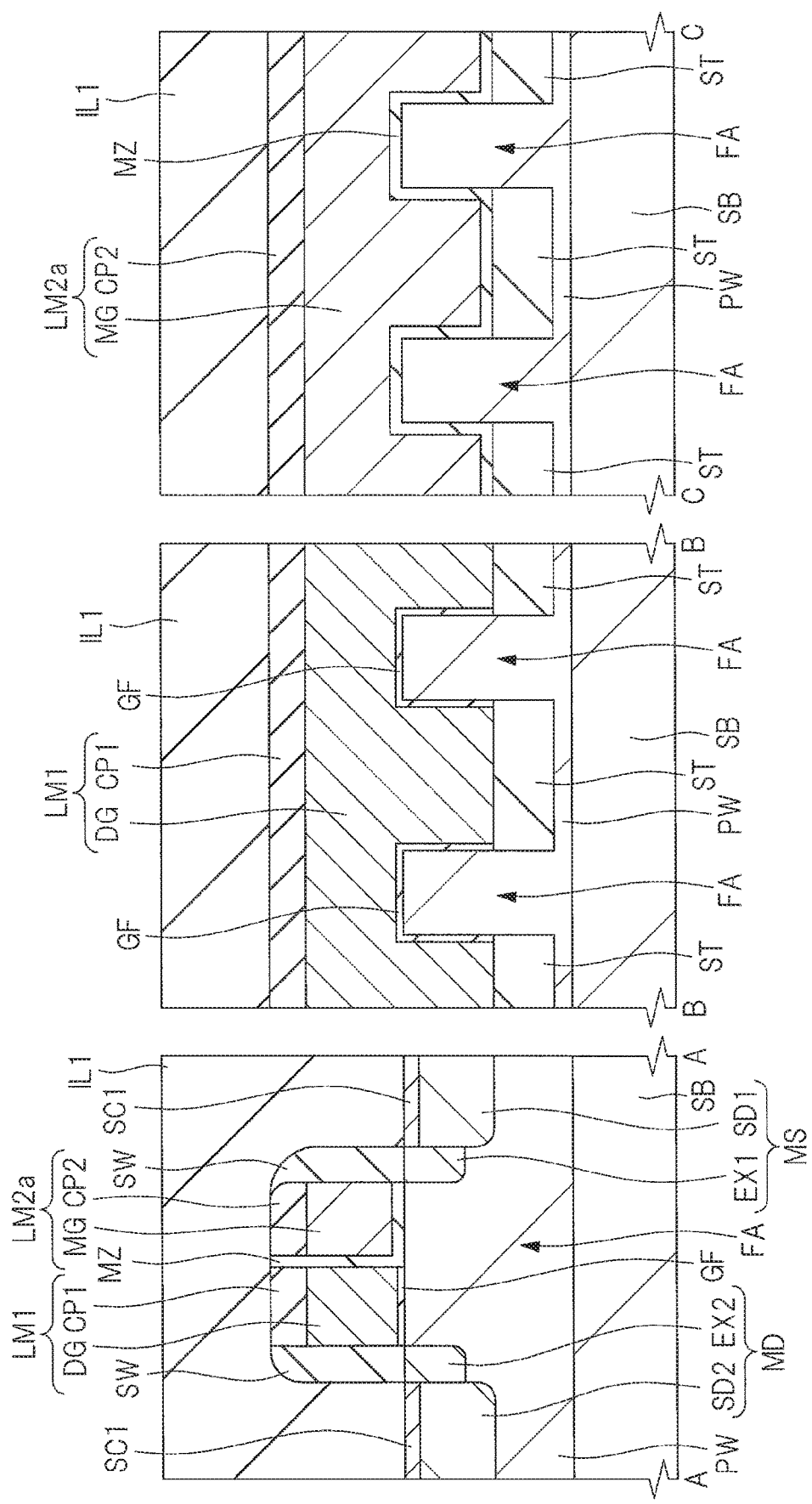
FIG. 25 is a cross-sectional view showing the principal part in the manufacturing process of the semiconductor device continued from FIG. 24.

Next, as shown in FIG. 25, the interlayer insulating film IL1 as an insulating film is formed (deposited) over the semiconductor substrate SB, that is, on the element isolation film ST and the fin FA so as to cover the stacked bodies LM1 and LM2 and the sidewall spacer SW. The interlayer insulating film IL1 is made of a single film of a silicon oxide film or a stacked film of a silicon nitride film and a silicon oxide film formed to be thicker than the silicon nitride film on the silicon nitride film, and can be formed by the CVD method or the like. A deposition thickness of the interlayer insulating film IL1 is set such that any region of the upper surface of the interlayer insulating film IL1 becomes higher than the height position of the upper surface of the stacked bodies LM1 and LM2a.

Figure 26:
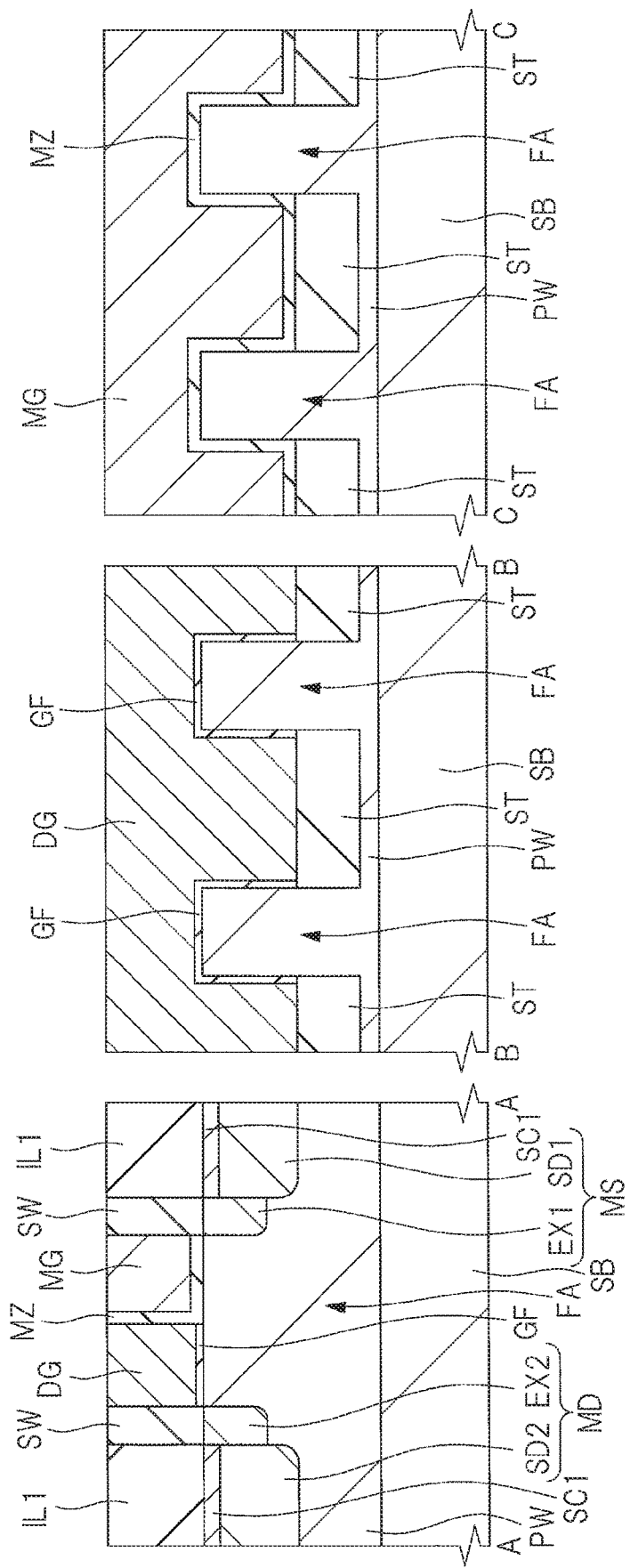
FIG. 26 is a cross-sectional view showing the principal part in the manufacturing process of the semiconductor device continued from FIG. 25.

Next, as shown in FIG. 26, the upper surface of the interlayer insulating film IL1 is polished by the CMP method or the like. This polishing process is referred to as "polishing process of FIG. 26" in the following description. As shown in FIG. 26, the upper surfaces of the memory gate electrode MG and the dummy control gate electrode DG are exposed by the polishing process of FIG. 26.

In the polishing process of FIG. 26, the interlayer insulating film IL1 is polished until the upper surfaces of the dummy control gate electrode DG and the memory gate electrode MG are exposed. Therefore, the cap insulating films CP1 and CP2 are also polished and removed, and an upper part of each sidewall spacer SW may be polished in the polishing process of FIG. 26.

Note that, although the polishing process is performed until the upper surfaces of the dummy control gate electrode DG and the memory gate electrode MG are exposed in the polishing process of FIG. 26, apart (upper part) of each of the dummy control gate electrode DG and the memory gate electrode MG may be polished and removed in the polishing process of FIG. 26. Even in such a case, the other part (part other than upper part) of each of the dummy control gate electrode DG and the memory gate electrode MG is left. In any case, when the polishing process of FIG. 26 has been performed, the upper surface of each of the dummy control gate electrode DG and the memory gate electrode MG is exposed from the interlayer insulating film IL1. In addition, the upper surface of each sidewall spacer SW is also exposed, and the interlayer insulating film IL1 has a flat upper surface.

Since it is not necessary to polish the metal silicide layer SC1 in the polishing process of FIG. 26, the polishing process can be easily performed. Namely, when the metal silicide layer SC1 is formed on one or both of the memory gate electrode MG and the dummy control gate electrode DG unlike the present embodiment, it is necessary to polish also the metal silicide layer SC1 in the polishing process of FIG. 26, and this may cause the problem of scratch. On the other hand, in the present embodiment, the cap insulating films CP1 and CP2 are formed so as to prevent the metal silicide layer SC1 from being formed on the dummy control gate electrode DG and the memory gate electrode MG. As a result, it is not necessary to polish the metal silicide layer SC1 in the polishing process of FIG. 26, and it is thus possible to eliminate the concern about the scratch caused by polishing the metal silicide layer SC1.

Figure 27:
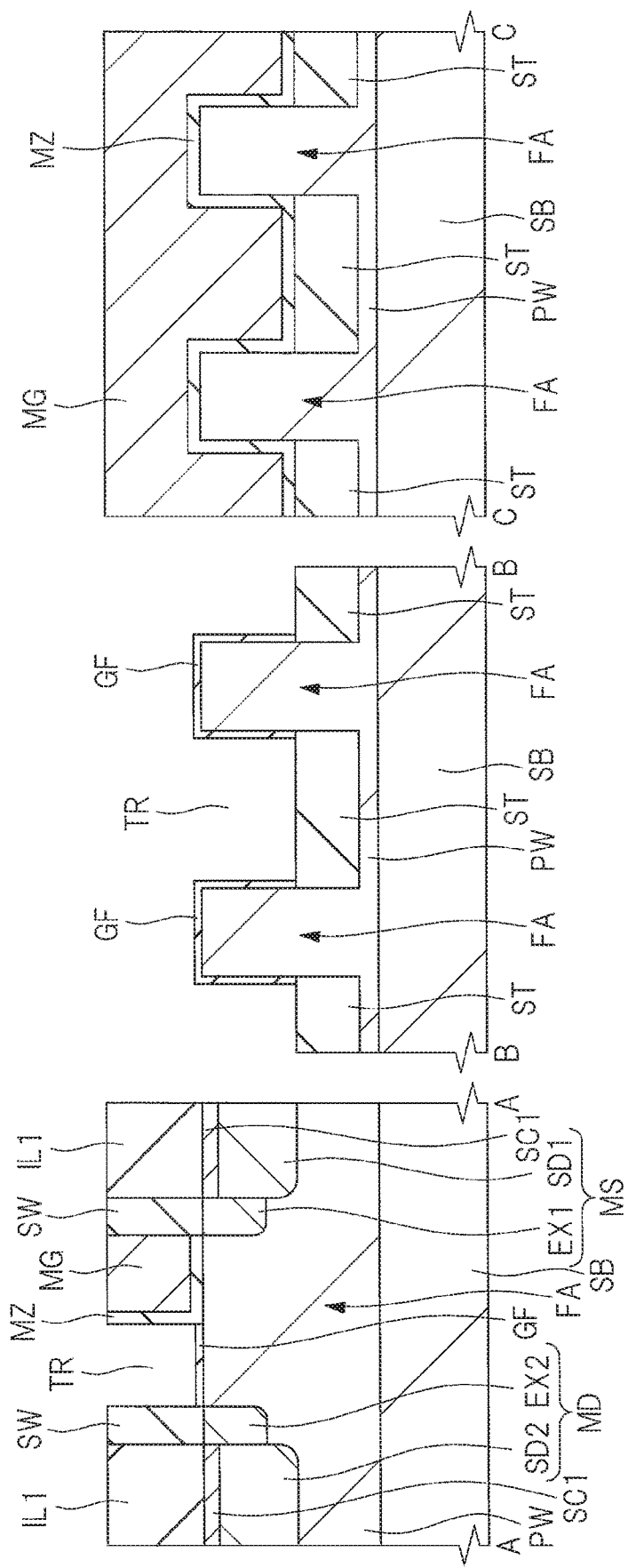
FIG. 27 is a cross-sectional view showing the principal part in the manufacturing process of the semiconductor device continued from FIG. 26.

Next, as shown in FIG. 27, the dummy control gate electrode DG is removed by etching. This process is referred to as "etching process of FIG. 27" in the following description. In the etching process of FIG. 27, the etching process (wet etching process) is performed in the state where the upper surface of the dummy control gate electrode DG and the upper surface of the memory gate electrode MG are exposed.

In the etching process of FIG. 27, the etching is performed under the condition that the memory gate electrode MG, the insulating film GF, the insulating film MZ, the sidewall spacer SW, and the interlayer insulating film IL1 are less likely to be etched compared with the dummy control gate electrode DG. Namely, in the etching process of FIG. 26, the etching is performed under the condition that the etching rate of each of the memory gate electrode MG, the insulating film GF, the insulating film MZ, the sidewall spacer SW, and the interlayer insulating film IL1 is lower than the etching rate of the dummy control gate electrode DG. Thus, it is possible to selectively etch the dummy control gate electrode DG in the etching process of FIG. 27. Note that "a second member is less likely to be etched compared with a first member" means that the etching rate of the second member is lower than the etching rate of the first member in the present application.

At the stage of performing the etching process of FIG. 27, the memory gate electrode MG is made of a p type silicon film, and the dummy control gate electrode DG is made of an n type silicon film. An n type silicon film and a p type silicon film have different etching rates for the same etching solution, and it is possible to selectively etch then type silicon film while suppressing the etching of the p type silicon film depending on the selected etching solution. In the present embodiment, the etching solution capable of selectively etching an n type silicon film while suppressing the etching of a p type silicon film (preferably alkaline solution such as ammonia water) is used for the etching process of FIG. 27, so that the dummy control gate electrode DG can be selectively etched and removed while suppressing the etching of the memory gate electrode MG. The etching selectivity of the dummy control gate electrode DG to the memory gate electrode MG (value obtained by dividing the etching rate of the dummy control gate electrode DG by the etching rate of the memory gate electrode MG) is preferably 10 or more.

From the viewpoint of the function and the reliability as the gate electrode of the memory transistor, the gate electrode of the memory transistor is preferably made of silicon. In the present embodiment, since the memory gate electrode MG is formed of a p type silicon film, it is possible to improve the function and the reliability as the gate electrode of the memory transistor, so that it is possible to improve the reliability of the non-volatile memory. Further, since the memory gate electrode MG is formed of a p type silicon film and the dummy control gate electrode DG is formed of an n type silicon film, it is possible to selectively etch and remove the dummy control gate electrode DG even when the etching is performed in the state where the upper surface of the dummy control gate electrode DG and the upper surface of the memory gate electrode MG are exposed in the etching process of FIG. 27.

A trench (concave portion, recessed portion) TR is formed by removing the dummy control gate electrode DG in the etching process of FIG. 27. The trench TR is the region from which the dummy control gate electrode DG has been removed, and corresponds to the region where the dummy control gate electrode DG is present before the dummy control gate electrode DG is removed. The insulating film GF remains in a layered shape at a bottom part of the trench TR. Accordingly, the upper surface of the insulating film GF forms a bottom surface of the trench TR, the sidewall spacer SW forms one side surface of the trench TR, and the insulating film MZ (MZ1) forms the other side surface of the trench TR.

Figure 29:
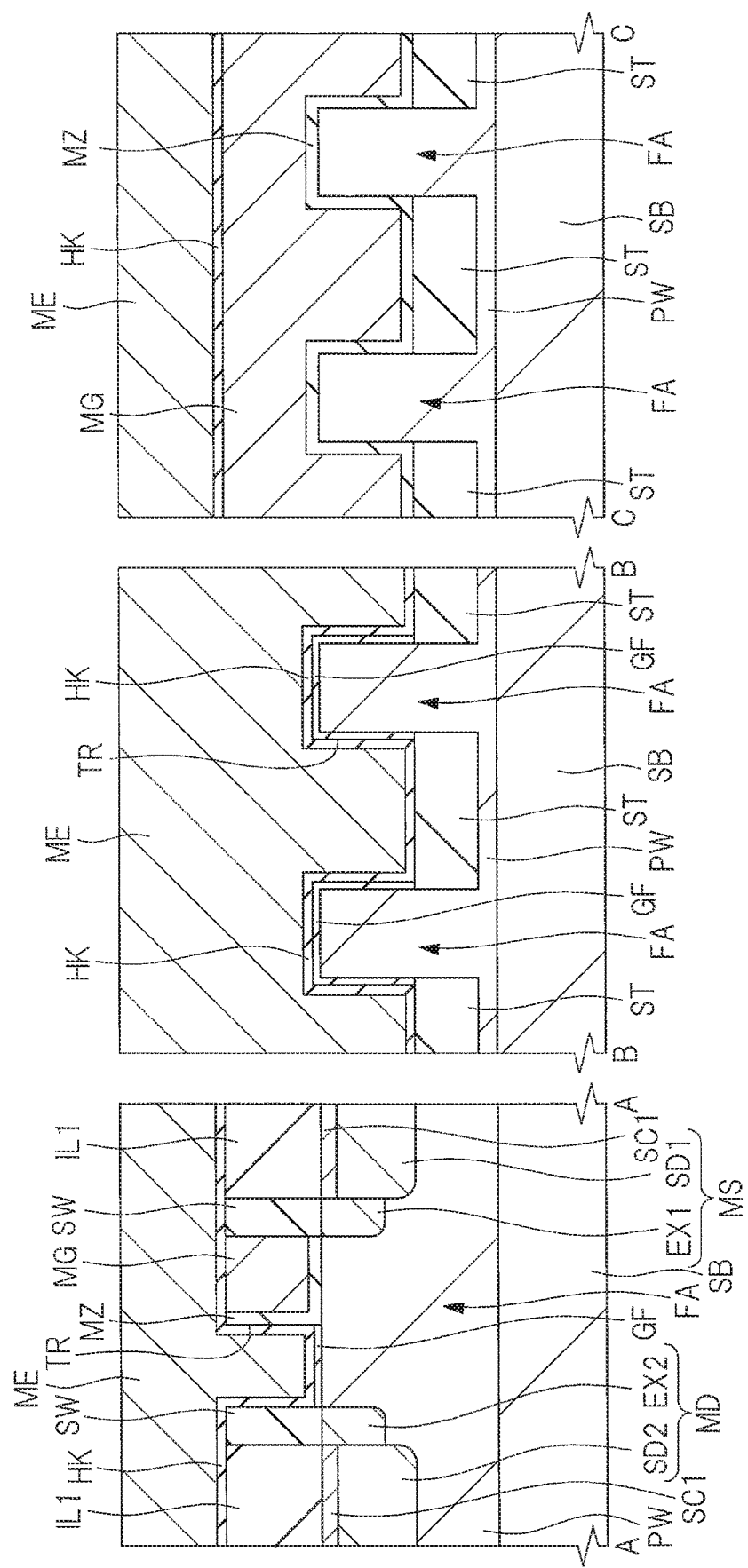
FIG. 29 is a cross-sectional view showing the principal part in the manufacturing process of the semiconductor device continued from FIG. 28.

Next, as shown in FIG. 28, the insulating film HK is formed as an insulating film for high dielectric constant gate insulating film over the semiconductor substrate SB, that is, on the interlayer insulating film IL1 including an inner surface (bottom surface and side surface) of the trench TR. The insulating film HK is made of a high dielectric constant insulating film. Then, as shown in FIG. 29, a metal film ME is formed as a conductive film for metal gate electrode over the semiconductor substrate SB, that is, on the insulating film HK so as to fill the trench TR.

The insulating film HK is formed on the bottom surface and the side surface of the trench TR, but the trench TR is not completely filled with the insulating film HK, and the trench TR is completely filled with the insulating film HK and the metal film ME by forming the metal film ME.

The insulating film HK is a so-called High-k film made of an insulating material film having a dielectric constant higher than that of a silicon nitride film. Note that a High-k film, a high dielectric constant film, a high dielectric constant insulating film, and a high dielectric constant gate insulating film mentioned in the present application mean a film having a dielectric constant (relative permittivity) higher than that of silicon nitride.

A metal oxide film such as a hafnium oxide film, a zirconium oxide film, an aluminum oxide film, a tantalum oxide film or a lanthanum oxide film may be used as the insulating film HK, and these metal oxide films may contain one or both of nitrogen (N) and silicon (Si). The insulating film HK can be formed by, for example, the ALD (Atomic Layer Deposition) method or the CVD method. A formation thickness of the insulating film HK may be, for example, about 1 to 3 nm. When a high dielectric constant film (insulating film HK in this case) is used for the gate insulating film, a physical film thickness of the gate insulating film can be increased as compared with the case where a silicon oxide film is used for the gate insulating film, and it is thus possible to obtain an advantage that the leakage current can be reduced.

As the metal film ME, for example, a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium aluminum (TiAl) film or an aluminum (Al) film may be used. Note that a metal film mentioned here indicates a conductive film showing metallic conduction and includes a metal compound film (metal nitride film or metal carbide film) showing metallic conduction in addition to a single metal film (pure metal film) and an alloy film. Therefore, the metal film ME is a conductive film showing metallic conduction and is not limited to a single metal film (pure metal film) and an alloy film, and may be a metal compound film (metal nitride film or metal carbide film) showing metallic conduction. In addition, a stacked film (stacked film in which a plurality of films are stacked) may be used for the metal film ME, but in this case, a metal film (conductive film showing metallic conduction) should be used as the lowermost layer of the stacked film. Also, the stacked film may be a stacked film of a plurality of metal films (conductive films showing metallic conduction). The metal film ME can be formed by, for example, the sputtering method.

As a preferred example of the metal film ME, a stacked film of a titanium nitride (TiN) film and an aluminum (Al) film on the titanium nitride film may be used as the metal film ME. In this case, a titanium nitride film of, for example, about 2 to 3 nm is first formed on the insulating film HK, and then an aluminum film is formed on the titanium nitride film so as to fill the inside of the trench TR. At this time, it is preferable that the aluminum film is thicker than the titanium nitride film. Since the aluminum film has low resistance, it is possible to reduce the resistance of the control gate electrode CG to be formed later. Further, it is possible to control the threshold voltage of the control transistor including the control gate electrode CG formed later by the work function of the material of the part of the control gate electrode CG (titanium nitride film in this case) in contact with the gate insulating film.

Figure 30:
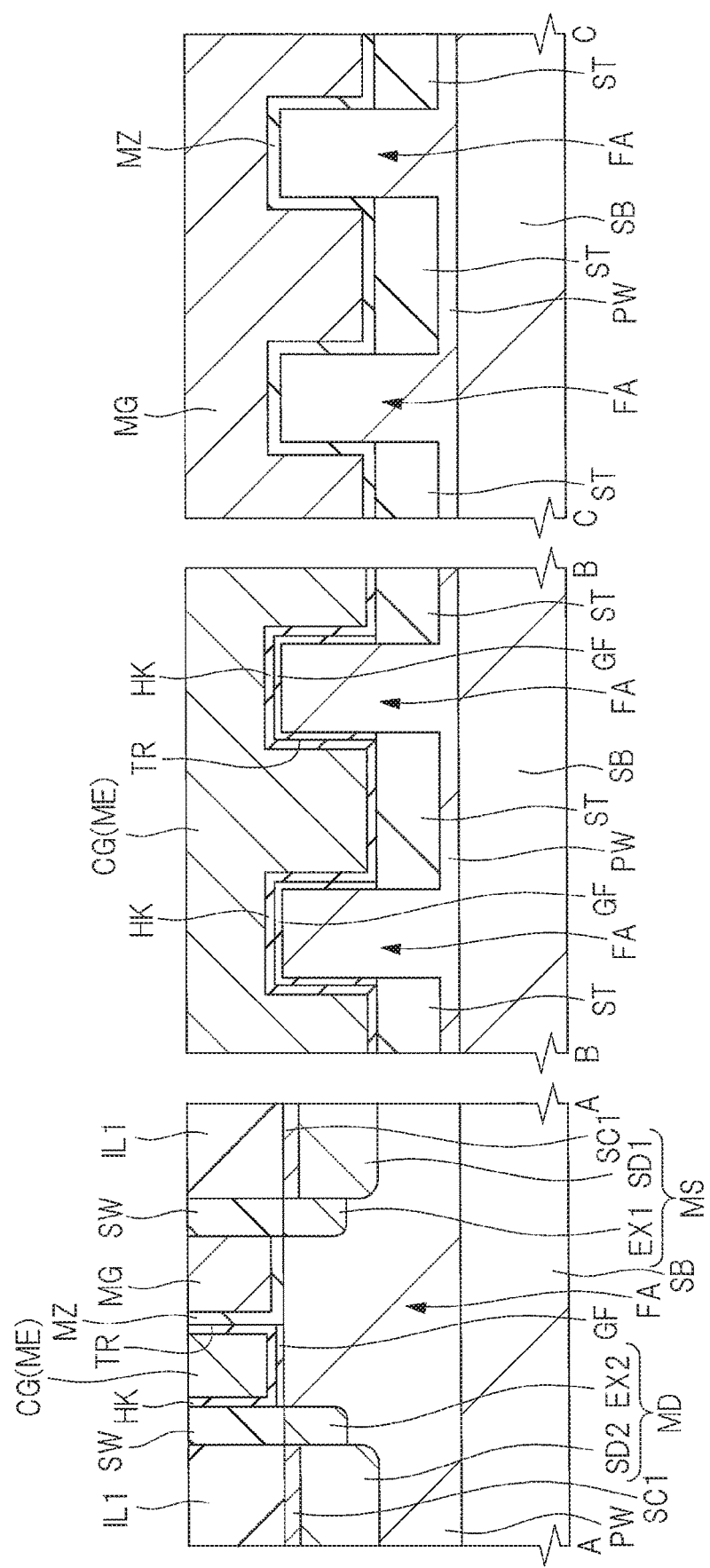
FIG. 30 is a cross-sectional view showing the principal part in the manufacturing process of the semiconductor device continued from FIG. 29.

Next, as shown in FIG. 30, the unnecessary metal film ME and insulating film HK outside the trench TR are removed by the polishing process using the CMP method or the like, thereby filling the trench TR with the insulating film HK and the metal film ME. This process is referred to as "process of FIG. 30" in the following description.

Namely, in the process of FIG. 30, the metal film ME and the insulating film HK outside the trench TR are removed, so that the insulating film HK and the metal film ME are left in the trench TR. As a result, the metal film ME is buried in the trench TR via the insulating film HK.

In the manner described above, the control gate electrode CG which is the metal gate electrode is formed in the trench TR corresponding to the region from which the dummy control gate electrode DG has been removed, via the insulating film HK. The metal film ME buried in the trench TR functions as the control gate electrode CG of the control transistor, and the insulating film HK buried in the trench TR functions as the gate insulating film of the control transistor.

In the present embodiment, the dummy control gate electrode DG is removed and replaced with the control gate electrode CG, and the control gate electrode CG is used as the gate electrode of the control transistor. Therefore, the dummy control gate electrode DG is a dummy gate electrode (pseudo gate electrode) and can be regarded as a replacement gate electrode or a substitution gate electrode, and the control gate electrode CG can be regarded as a gate electrode constituting the control transistor.

Also, since the metal film ME is used to form the control gate electrode CG in the present embodiment, the control gate electrode CG can be formed as the metal gate electrode. Since the control gate electrode CG is formed as the metal gate electrode, it is possible to obtain an advantage that the depletion of the control gate electrode CG can be suppressed and the parasitic capacitance can be eliminated. Also, it is advantageously possible to miniaturize the transistor element (thickness reduction of the gate insulating film).

The insulating film HK is formed on the bottom surface and the side surface of the trench TR, and the bottom surface and the side surface of the control gate electrode CG are adjacent to the insulating film HK. The insulating film GF and the insulating film HK are interposed in order from the side of the fin FA between the control gate electrode CG and the fin FA. Also, the insulating film HK is interposed between the control gate electrode CG and the sidewall spacer SW, and the insulating film HK and the insulating film MZ are interposed in order from the side of the control gate electrode CG between the control gate electrode CG and the memory gate electrode MG. In addition, the insulating film HK is interposed between the control gate electrode CG and the element isolation film ST. The insulating film GF and the insulating film HK between the fin FA and the control gate electrode CG function as the gate insulating film of the control transistor, and the insulating film HK is a high dielectric constant film and thus functions as the high dielectric constant gate insulating film.

Also, since the insulating film GF is left in a layered shape at the bottom part of the trench TR even after the dummy control gate electrode DG has been removed by etching in the etching process of FIG. 27, the insulating film HK and the insulating film GF are interposed between the control gate electrode CG and the fin FA when the control gate electrode CG is formed. Namely, the insulating film GF is interposed as an interface layer (at the interface) between the insulating film HK and the fin FA. In the case where the insulating film HK which is a high dielectric constant film is not directly formed on the surface (silicon surface) of the fin FA, but the interface layer (insulating film GF in this case) made of a thin silicon oxide film or silicon oxynitride film is provided at the interface between the insulating film HK and the fin FA, it is possible to reduce the number of defects such as a trap level and to improve driving capability and reliability.

Figure 31:
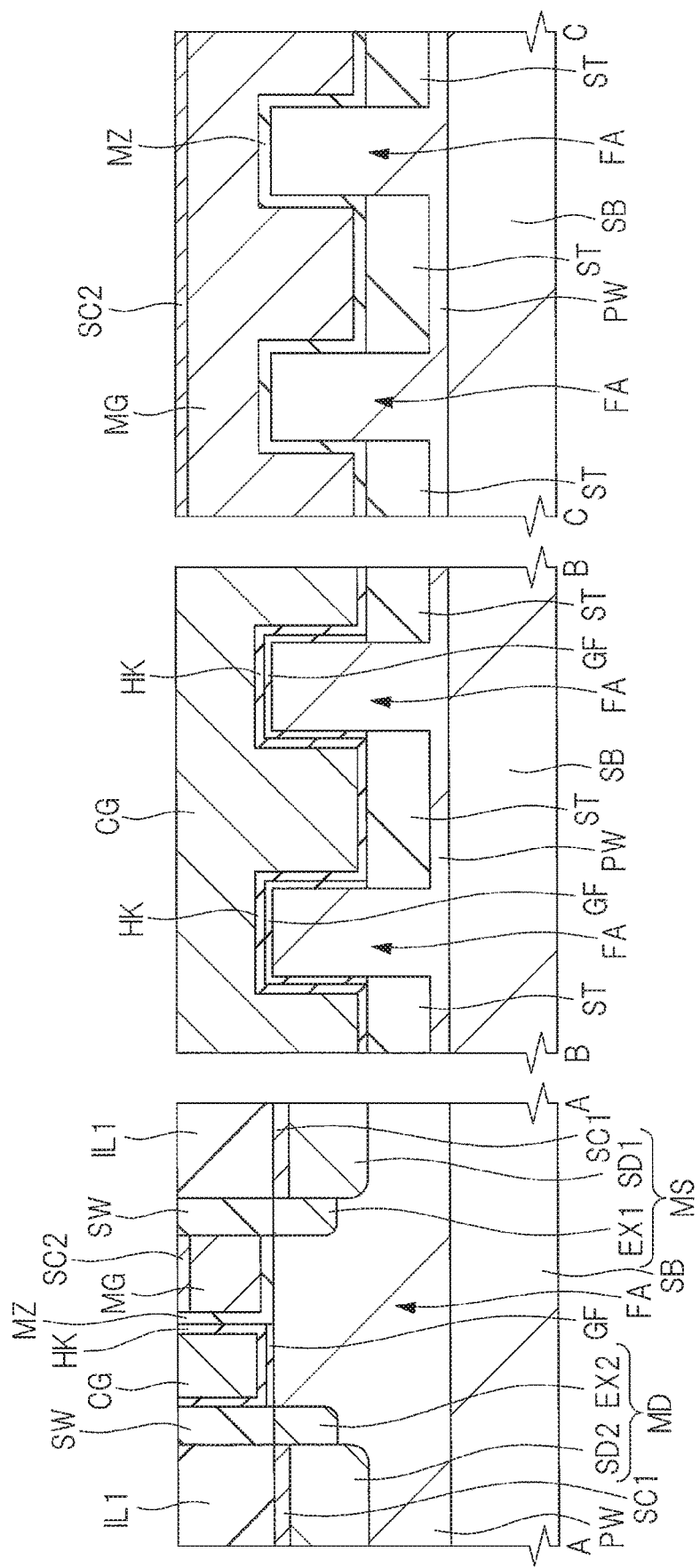
FIG. 31 is a cross-sectional view showing the principal part in the manufacturing process of the semiconductor device continued from FIG. 30.

Next, as shown in FIG. 31, the metal silicide layer SC2 is formed in the upper part (surface layer portion) of the memory gate electrode MG.

Namely, a metal film for forming the metal silicide layer SC2 (for example, nickel film) is formed by the sputtering method or the like on the interlayer insulating film IL1 including the upper surfaces of the control gate electrode CG and the memory gate electrode MG. Then, the heat treatment is performed to react the upper part (surface layer portion) of the memory gate electrode MG with the metal film for forming the metal silicide layer SC2, thereby forming the metal silicide layer SC2 in the upper part (surface layer portion) of the memory gate electrode MG as shown in FIG. 31. Thereafter, the unreacted metal film (metal film for forming the metal silicide layer SC2) is removed by wet etching or the like. FIG. 31 shows a cross-sectional view at this stage. Thereafter, the heat treatment may be further performed. When the unreacted metal film (metal film for forming the metal silicide layer SC2) is removed by the wet etching or the like, since it is preferable to suppress or prevent the control gate electrode CG from being etched, the etching solution capable of selectively etching the metal film for forming the metal silicide layer SC2 is preferably used. When the metal film for forming the metal silicide layer SC2 is a nickel film, the metal silicide layer SC2 is made of a nickel silicide layer.

As described above, by performing the so-called salicide process, the metal silicide layer SC2 is formed in the upper part (surface layer portion) of the memory gate electrode MG in a self-aligned manner, and it is thus possible to reduce the resistance of the memory gate electrode MG.

The formation of the metal silicide layer SC2 may be omitted, but it is more preferable to form the metal silicide layer SC2. Since the formation of the metal silicide layer SC2 makes it possible to reduce the resistance of the memory gate electrode MG which is a silicon gate electrode, the performance of the semiconductor device including the non-volatile memory can be improved, for example, the operation speed thereof can be improved.

Figure 32:
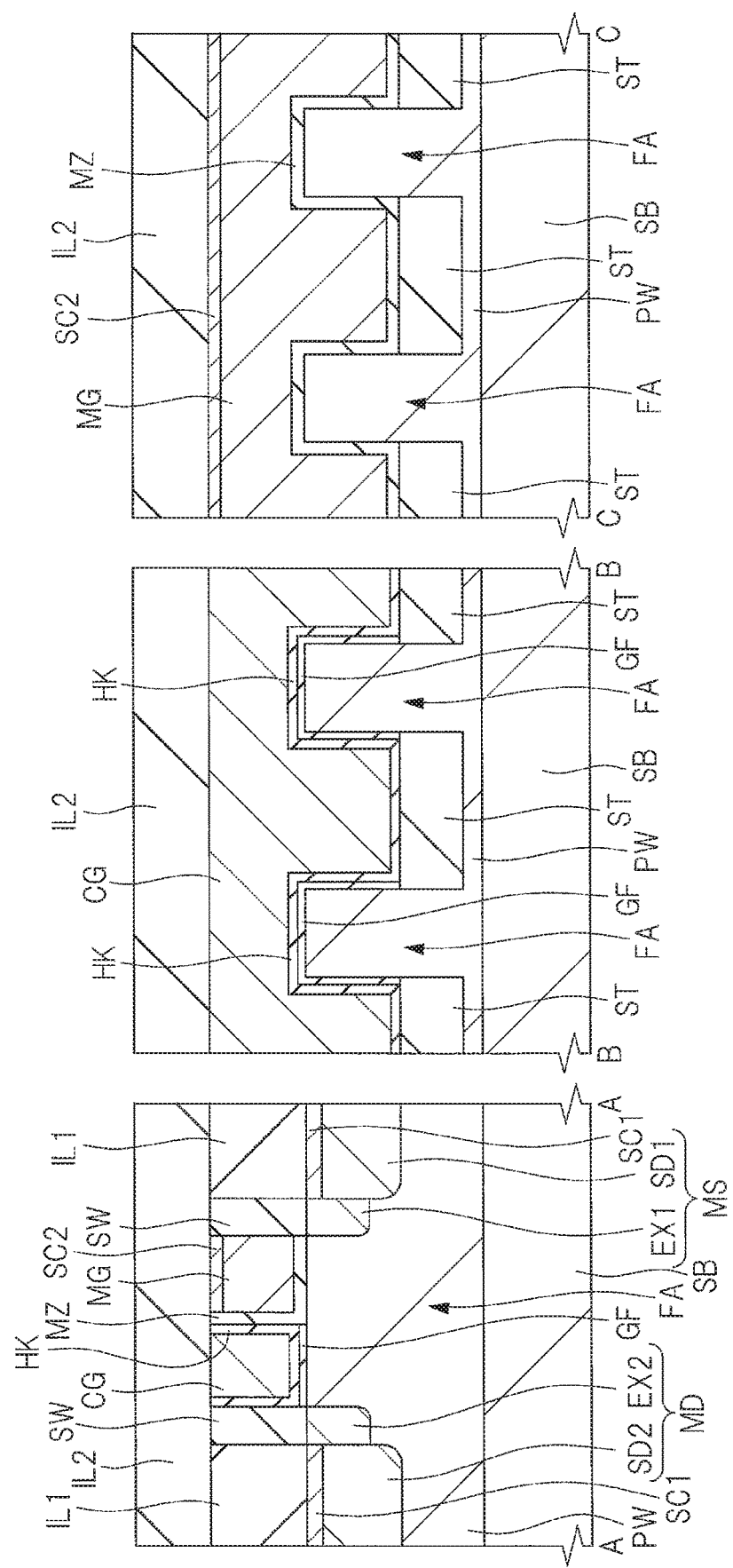
FIG. 32 is a cross-sectional view showing the principal part in the manufacturing process of the semiconductor device continued from FIG. 31.

Next, as shown in FIG. 32, the interlayer insulating film IL2 as an insulating film is formed (deposited) over the semiconductor substrate SB, that is, on the interlayer insulating film IL1 so as to cover the control gate electrode CG and the memory gate electrode MG (metal silicide layer SC2). The interlayer insulating film IL2 is made of a silicon oxide film or the like, and can be formed by the CVD method or the like. After the interlayer insulating film IL2 is formed, the upper surface of the interlayer insulating film IL2 may be polished by the CMP method or the like to improve the flatness of the upper surface of the interlayer insulating film IL2.

Figure 33:
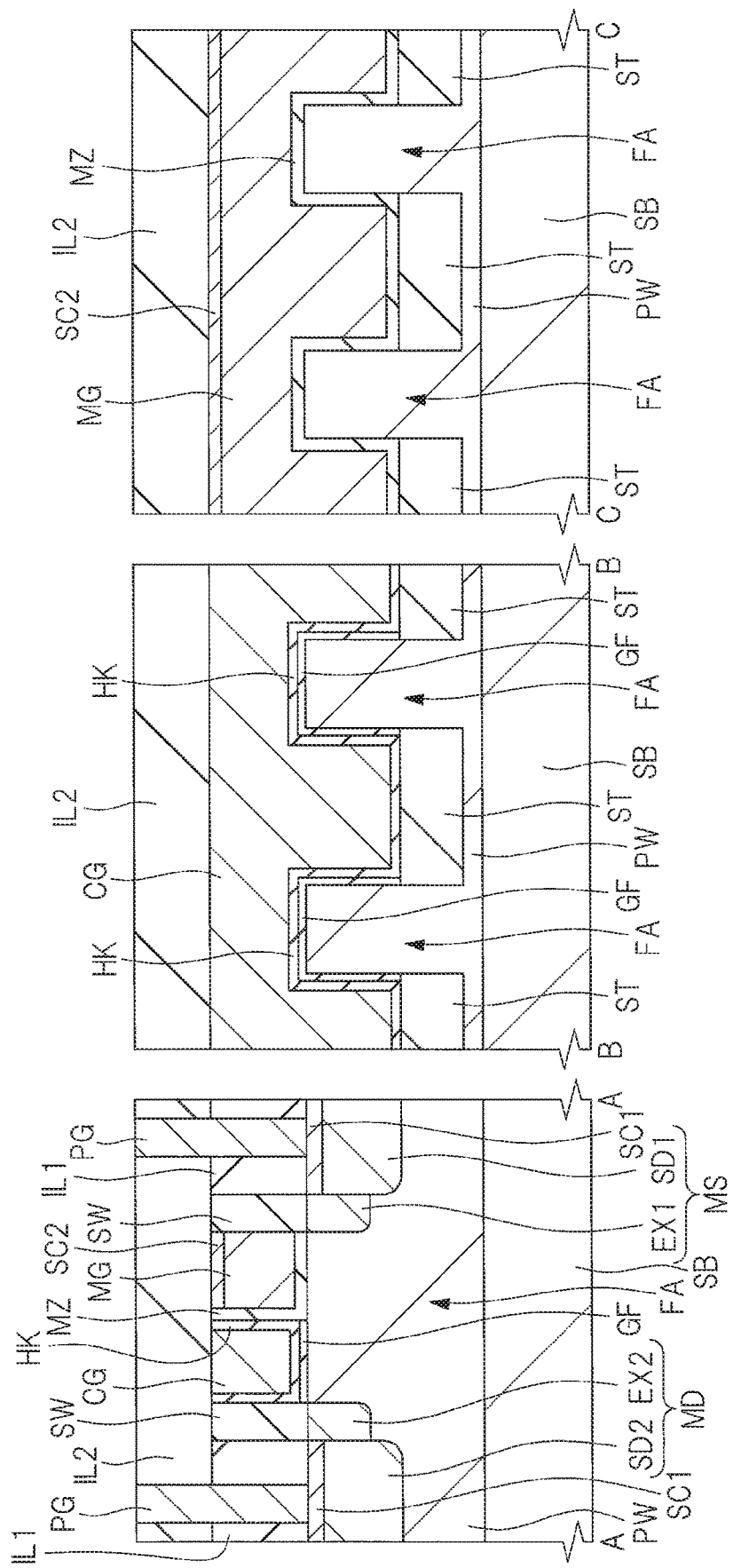
FIG. 33 is a cross-sectional view showing the principal part in the manufacturing process of the semiconductor device continued from FIG. 32.

Next, as shown in FIG. 33, the interlayer insulating films IL2 and IL1 are dry-etched with using a photoresist pattern (not shown) formed on the interlayer insulating film IL2 by the photolithography technique as an etching mask, thereby forming contact holes (through holes). Then, the conductive plug PG made of tungsten (W) or the like is formed as a connection conductor portion in each of the contact holes.

For example, the plug PG can be formed by sequentially forming a barrier conductor film and a tungsten film on the interlayer insulating film IL2 including the inside (bottom surface and the side wall) of the contact hole so as to fill the contact hole, and then removing unnecessary tungsten film and barrier conductor film outside the contact hole by the CMP method or the etch-back method. The plug PG is formed on each of the $n^+$ type semiconductor regions SD1 and SD2, the control gate electrode CG, the memory gate electrode MG and others.

Figure 34:
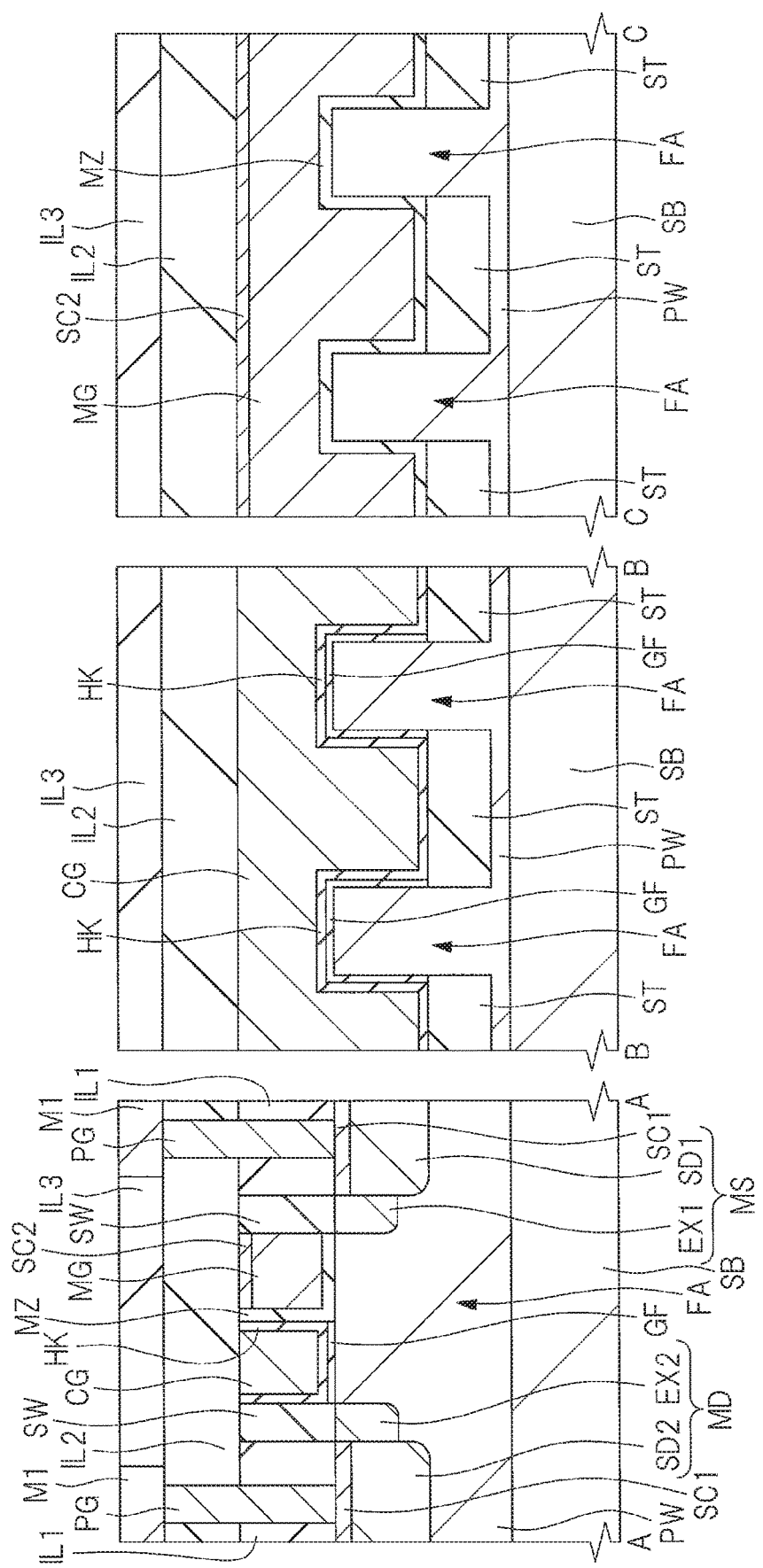
FIG. 34 is a cross-sectional view showing the principal part in the manufacturing process of the semiconductor device continued from FIG. 33.

Next, as shown in FIG. 34, the insulating film IL3 is formed on the interlayer insulating film IL2 in which the plugs PG have been buried. Then, after a wiring trench is formed in a predetermined region of the insulating film IL3, the wiring M1 is buried in the wiring trench by using the single damascene technique. The wiring M1 is, for example, a copper wiring (buried copper wiring) containing copper as a main component. The wiring M1 is electrically connected to each of the $n^+$ type semiconductor region SD1, the $n^+$ type semiconductor region SD2, the memory gate electrode MG, the control gate electrode CG, and others through the plug PG.

Thereafter, the wirings of the second and subsequent layers are formed by the dual damascene method or the like, but the illustration and description thereof are omitted here. In addition, the wiring M1 and the wirings in the upper layers are not limited to damascene wirings and can be formed by patterning the conductive films for wiring, and a tungsten wiring, an aluminum wiring or the like may be used for the wirings.

In the manner described above, the semiconductor device according to the present embodiment is manufactured.

In the present embodiment, the memory gate electrode MG is formed of a p type silicon film, and the dummy control gate electrode DG is formed of an n type silicon film. This is for the purpose of selectively etching the dummy control gate electrode DG while suppressing or preventing the memory gate electrode MG from being etched in the etching process of FIG. 27. This will be described below with reference to FIG. 35.

Figure 35:
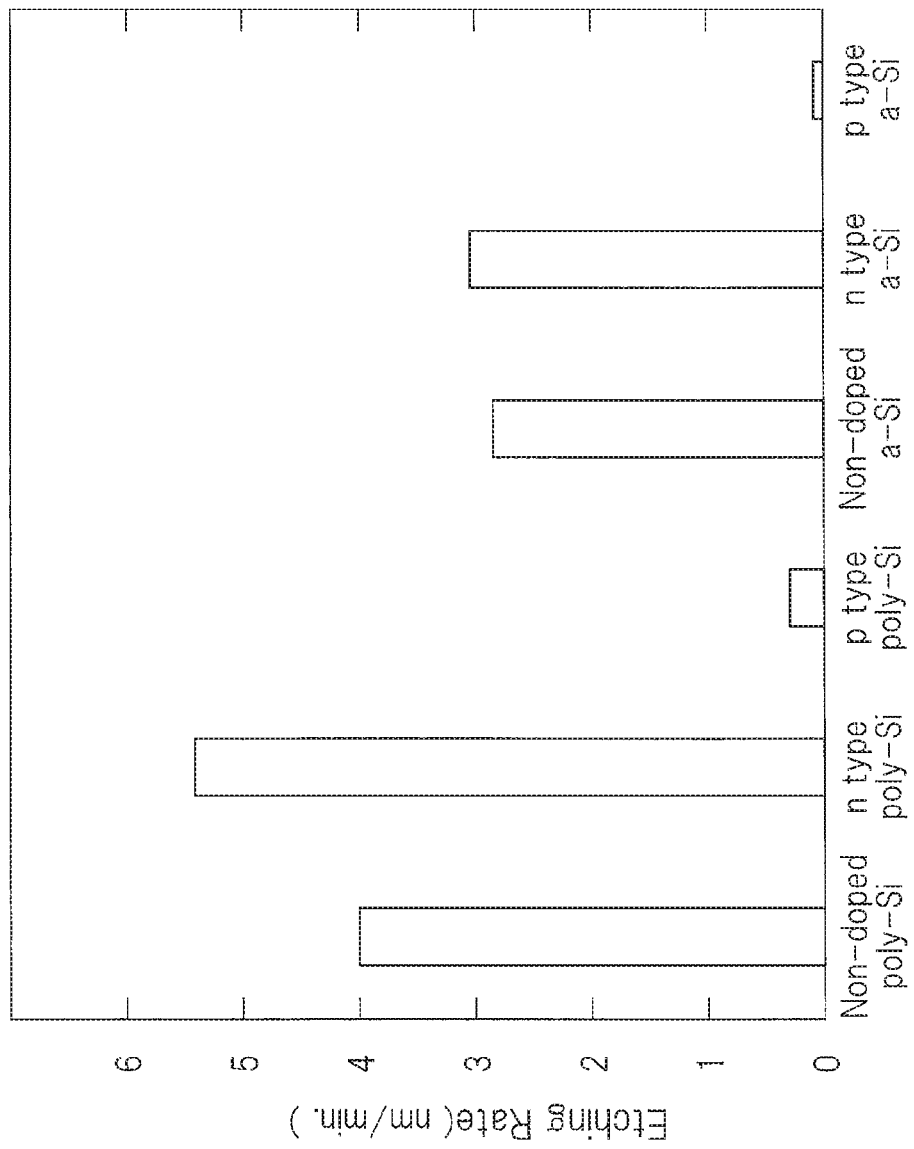
FIG. 35 is a graph showing etching rates of various kinds of silicon films.

FIG. 35 is a graph showing etching rates of various kinds of silicon films. FIG. 35 shows the etching rates of a non-doped polysilicon film, an n type polysilicon film, a p type polysilicon film, a non-doped amorphous silicon film, an n type amorphous silicon film, and a p type amorphous silicon film from the left of the graph. The case where an alkaline chemical solution (for example, ammonia water) is used as an etching solution is shown here. However, since absolute values of the etching rates depend also on the density of the etching solution, the graph of FIG. 35 should be used for relatively comparing the etching rates of the various kinds of silicon films. In addition, in the graph of FIG. 35, "poly-Si" indicates a polysilicon film and "a-Si" indicates an amorphous silicon film.

In the graph of FIG. 35, the p type polysilicon film has an etching rate much lower than those of the non-doped polysilicon film and the n type polysilicon film, and the p type amorphous silicon film has an etching rate much lower than those of the non-doped amorphous silicon film and then type amorphous silicon film. Namely, it can be seen that the etching rate of the p type silicon film can be sufficiently lowered in comparison with each of the etching rates of the non-doped silicon film and the n type silicon film.

For this reason, in the present embodiment, the memory gate electrode MG is formed of a p type silicon film and the dummy control gate electrode DG is formed of an n type silicon film at the stage of performing the etching process of FIG. 27. Accordingly, in the etching process of FIG. 27, it is possible to selectively etch and remove the dummy control gate electrode DG made of an n type silicon film while suppressing or preventing the memory gate electrode MG made of a p type silicon film from being etched, when the etching is performed in the state where both of the dummy control gate electrode DG and the memory gate electrode MG are exposed.

Note that, as is apparent from the graph of FIG. 35, the etching rate of the p type silicon film can be sufficiently lowered in comparison with the etching rate of the non-doped silicon film. Therefore, it is also possible to form the dummy control gate electrode DG from a non-doped (undoped) silicon film as a modification example of the present embodiment. Namely, by forming the silicon film PS1 as a non-doped silicon film and thereafter preventing an impurity from being implanted into the silicon film PS1 (dummy control gate electrode DG) as much as possible, the state where the memory gate electrode MG is formed of a p type silicon film and the dummy control gate electrode DG is formed of a non-doped silicon film can be achieved at the stage of performing the etching process of FIG. 27. Also in this case, in the etching process of FIG. 27, it is possible to selectively etch and remove the dummy control gate electrode DG made of a non-doped silicon film while suppressing or preventing the memory gate electrode MG made of a p type silicon film from being etched, when the etching is performed in the state where both of the dummy control gate electrode DG and the memory gate electrode MG are exposed.

However, the case where the dummy control gate electrode DG is formed of an n type silicon film is more preferable than the case where the dummy control gate electrode DG is formed of a non-doped silicon film. This is because the difference between the etching rates of an n type silicon film and a p type silicon film is larger than the difference between the etching rates of a non-doped silicon film and a p type silicon film as shown in the graph of FIG. 35. For this reason, although the dummy control gate electrode DG may be formed of a non-doped silicon film or an n type silicon film, it is more preferable to form the dummy control gate electrode DG from an n type silicon film. As a result, the etching selectivity of the dummy control gate electrode DG to the memory gate electrode MG can be more increased in the etching process of FIG. 27, and the dummy control gate electrode DG can be removed more reliably while properly suppressing and preventing the memory gate electrode MG from being etched.

Further, in the case where the dummy control gate electrode DG is formed of an n type silicon film, the dummy control gate electrode DG can maintain the state of being made of n type silicon even when a small amount of p type impurity is unintentionally introduced into the dummy control gate electrode DG, and it is possible to easily secure the high etching selectivity of the dummy control gate electrode DG to the memory gate electrode MG. Thus, the management of the manufacturing process becomes easy. Also from this point, it is more preferable that the dummy control gate electrode DG is formed (constituted) of an n type silicon film.

<Operation of Non-Volatile Memory>

Next, an operation example of a non-volatile memory will be described with reference to FIG. 36.

FIG. 36 is a table showing an example of application conditions of voltages to each part of a selection memory cell at the time of "write", "erase" and "read" according to the present embodiment. The table of FIG. 36 shows a voltage Vmg, a voltage Vs, a voltage Vcg, and a voltage Vd, which are respectively applied to the memory gate electrode MG, the source region (semiconductor region MS), the control gate electrode CG, and the drain region (semiconductor region MD) of the selected memory cell MC at the time of "write", "erase", and "read". Note that the table of FIG. 36 shows a preferable example of the application conditions of the voltages, and the present invention is not limited thereto, and various modifications can be made if necessary. In addition, the injection of electrons into the insulating film MZ2 which is the charge accumulating portion in the insulating film MZ of the memory transistor is defined as the "write", and the injection of holes into the insulating film MZ2 is defined as the "erase" in the present embodiment.

In the table of FIG. 36, the row A corresponds to the case where the writing method is the SSI method and the erasing method is the BTBT method, the row B corresponds to the case where the writing method is the SSI method and the erasing method is the FN method, the row C corresponds to the case where the writing method is the FN method and the erasing method is the BTBT method, and the row D correspond to the case where the writing method is the FN method and the erasing method is the FN method.

As the writing method, a writing method in which the write is performed by injecting hot electrons by the source side injection referred to as a so-called SSI method and a writing method in which the write is performed by Fowler Nordheim tunneling referred to as a so-called FN method can be used.

In the write by the SSI method, the write is performed by applying the voltages shown as "write operation voltage" in the row A or the row B in the table of FIG. 36 to each part of the selection memory cell to perform the write, thereby injecting electrons into the insulating film MZ2 in the insulating film MZ of the selection memory cell. At this time, hot electrons are generated in a channel region (between a source and a drain) below the region between the memory gate electrode MG and the control gate electrode CG, and the hot electrons are injected into the insulating film MZ2 which is the charge accumulating portion in the insulating film MZ below the memory gate electrode MG. The injected hot electrons are captured at a trap level in the insulating film MZ2, so that a threshold voltage of the memory transistor increases. Namely, the memory transistor is turned into a write state.

In the write by the FN method, the write is performed by applying the voltages shown as "write operation voltage" in the row C or the row D in the table of FIG. 36 to each part of the selection memory cell to perform the write, thereby tunneling electrons from the memory gate electrode MG and injecting the electrons into the insulating film MZ2 in the insulating film MZ in the selection memory cell. At this time, electrons are injected into the insulating film MZ by tunneling through the insulating film MZ3 by the FN tunneling effect from the memory gate electrode MG and are captured at a trap level in the insulating film MZ2, so that a threshold voltage of the memory transistor increases. Namely, the memory transistor is turned into a write state.

As the erasing method, an erasing method in which the erase is performed by injecting hot holes by the band-to-band tunneling phenomenon referred to as a so-called BTBT method and an erasing method in which the erase is performed by Fowler Nordheim tunneling referred to as a so-called FN method can be used.

In the erase by the BTBT method, the erase is performed by injecting the holes generated by the BTBT into the insulating film MZ2 in the insulating film MZ from the side of the fin FA. For example, the voltages shown as "erase operation voltage" in the row A or the row C in the table of FIG. 36 are applied to each part of the selection memory cell to perform the erase. Thus, holes are generated by the BTBT phenomenon and accelerated by an electric field, so that the holes are injected into the insulating film MZ2 in the insulating film MZ of the selection memory cell, thereby decreasing the threshold voltage of the memory transistor. Namely, the memory transistor is turned into an erase state.

In the erase by the FN method, the erase is performed by applying the voltages shown as "erase operation voltage" in the row B or the row D in the table of FIG. 36 to each part of the selection memory cell to perform the erase, thereby tunneling holes from the memory gate electrode MG and injecting the holes into the insulating film MZ2 in the insulating film MZ in the selection memory cell. At this time, holes are injected into the insulating film MZ by tunneling through the insulating film MZ3 by the FN tunneling effect from the memory gate electrode MG and are captured at a trap level in the insulating film MZ2, so that the threshold voltage of the memory transistor decreases. Namely, the memory transistor is turned into an erase state.

At the time of read, for example, the voltages shown as "read operation voltage" in the row A, the row B, the row C or the row D in the table of FIG. 36 are applied to each part of the selection memory cell to perform the read. By setting the voltage Vmg, which is applied to the memory gate electrode MG at the time of read, to be a value between the threshold voltage of the memory transistor in the write state and the threshold voltage of the memory transistor in the erase state, it is possible to determine the write state or the erase state.

<Background of Examination>

The inventor of the present invention has examined the split gate memory cell. Of the memory gate electrode (corresponding to the memory gate electrode MG) and the control gate electrode (corresponding to the control gate electrode CG) constituting the split gate memory cell, a metal gate electrode is applied as the control gate electrode, so that it is possible to achieve the advantages that the depletion of the control gate electrode is suppressed and the parasitic capacitance can be eliminated. Further, it is also possible to achieve the advantage that the short channel effect caused when the gate length of the control gate electrode is shortened can be improved. In addition, it is possible to adjust the threshold voltage of the control transistor depending on the selection of the materials of the metal gate electrode and the high dielectric constant gate insulating film.

On the other hand, it is sometimes desirable that the metal gate electrode is not applied to the memory gate electrode from the viewpoints of functionality and reliability. For example, higher reliability is required in the memory transistor compared with that in the control transistor, and the reliability can be easily ensured in the silicon gate electrode, which has been used for many years, than in the metal gate electrode. In addition, when the FN method is used for the erase of the memory cell, it is desirable that the memory gate electrode is formed of the silicon gate electrode instead of the metal gate electrode from the viewpoint of hole generation efficiency, and the p type silicon gate electrode is more preferable.

For this reason, the inventor of the present invention has examined the case where the metal gate electrode is applied as the control gate electrode while the silicon gate electrode is applied as the memory gate electrode instead of the metal gate electrode. The semiconductor device having the memory cell like this can be manufactured by forming the control gate electrode, to which the metal gate electrode is applied, by the so-called gate last process and forming the memory gate electrode, to which the metal gate electrode is not applied, by the so-called gate first process. In the gate first process, the gate electrode used in a complete product is first formed, and then the semiconductor regions for source and drain are formed. On the other hand, in the gate last process, after the dummy gate electrode is once formed, the semiconductor regions for source and drain are formed, and then the dummy gate electrode is removed and the actual gate electrode used in a complete product is formed in the removed region. Namely, the gate last process includes the process of removing the dummy gate electrode to replace it with the gate electrode used in actual.

Therefore, in the case where the memory gate electrode to which the metal gate electrode is not applied is formed by the gate first process and the control gate electrode to which the metal gate electrode is applied is formed by the gate last process, it is necessary to remove the dummy control gate electrode to replace it with the control gate electrode used in actual. It is necessary to prevent the memory gate electrode from being removed when the dummy control gate electrode is removed. Thus, if the manufacturing process is not devised, the management of the manufacturing process becomes difficult, and it becomes difficult to perform the manufacturing process of the semiconductor device. When the management of the manufacturing process becomes difficult and it becomes difficult to perform the manufacturing process of the semiconductor device, the manufacturing yield of the semiconductor device is decreased, and the manufacturing cost of the semiconductor device is increased.

<Main Characteristics and Effects>

In the present embodiment, of the memory gate electrode MG and the control gate electrode CG constituting the memory cell, the memory gate electrode MG is formed by the so-called gate first process and the control gate electrode CG is formed by the so-called gate last process.

Therefore, the manufacturing process of the semiconductor device according to the present embodiment includes the process of forming the dummy control gate electrode DG on the semiconductor substrate SB (fin FA) via the insulating film GF (first insulating film) (process of FIGS. 12 to 14) and the process of forming the memory gate electrode MG (first gate electrode) on the semiconductor substrate SB (fin FA) via the insulating film MZ (second insulating film) so as to be adjacent to the dummy control gate electrode DG (process of FIGS. 15 to 22). Note that the insulating film MZ is an insulating film having a charge accumulating portion therein. The manufacturing process of the semiconductor device according to the present embodiment further includes the process of forming the interlayer insulating film IL1 (first interlayer insulating film) so as to cover the dummy control gate electrode DG and the memory gate electrode MG (process of FIG. 25) and the process of polishing the interlayer insulating film IL1 to expose the dummy control gate electrode DG and the memory gate electrode MG (polishing process of FIG. 26). The manufacturing process of the semiconductor device according to the present embodiment further includes the process of removing the dummy control gate electrode DG by etching (etching process of FIG. 27) and the process of forming the control gate electrode CG (second gate electrode) in the trench TR (first trench) which is the region from which the dummy control gate electrode DG has been removed (process of FIGS. 28 to 30).

Note that the fin FA is a part of the semiconductor substrate SB, and function as an active region of the semiconductor substrate SB. Therefore, the formation of the dummy control gate electrode DG on the fin FA via the insulating film GF corresponds to the formation of the dummy control gate electrode DG on the semiconductor substrate SB via the insulating film GF, and the formation of the memory gate electrode MG on the fin FA via the insulating film MZ corresponds to the formation of the memory gate electrode MG on the semiconductor substrate SB via the insulating film MZ.

One of the main characteristics of the manufacturing process of the semiconductor device according to the present embodiment is that the memory gate electrode MG is made of a p type silicon film and the dummy control gate electrode DG is made of a non-doped or n type silicon film (n type silicon film is more preferable). Another one of the main characteristics of the manufacturing process of the semiconductor device according to the present embodiment is that, in the process of removing the dummy control gate electrode DG (etching process of FIG. 27), the dummy control gate electrode DG is removed by performing the etching under the condition that the memory gate electrode MG is less likely to be etched compared with the dummy control gate electrode DG, in the state where the dummy control gate electrode DG and the memory gate electrode MG are exposed.

As a result, since it is possible to reliably suppress or prevent the memory gate electrode MG from being etched when the dummy control gate electrode DG is removed by etching, the manufacturing yield of the semiconductor device can be improved. It is also effective for the improvement of the manufacturing yield of the semiconductor device that the dummy control gate electrode DG can be removed by etching in the state where the dummy control gate electrode DG and the memory gate electrode MG are exposed. Accordingly, it is possible to reduce the manufacturing cost of the semiconductor device. In addition, since it is possible to prevent the etching residue of the dummy control gate electrode DG and the excessive etching to the memory gate electrode MG, the reliability of the manufactured semiconductor device can be improved. Hereinafter, this will be specifically described with reference to an examination example.

Figure 37:
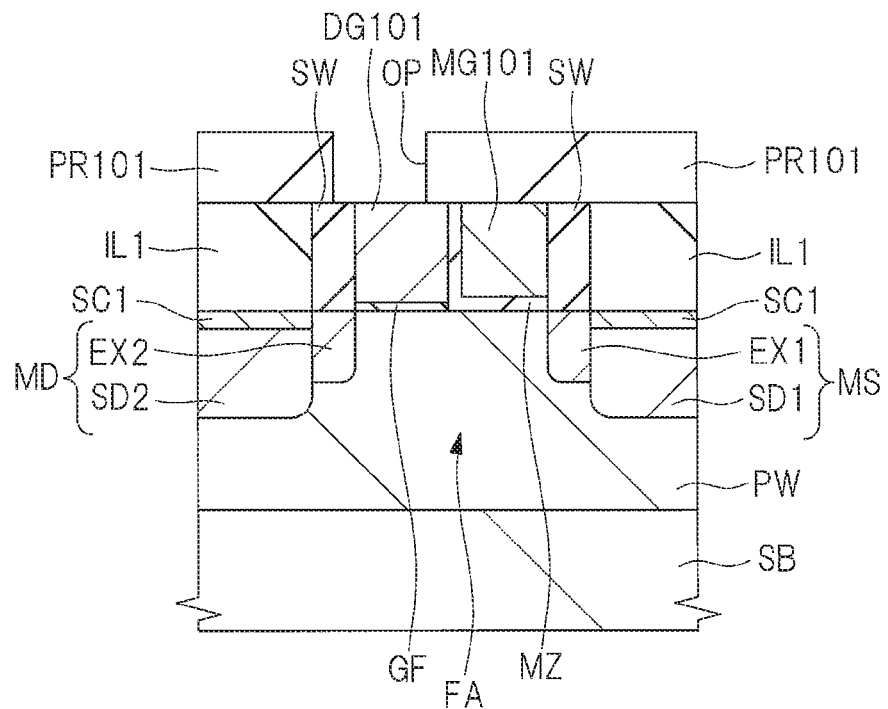
FIG. 37 is a cross-sectional view showing the principal part in a manufacturing process of a semiconductor device according to an examination example.
Figure 38:
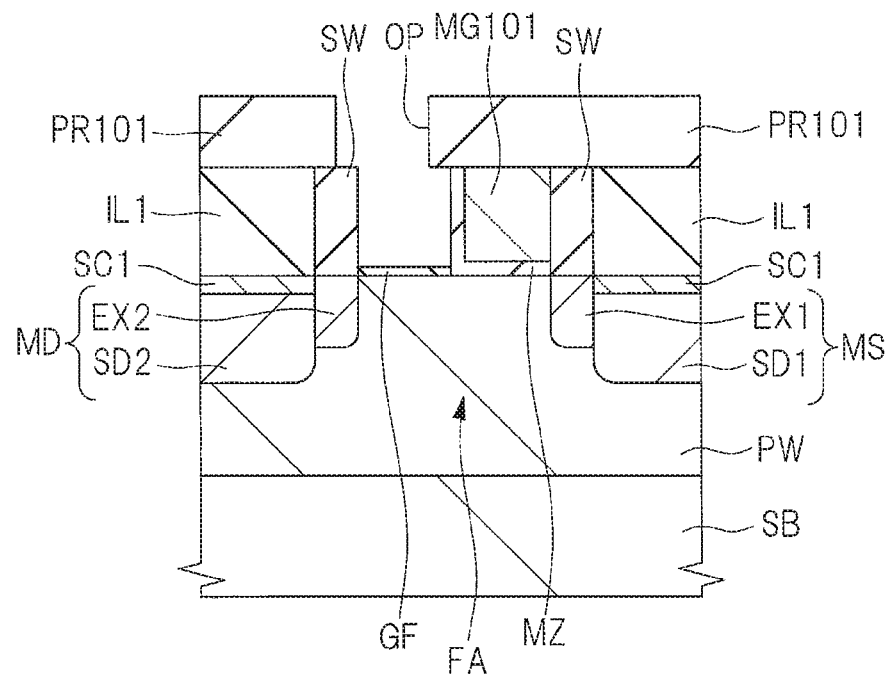
FIG. 38 is a cross-sectional view showing the principal part in the manufacturing process of the semiconductor device according to the examination example continued from FIG. 37.

FIG. 37 and FIG. 38 are cross-sectional views each showing the principal part in a manufacturing process of a semiconductor device according to an examination example examined by the inventor of the present invention, and are cross-sectional views at the position corresponding to the line A-A of FIG. 1. The process stage shown in FIG. 37 corresponds to FIG. 26 described above, and the stage immediately before a dummy control gate electrode DG101 is removed is shown. The process stage shown in FIG. 38 corresponds to FIG. 27 described above, and the stage immediately after the dummy control gate electrode DG101 is removed is shown.

The dummy control gate electrode DG101 shown in FIG. 37 corresponds to the dummy control gate electrode DG of the present embodiment, and a memory gate electrode MG101 shown in FIGS. 37 and 38 corresponds to the memory gate electrode MG of the present embodiment. However, unlike the present embodiment, the dummy control gate electrode DG101 and the memory gate electrode MG101 are made of silicon films of the same conductivity type, and specifically are made of n type polysilicon films in the examination example shown in FIGS. 37 and 38. Further, in the case of the examination example, as shown in FIGS. 37 and 38, it is necessary to selectively remove the dummy control gate electrode DG101 by etching with using a photoresist pattern PR101 having an opening OP, which exposes the dummy control gate electrode DG101 but does not expose the memory gate electrode MG101, as an etching mask. In this manner, it is possible to remove the dummy control gate electrode DG101 exposed through the opening OP of the photoresist pattern PR101 by etching, and to prevent the memory gate electrode MG101 from being etched because it is covered with the photoresist pattern PR101.

However, when the photoresist pattern is formed by using the photolithography technique, the formation position of the photoresist pattern deviates from the design position due to misalignment of the photomask or the like in some cases.

Figure 39:
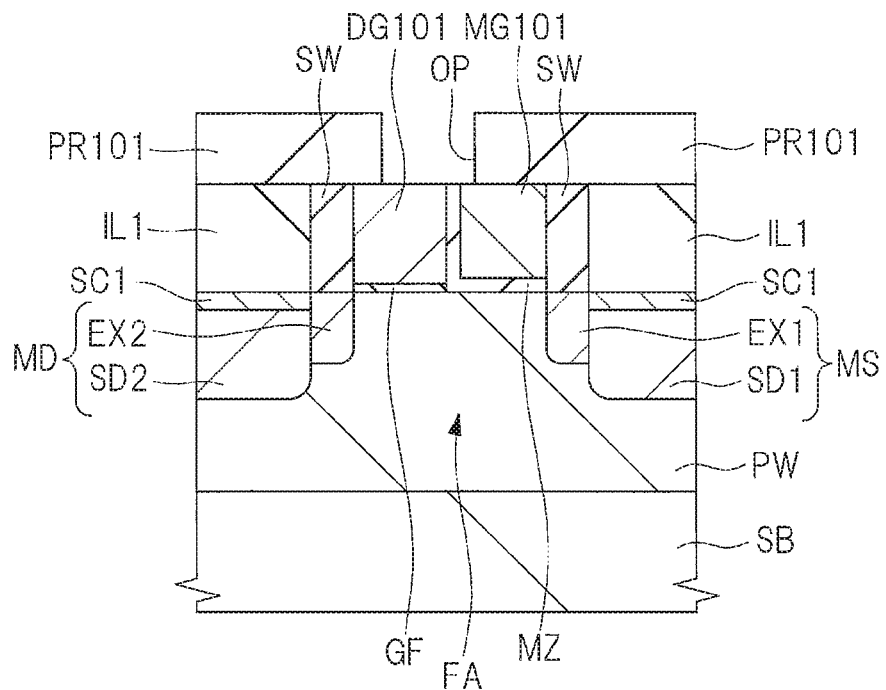
FIG. 39 is a cross-sectional view showing the principal part in the manufacturing process of the semiconductor device according to the examination example.
Figure 40:
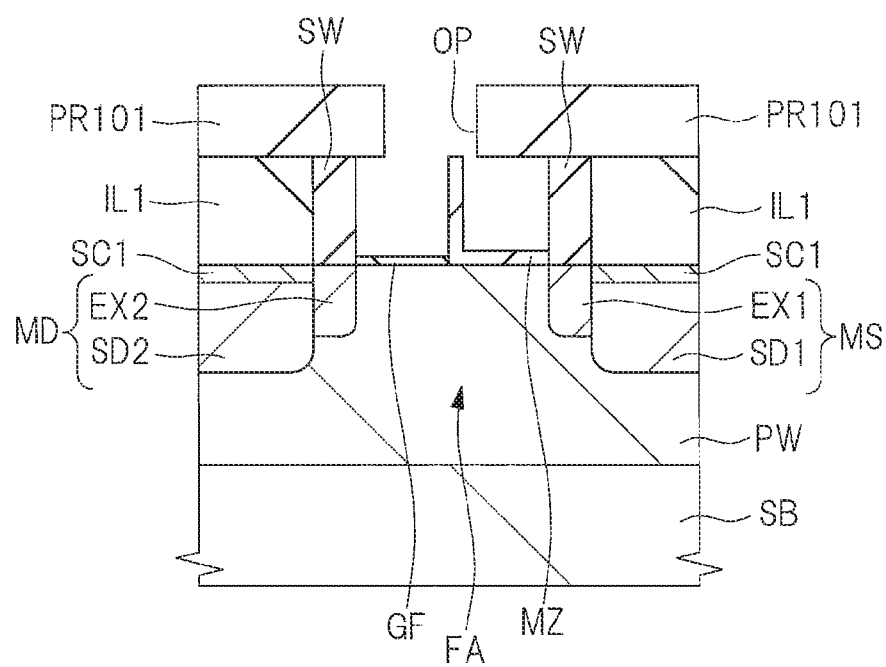
FIG. 40 is a cross-sectional view showing the principal part in the manufacturing process of the semiconductor device according to the examination example continued from FIG. 39.

FIG. 39 and FIG. 40 are also cross-sectional views each showing the principal part in the manufacturing process of the semiconductor device according to the examination example, and the process stages corresponding to FIGS. 37 and 38 are shown in FIGS. 39 and 40, respectively. Specifically, FIGS. 39 and 40 correspond to the case where the formation position of the photoresist pattern PR101 is shifted to the right side in the figures in the examination example shown in FIGS. 37 and 38.

When the formation position of the photoresist pattern PR101 is shifted to the right side in FIG. 37, there is the possibility that not only the dummy control gate electrode DG101 but also the memory gate electrode MG101 is exposed through the opening OP of the photoresist pattern PR101 as shown in FIG. 39. If the etching is performed in the state of FIG. 39, not only the dummy control gate electrode DG101 but also the memory gate electrode MG101 is removed by the etching as shown in FIG. 40. This is because, since the memory gate electrode MG101 and the dummy control gate electrode DG101 are made of the silicon films of the same conductive type (n type), not only the dummy control gate electrode DG101 but also the memory gate electrode MG101 is etched if not only the dummy control gate electrode DG101 but also the memory gate electrode MG101 is exposed through the opening OP of the photoresist pattern PR101.

Figure 41:
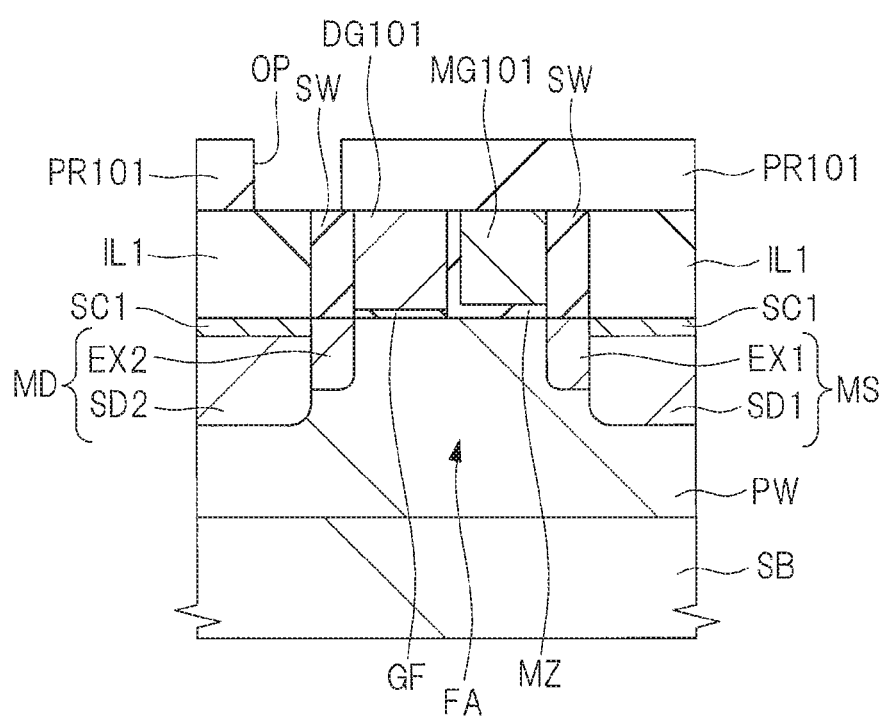
FIG. 41 is a cross-sectional view showing the principal part in the manufacturing process of the semiconductor device according to the examination example.

In order to prevent the memory gate electrode MG101 from being exposed through the opening OP of the photoresist pattern PR101 even when the formation position of the photoresist pattern PR101 is shifted, it is necessary to separate the opening OP of the photoresist pattern PR101 from the memory gate electrode MG101 to some extent. In such a case, however, when the formation position of the photoresist pattern PR101 is shifted to the left side in FIG. 37, there is the possibility that not only the memory gate electrode MG101 but also the dummy control gate electrode DG101 is not exposed through the opening OP of the photoresist pattern PR101 as shown in FIG. 41. FIG. 41 is also a cross-sectional view showing the principal part in the manufacturing process of the semiconductor device according to the examination example, and the process stage corresponding to FIG. 37 is shown in FIG. 41. Specifically, FIG. 41 corresponds to the case where the formation position of the photoresist pattern PR101 is shifted to the left side in the figure in the examination example shown in FIG. 37.

When not only the memory gate electrode MG101 but also the dummy control gate electrode DG101 is not exposed through the opening OP of the photoresist pattern PR101 as shown in FIG. 41, the dummy control gate electrode DG101 is not etched and removed even when the etching process is performed. Therefore, the structure of FIG. 41 is maintained even when the etching process is finished, and not only the memory gate electrode MG101 but also the dummy control gate electrode DG101 is left.

As described above, in the case of the examination example, since the memory gate electrode MG101 and the dummy control gate electrode DG101 are made of silicon films of the same conductivity type, it is not permitted to perform the etching process of the dummy control gate electrode DG101 in a state where both of the memory gate electrode MG101 and the dummy control gate electrode DG101 are exposed, and thus various restrictions occur. For this reason, since the management of the manufacturing process becomes difficult and it becomes difficult to perform the manufacturing process of the semiconductor device, the manufacturing yield of the semiconductor device is decreased, and the manufacturing cost of the semiconductor device is increased.

Meanwhile, in the present embodiment, the memory gate electrode MG is formed of a p type silicon film, and the dummy control gate electrode DG is formed of a non-doped or n type silicon film (n type silicon film is more preferable). A non-doped or n type silicon film and a p type silicon film have different etching rates for the same etching solution, and it is possible to selectively etch the non-doped or n type silicon film while suppressing the etching of the p type silicon film depending on the selected etching solution. In the present embodiment, since the etching is performed under the condition that the memory gate electrode MG made of a non-doped or n type silicon film is less likely to be etched compared with the dummy control gate electrode DG made of a p type silicon film, the dummy control gate electrode DG can be selectively removed by the etching even when the etching is performed in the state where both of the dummy control gate electrode DG and the memory gate electrode MG are exposed. Accordingly, it is possible to properly remove the dummy control gate electrode DG and also to reliably suppress or prevent the memory gate electrode MG from being etched.

In the present embodiment, since the dummy control gate electrode DG is removed by the etching in the state where both of the memory gate electrode MG and the dummy control gate electrode DG are exposed, it is not necessary to form the photoresist pattern that exposes the dummy control gate electrode DG and covers the memory gate electrode MG (corresponding to the photoresist pattern PR101 described above). Thus, problems due to the deviation of the formation position of the photoresist pattern PR101 described above in relation to the examination example are not caused, and the restrictions associated with the selective removal of the dummy control gate electrode DG do not occur. Therefore, in the present embodiment, the management of the manufacturing process becomes easy, and it becomes easy to perform the manufacturing process of the semiconductor device. Accordingly, the manufacturing yield of the semiconductor device can be improved, and the manufacturing cost of the semiconductor device can be reduced. In addition, in the present embodiment, since it is not necessary to form what corresponds to the photoresist pattern PR101 described above, the number of manufacturing processes of the semiconductor device can be reduced, and this also contributes to the reduction of the manufacturing cost of the semiconductor device. Further, since it is possible to prevent the etching residue of the dummy control gate electrode DG and the excessive etching to the memory gate electrode MG, the reliability of the manufactured semiconductor device can be improved.

Further, in the present embodiment, since it is not necessary to form what corresponds to the photoresist pattern PR101 described above, the etching process of FIG. 27 can be performed in the state where the entire upper surface of the dummy control gate electrode DG is exposed. Therefore, since the exposed area of the dummy control gate electrode DG can be increased in the etching process of FIG. 27, the occurrence of the etching residue of the dummy control gate electrode DG can be easily prevented in the etching process of FIG. 27. From this viewpoint, the management of the etching process of FIG. 27 becomes easy, and the etching process of FIG. 27 can be easily performed. As a result, the manufacturing yield of the semiconductor device can be improved, and the manufacturing cost of the semiconductor device can be reduced.

In addition, the dummy control gate electrode DG is selectively etched in the etching process of FIG. 27, but it is preferable to prevent not only the memory gate electrode MG but also respective exposed insulating films from being etched as much as possible. Specifically, it is preferable that the etching process of FIG. 27 is performed under the condition that the memory gate electrode MG, the insulating film GF, the insulating film MZ, the sidewall spacer SW, and the interlayer insulating film IL1 are less likely to be etched compared with the dummy control gate electrode DG. Accordingly, in the etching process of FIG. 27, the dummy control gate electrode DG can be etched reliably while suppressing or preventing the memory gate electrode MG, the insulating film GF, the insulating film MZ, the sidewall spacer SW, and the interlayer insulating film IL1 from being etched. Therefore, it is desirable that the dummy control gate electrode DG has etching selectivity not only to the memory gate electrode MG but also to the respective insulating films. A non-doped or n type silicon film has etching selectivity not only to a p type silicon film but also to respective insulating films (for example, silicon oxide film and silicon nitride film). Thus, if the memory gate electrode MG is formed of a p type silicon film and the dummy control gate electrode DG is formed of a non-doped or n type silicon film like in the present embodiment, inevitably, the dummy control gate electrode DG can have the etching selectivity to the various insulating films. As a result, in the etching process of FIG. 27, it is possible to reliably remove the dummy control gate electrode DG and it is also possible to suppress or prevent the exposed insulating films (in this case, the insulating film GF, the insulating film MZ, the sidewall spacer SW, and the interlayer insulating film IL1) from unnecessarily being etched. For this reason, from the viewpoint of not only preventing the memory gate electrode MG from being etched in the etching process of FIG. 27 but also preventing the exposed insulating films from being etched, a non-doped or n type silicon film is particularly preferable as a material constituting the dummy control gate electrode DG.

At the stage immediately before the etching process of FIG. 27 is performed, it is necessary that the dummy control gate electrode DG is made of a non-doped or n type silicon film and the memory gate electrode MG is made of a p type silicon film. Therefore, it is desirable that the implantation of an n type impurity into the memory gate electrode MG before performing the etching process of FIG. 27 is prevented as much as possible. Thus, it is preferable that the ion implantation for forming the n$^-$ type semiconductor regions EX1 and EX2 and the ion implantation for forming n$^+$ type semiconductor regions SD1 and SD2 are performed in the state where the cap insulating film CP2 is formed on the memory gate electrode MG. In this manner, it is possible to prevent the n type impurity from being implanted into the memory gate electrode MG in the ion implantation for forming the n$^-$ type semiconductor regions EX1 and EX2 and the ion implantation for forming n$^+$ type semiconductor regions SD1 and SD2. Therefore, it is possible to prevent fluctuation in the effective p type impurity concentration of the memory gate electrode MG made of a p type silicon film, and it is possible to reliably prevent unintentional etching of the memory gate electrode MG in the etching process of FIG. 27.

Further, it is preferable to adopt the wet etching instead of the dry etching in the etching process of FIG. 27. By using the wet etching instead of the dry etching, the dummy control gate electrode DG can be removed by etching without damaging the underlying base (in this case, the insulating film GF and the fin FA) of the dummy control gate electrode DG.

Also, in the present embodiment, it is necessary to select the etching condition of the etching process of FIG. 27 such that the etching rate of the memory gate electrode MG made of a p type silicon film is lower than the etching rate of the dummy control gate electrode DG made of a non-doped or n type silicon film. Therefore, the etching solution with which the etching rate of a p type silicon film becomes lower than that of a non-doped or n type silicon film is preferably used in the etching process of FIG. 27.

Accordingly, ammonia water is preferably used in the etching process of FIG. 27. By the wet etching using ammonia water, the dummy control gate electrode DG made of a non-doped or n type silicon film can be selectively removed by etching while suppressing or preventing the memory gate electrode MG made of a p type silicon film from being etched, and it is possible to suppress or prevent the respective exposed insulating films from being etched.

Also, in the etching process of FIG. 27, it is also possible to first etch the surface (surface layer portion) of the dummy control gate electrode DG by wet etching using APM (Ammonia-Hydrogen Peroxide Mixture) and then remove the entire dummy control gate electrode DG by wet etching using ammonia water. Note that APM is the mixture solution of ammonia, hydrogen peroxide, and water. By performing the wet etching using APM first, a heterogeneous surface layer formed on the upper surface of the dummy control gate electrode DG can be reliably removed, and by the subsequent wet etching using ammonia water, the dummy control gate electrode DG can be removed by etching at a comparatively high etching rate. As a result, it is possible to more reliably prevent the occurrence of the etching residue of the dummy control gate electrode DG and to suppress the time required for the etching process of FIG. 27.

Note that the heterogeneous surface layer formed on the upper surface of the dummy control gate electrode DG is a surface layer which is formed on the upper surface of the dummy control gate electrode DG due to the polishing process of FIG. 26 and made of a heterogeneous material different from the inside of the dummy control gate electrode DG, and it may be formed due to adhesion of residues such as the polishing slurry used in the polishing process. Since the heterogeneous surface layer like this is more easily removed by APM than ammonia water, the heterogeneous surface layer formed on the upper surface of the dummy control gate electrode DG can be removed by performing the wet etching using APM first in the etching process of FIG. 27. However, since the etching rate of the dummy control gate electrode DG is low in the wet etching using APM, the wet etching using APM is switched to the wet etching using ammonia water to remove the entire dummy control gate electrode DG, thereby reducing the time required for the etching process of FIG. 27.

In addition, when the etching process of FIG. 27 is performed by the wet etching using APM and the subsequent wet etching using ammonium water, it is preferable that the wet etching using ammonia water is continuously performed without exposing the semiconductor wafer to be processed (semiconductor substrate SB) to the atmosphere after the wet etching using APM. As a result, since it is possible to prevent an unnecessary oxide film from being formed on the surface of the dummy control gate electrode DG between the wet etching process using APM and the wet etching process using ammonium water, it is possible to more reliably prevent the occurrence of the etching residue of the dummy control gate electrode DG. For example, the etching process of FIG. 27 can be performed by immersing the semiconductor wafer to be processed in a solution made of APM in a processing tank of a wet etching apparatus for a predetermined period of time and then replacing the solution in which the semiconductor wafer is immersed with ammonia water from APM and maintaining the state in which the semiconductor wafer is immersed in the solution made of ammonia water for a predetermined time.

Also, in the etching process of FIG. 27, it is also possible to first etch the surface (surface layer portion) of the dummy control gate electrode DG by wet etching using acid solution and then remove the entire dummy control gate electrode DG by wet etching using ammonia water. By performing the wet etching using acid solution first, a heterogeneous surface layer formed on the upper surface of the dummy control gate electrode DG can be reliably removed. As the acid solution mentioned above, hydrofluoric acid (diluted hydrofluoric acid), FPM (Hydrofluoric acid-Hydrogen Peroxide Mixture), hydrochloric acid (diluted hydrochloric acid) or HPM (Hydrochloric acid-Hydrogen Peroxide Mixture) can be preferably used. Note that HPM is the mixture solution of hydrochloric acid, hydrogen peroxide and water, and FPM is the mixture solution of hydrofluoric acid, hydrogen peroxide and water.

When the etching process of FIG. 27 is performed by the wet etching using acid solution and the subsequent wet etching using ammonium water, the semiconductor wafer to be processed (semiconductor substrate SB) is exposed to the atmosphere after the wet etching using acid solution and before the wet etching using ammonia water. This is because, since ammonia water is alkaline solution, the acid solution cannot be replaced with ammonia water in the state where the semiconductor wafer is immersed in the acid solution in the processing tank. Accordingly, from the viewpoint of preventing an unnecessary oxide film from being formed on the surface of the dummy control gate electrode DG, the wet etching using alkaline APM is more preferable than the wet etching using acid solution as the wet etching process performed before the wet etching process using ammonia water.

In addition, the memory gate electrode MG is made of a p type silicon film, and it is more preferable that the p type impurity concentration of the memory gate electrode MG is $1 \times 10^{20}/cm^3$ or higher. As a result, in the etching process of FIG. 27, the etching rate of the memory gate electrode MG can be sufficiently lowered, and it is possible to reliably suppress or prevent the memory gate electrode MG from being etched. Also, if the p type impurity concentration of the memory gate electrode MG is $1 \times 10^{20}/cm^3$ or higher, even when a small amount of n type impurity is unintentionally introduced into the memory gate electrode MG, the memory gate electrode MG can maintain the state of being constituted of the p type silicon, and the high etching selectivity of the dummy control gate electrode DG to the memory gate electrode MG can be easily secured.

Further, the dummy control gate electrode DG is preferably made of an n type silicon, and it is more preferable that the n type impurity concentration of the dummy control gate electrode DG is $1 \times 10^{20}/cm^3$ or higher. As a result, since the etching rate of the dummy control gate electrode DG can be accurately increased in the etching process of FIG. 27, it is possible to more reliably prevent the occurrence of the etching residue of the dummy control gate electrode DG. Also, if the n type impurity concentration of the dummy control gate electrode DG is $1 \times 10^{20}/cm^3$ or higher, even when a small amount of p type impurity is unintentionally introduced into the dummy control gate electrode DG, the dummy control gate electrode DG can maintain the state of being constituted of the n type silicon, and the high etching selectivity of the dummy control gate electrode DG to the memory gate electrode MG can be easily secured.

Second Embodiment

FIGS. 42 to 52 are cross-sectional views each showing the principal part in a manufacturing process of a semiconductor device according to the second embodiment. In the second embodiment, the difference from the above-described first embodiment will be mainly described, and repetitive descriptions of the same points as the first embodiment will be omitted.

Figure 42:
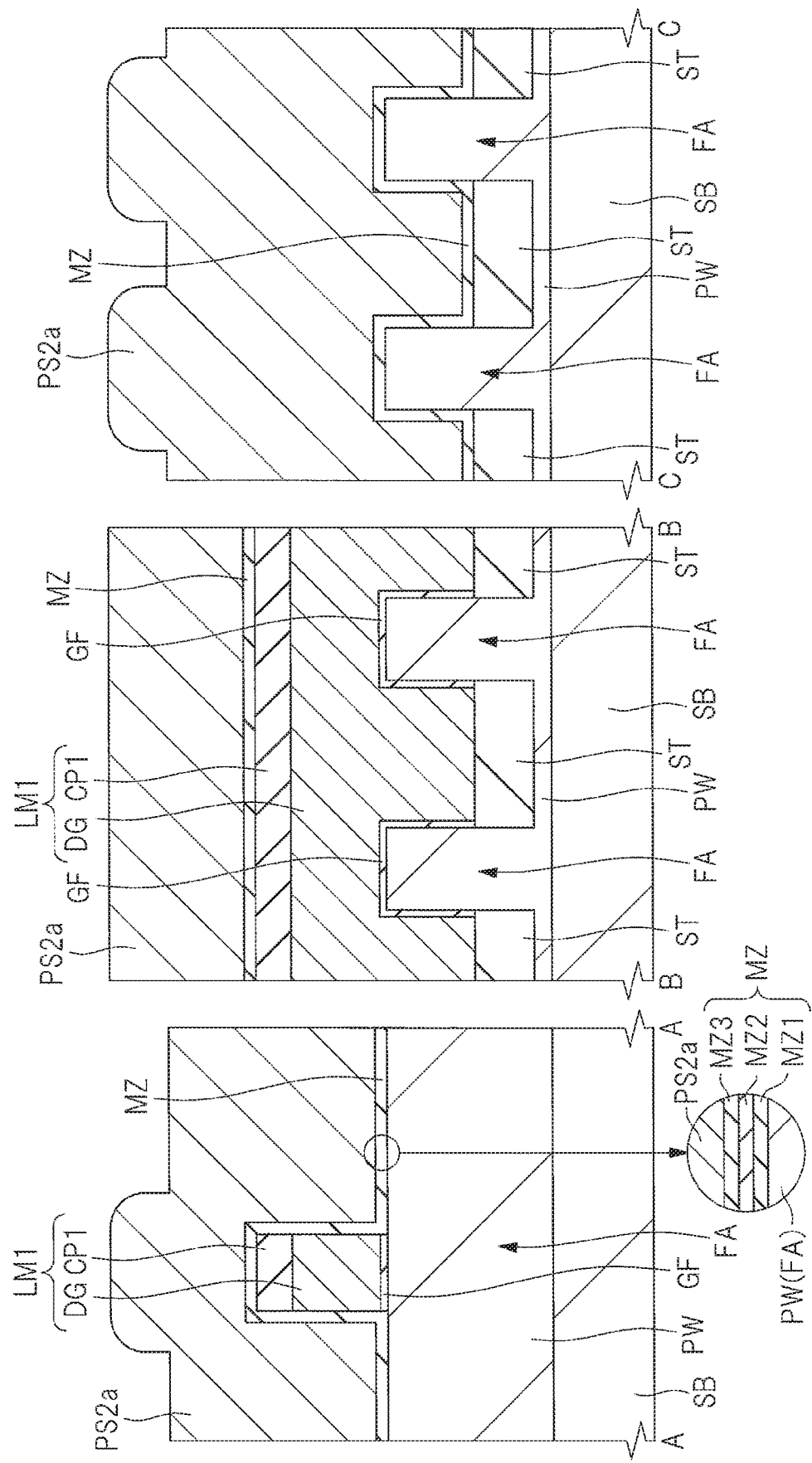
FIG. 42 is a cross-sectional view showing the principal part in a manufacturing process of a semiconductor device according to another embodiment.

The manufacturing process of the semiconductor device according to the second embodiment is the same as the manufacturing process according to the first embodiment until the process of forming the insulating film MZ. After the insulating film MZ is formed in the same manner as the first embodiment, a silicon film PS2a is formed (deposited) over the semiconductor substrate SB, that is, on the insulating film MZ so as to cover the stacked body LM1 as shown in FIG. 42 corresponding to FIG. 15 described above. The silicon film PS2a corresponds to the silicon film PS2 described above, is made of a polycrystalline silicon film, and can be formed by the CVD method or the like.

The silicon film PS2a is an n type silicon film into which an n type impurity has been introduced (doped polysilicon film). By using the gas containing doping gas (gas for adding an n type impurity) as the gas for forming the silicon film PS2a, an n type impurity can be introduced into the silicon film PS2a at the time of forming the silicon film PS2a. As another embodiment, it is also possible to introduce an n type impurity into the silicon film PS2a by ion implantation after forming the non-doped silicon film PS2a.

Figure 43:
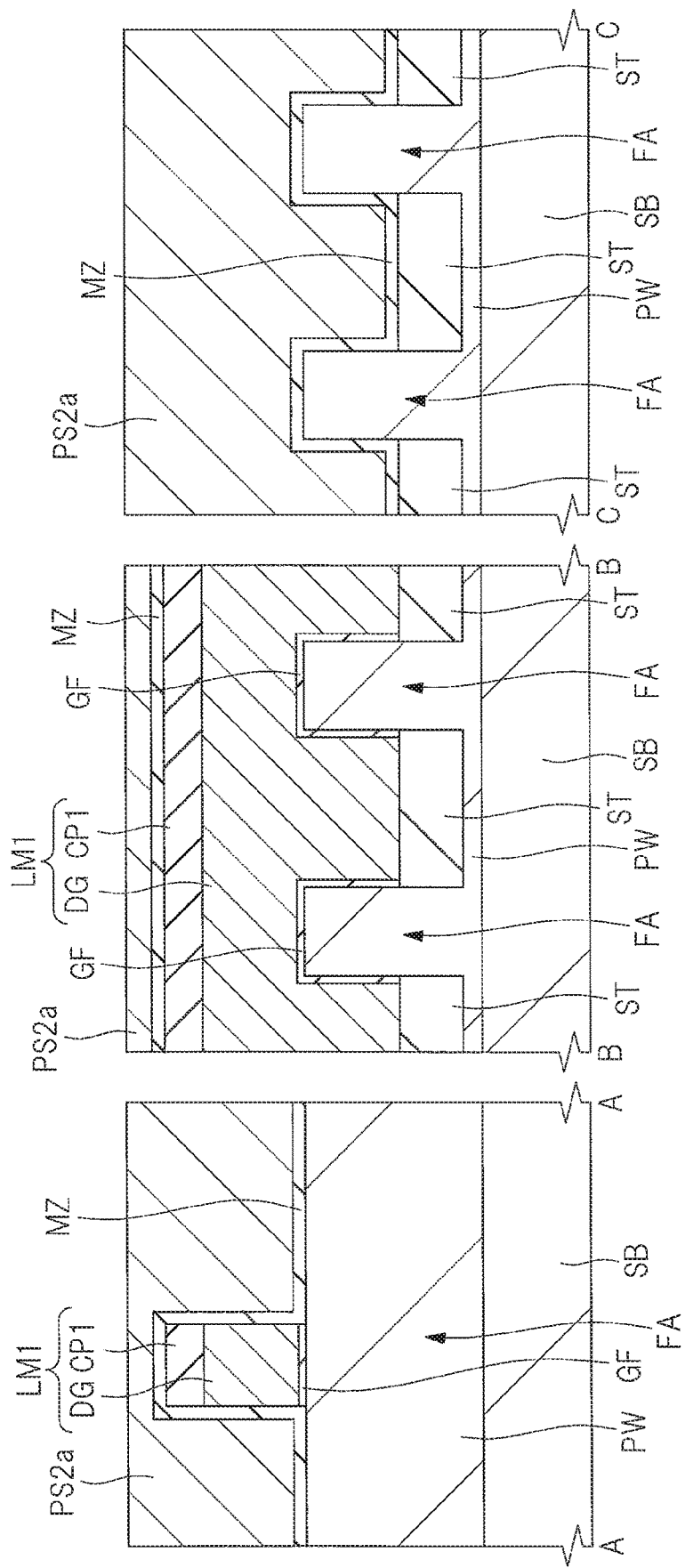
FIG. 43 is a cross-sectional view showing the principal part in the manufacturing process of the semiconductor device continued from FIG. 42.

Next, like the case where the silicon film PS2 is polished in the first embodiment described above (FIG. 16), the upper surface of the silicon film PS2a is planarized by polishing the silicon film PS2a by the CMP method or the like also in the second embodiment as shown in FIG. 43.

Figure 44:
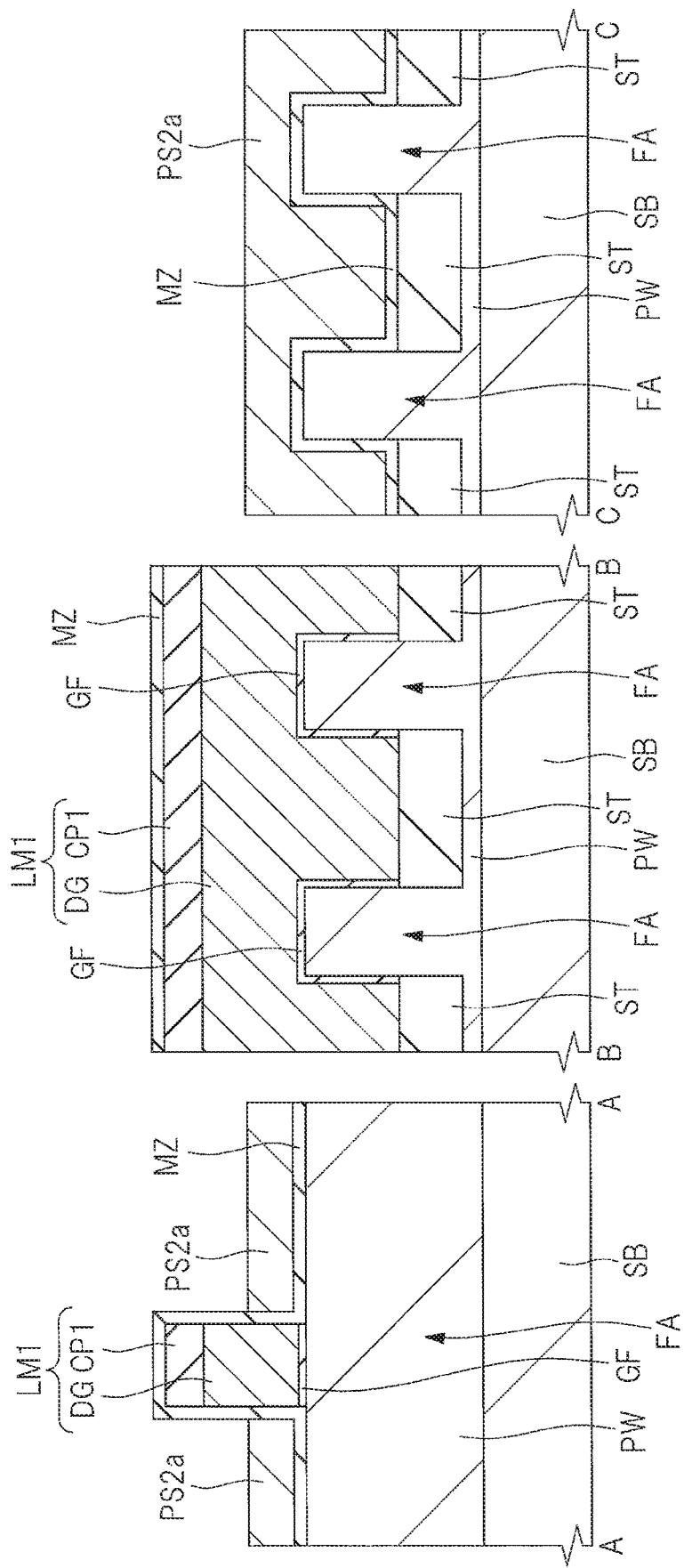
FIG. 44 is a cross-sectional view showing the principal part in the manufacturing process of the semiconductor device continued from FIG. 43.

Next, as shown in FIG. 44, the silicon film PS2a is etched to reduce the height of the upper surface of the silicon film PS2a. The etching process to reduce the height of the upper surface of the silicon film PS2a is the same in the method as the process of FIG. 17 of the first embodiment described above, but the height position of the upper surface of the silicon film PS2a at the end of the etching (FIG. 44) is different from the height position of the upper surface of the silicon film PS2 in FIG. 17.

Namely, the height position of the upper surface of the silicon film PS2a in FIG. 44 is lower than the height position of the upper surface of the silicon film PS2 in FIG. 17. Specifically, in the case of the second embodiment (FIG. 44), the height position of the upper surface of the silicon film PS2a is lower than the height position of the upper surface of the dummy control gate electrode DG constituting the stacked body LM1. Therefore, in FIG. 44, a part of the stacked body LM1 (upper part of the dummy control gate electrode DG and the cap insulating film CP1) and the insulating film MZ on the surface thereof project upward from the flat upper surface of the silicon film PS2a. Also at this stage, the upper surface of the silicon film PS2a is flat.

Figure 45:
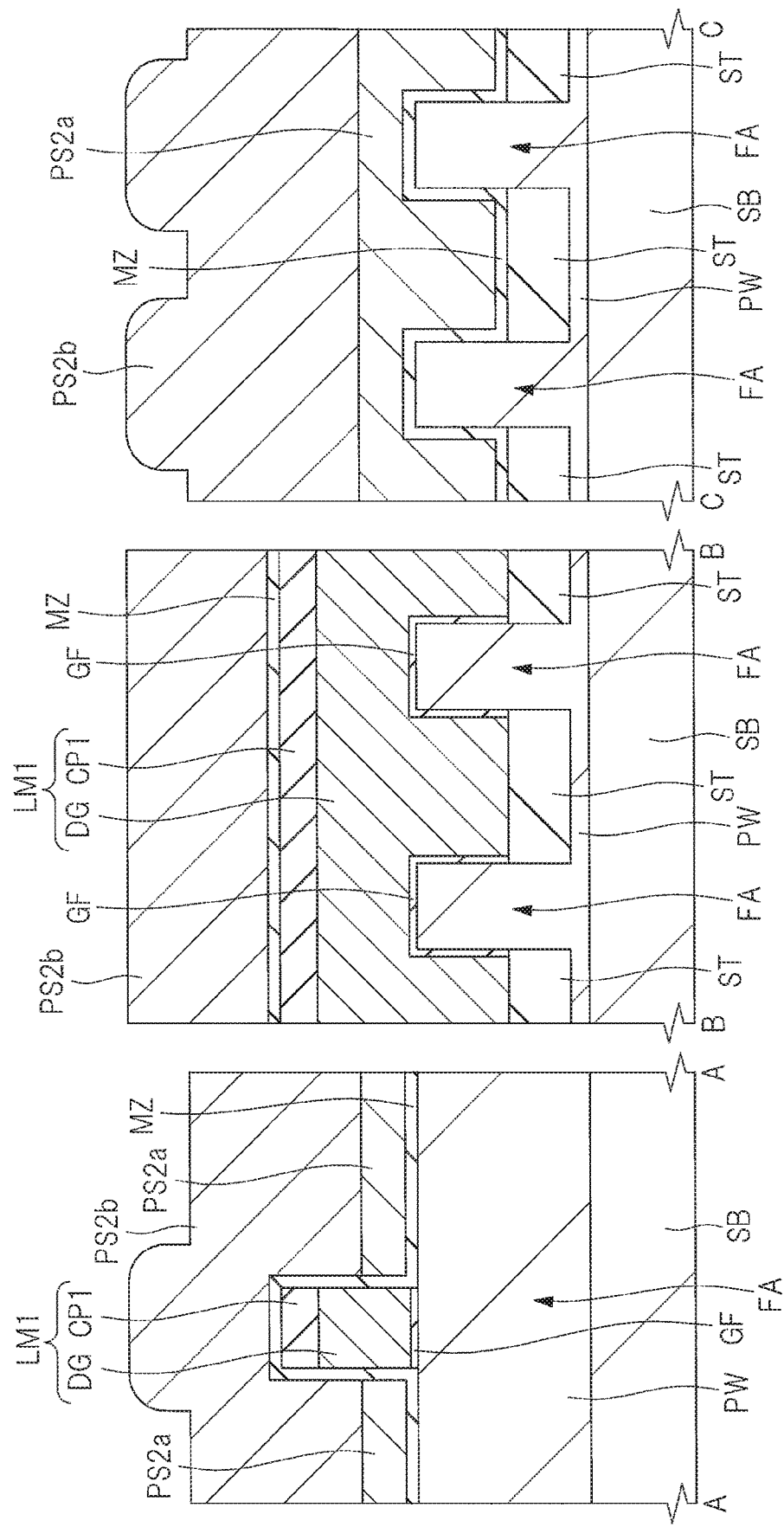
FIG. 45 is a cross-sectional view showing the principal part in the manufacturing process of the semiconductor device continued from FIG. 44.

Next, as shown in FIG. 45, a silicon film PS2b is formed (deposited) over the semiconductor substrate SB, that is, on the silicon film PS2a so as to cover the stacked body LM1. The silicon film PS2b is made of a polycrystalline silicon film, and can be formed by the CVD method or the like. A deposition thickness of the silicon film PS2b is set such that any region of the upper surface of the silicon film PS2b becomes higher than the height position of the upper surface of the stacked body LM1, and the deposition thickness of the silicon film PS2b may be set to, for example, about 150 to 250 nm.

The silicon film PS2b is a p type silicon film into which a p type impurity has been introduced (doped polysilicon film). By using the gas containing doping gas (gas for adding a p type impurity) as the gas for forming the silicon film PS2b, a p type impurity can be introduced into the silicon film PS2b at the time of forming the silicon film PS2b. As another embodiment, it is also possible to introduce a p type impurity into the silicon film PS2b by ion implantation after forming the non-doped silicon film PS2b.

In addition, it is also possible to form an extremely thin oxide film (silicon oxide film) on the surface of the silicon film PS2a by performing cleaning treatment with SPM (Sulfuric acid-Hydrogen Peroxide Mixture) or the like before forming the silicon film PS2b. In this case, although a thin oxide film is interposed at the interface between the silicon film PS2b and the silicon film PS2a, since the oxide film is extremely thin, the electric conduction between the silicon film PS2b and the silicon film PS2 is possible. When a thin oxide film is interposed at the interface between the silicon film PS2b and the silicon film PS2a, the oxide film can exert an effect of preventing mutual diffusion between the p type impurity in the silicon film PS2b and the n type impurity in the silicon film PS2a.

Figure 46:
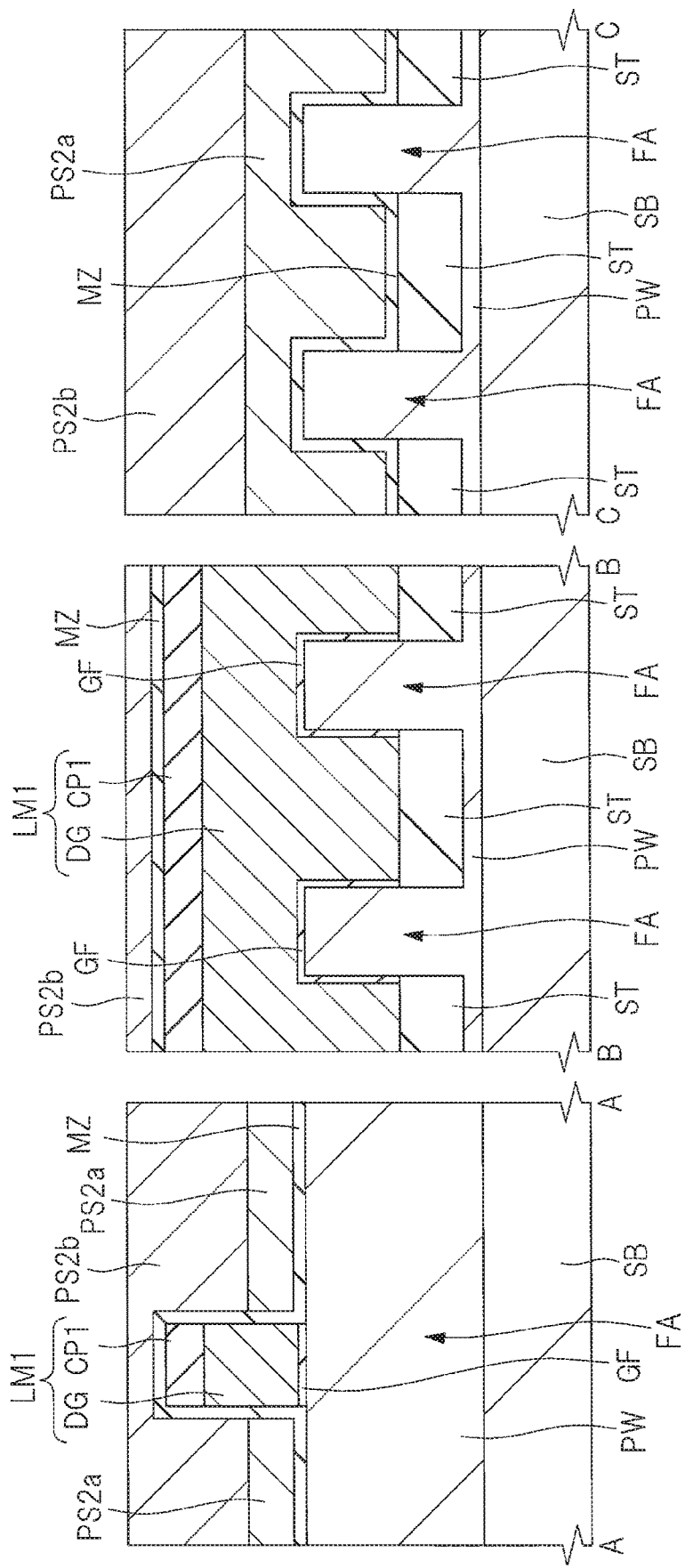
FIG. 46 is a cross-sectional view showing the principal part in the manufacturing process of the semiconductor device continued from FIG. 45.

Next, as shown in FIG. 46, the upper surface of the silicon film PS2b is planarized by polishing the silicon film PS2b by the CMP method or the like. This polishing process of the silicon film PS2b is basically the same as the polishing process of the silicon film PS2 described above (process of FIG. 16).

Figure 47:
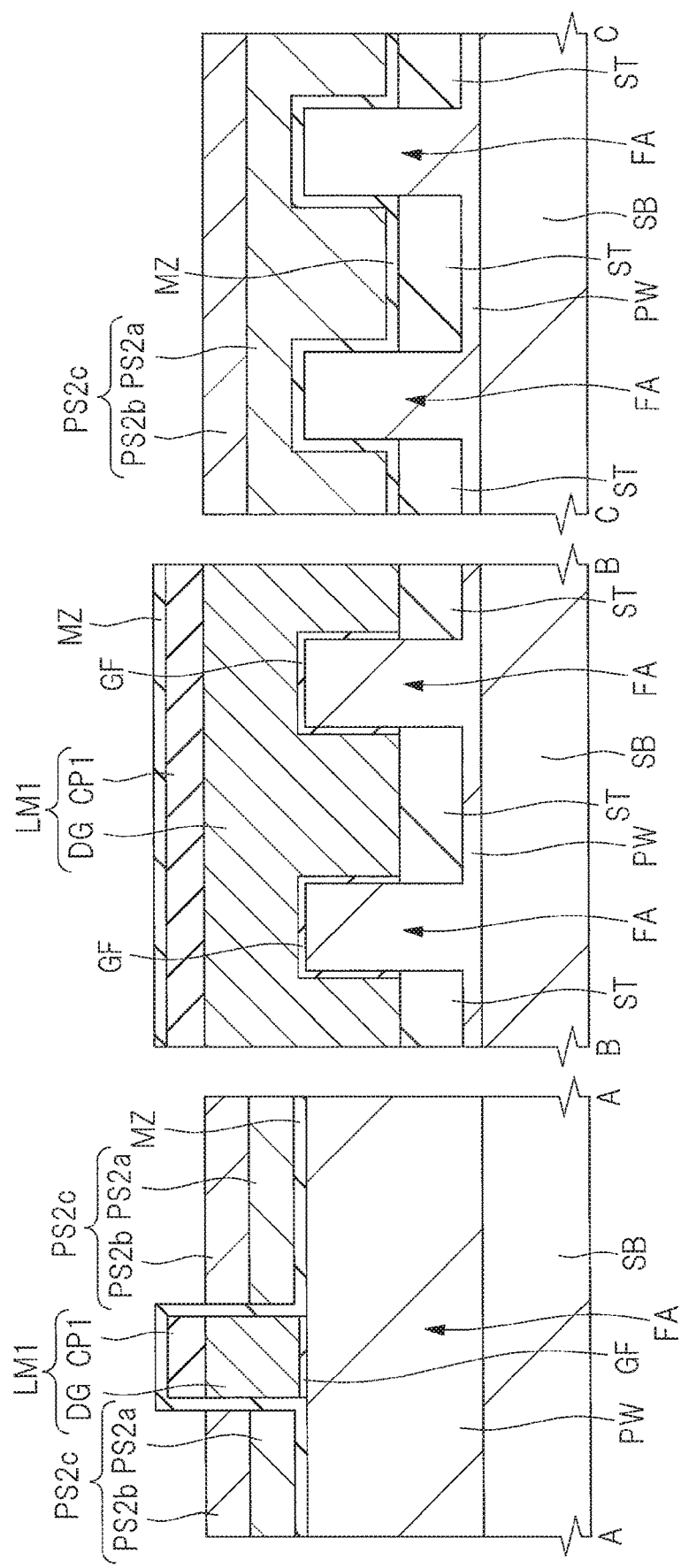
FIG. 47 is a cross-sectional view showing the principal part in the manufacturing process of the semiconductor device continued from FIG. 46.

Next, as shown in FIG. 47, the silicon film PS2b is etched to reduce the height of the upper surface of the silicon film PS2b. The etching process to reduce the height of the upper surface of the silicon film PS2b is the same in the method as the process of FIG. 17 of the first embodiment described above. As a result, the upper surface of the silicon film PS2b is recessed (lowered) in the direction perpendicular to the main surface of the semiconductor substrate SB, and the height position of the upper surface of the silicon film PS2b becomes lower than the height position of the upper surface of the stacked body LM1. At this stage, it is more preferable that the height position of the upper surface of the silicon film PS2b is substantially equal to the height position of the upper surface of the dummy control gate electrode DG constituting the stacked body LM1. Thus, a part of the stacked body LM1 (cap insulating film CP1) and the insulating film MZ on the surface thereof project upward from the flat upper surface of the silicon film PS2b. Also at this stage, the upper surface of the silicon film PS2b is flat.

The stage of FIG. 47 in the second embodiment corresponds to the stage of FIG. 17 in the first embodiment described above. The structure of FIG. 47 in the second embodiment differs from the structure of FIG. 17 in the first embodiment in that the p type silicon film PS2 in the structure of FIG. 17 is replaced with a stacked film PS2c including the n type silicon film PS2a and the p type silicon film PS2b thereon in the structure of FIG. 47. Other than that, the structure of FIG. 47 in the second embodiment and the structure of FIG. 17 in the first embodiment are basically the same. Note that the stacked film PS2c is a stacked film including the silicon film PS2a having a flat upper surface and the silicon film PS2b formed on the flat upper surface of the silicon film PS2a, and the upper surface of the silicon film PS2b is also flat. In addition, the preferable p type impurity concentration of the p type silicon film PS2b is the same as that of the p type silicon film PS2 in the first embodiment described above.

The subsequent process in the second embodiment is almost the same as that in the first embodiment. For this reason, the process of FIGS. 18 to 34 of the first embodiment described above is performed in substantially the same manner as the first embodiment. Therefore, the description of the subsequent process can be applied also to the second embodiment if "silicon film PS2" is replaced with "stacked film PS2c" in the description of the process of FIGS. 18 to 34 of the first embodiment. Thus, the repetitive descriptions thereof are almost omitted here, but characteristic points will be described below.

Figure 48:
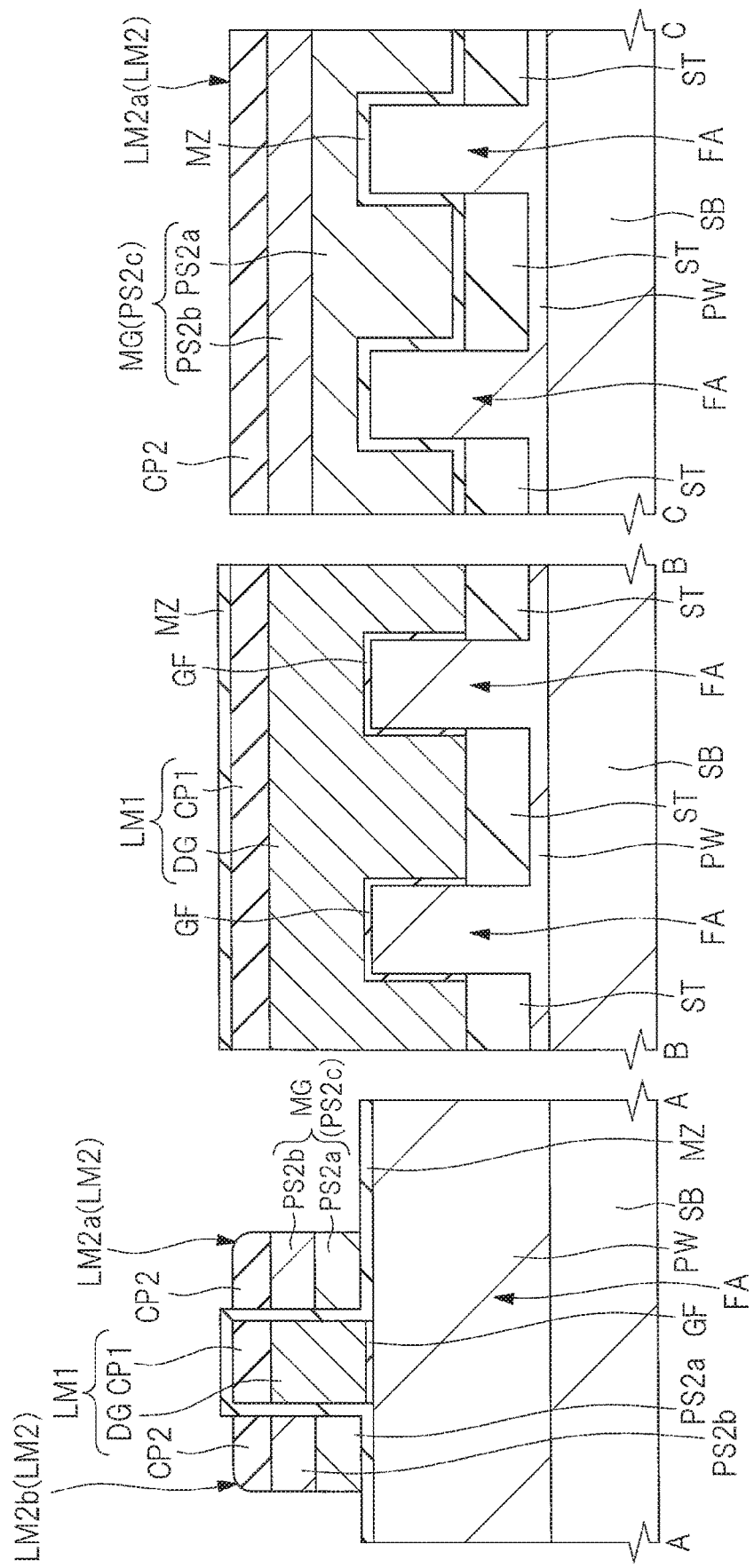
FIG. 48 is a cross-sectional view showing the principal part in the manufacturing process of the semiconductor device continued from FIG. 47.

FIG. 48 shows the same process stage as that of FIG. 20 of the first embodiment described above. In the second embodiment, the stacked film PS2c is used instead of the silicon film PS2 in the first embodiment, and thus the memory gate electrode MG is formed of the stacked film 2c including the n type silicon film PS2a and the p type silicon film PS2b thereon as shown in FIG. 48. The silicon film PS2a constituting the memory gate electrode MG has the flat upper surface, and the memory gate electrode MG is formed of the stacked film PS2c including the silicon film PS2a and the silicon film PS2b formed on the flat upper surface of the silicon film PS2a. Therefore, in FIG. 48, the stacked body LM2a is composed of the memory gate electrode MG formed of the stacked film PS2c including the n type silicon film PS2a and the p type silicon film PS2b and the cap insulating film CP2 on the memory gate electrode MG, and the cap insulating film CP2 is arranged on the silicon film PS2b constituting the memory gate electrode MG.

Figure 49:
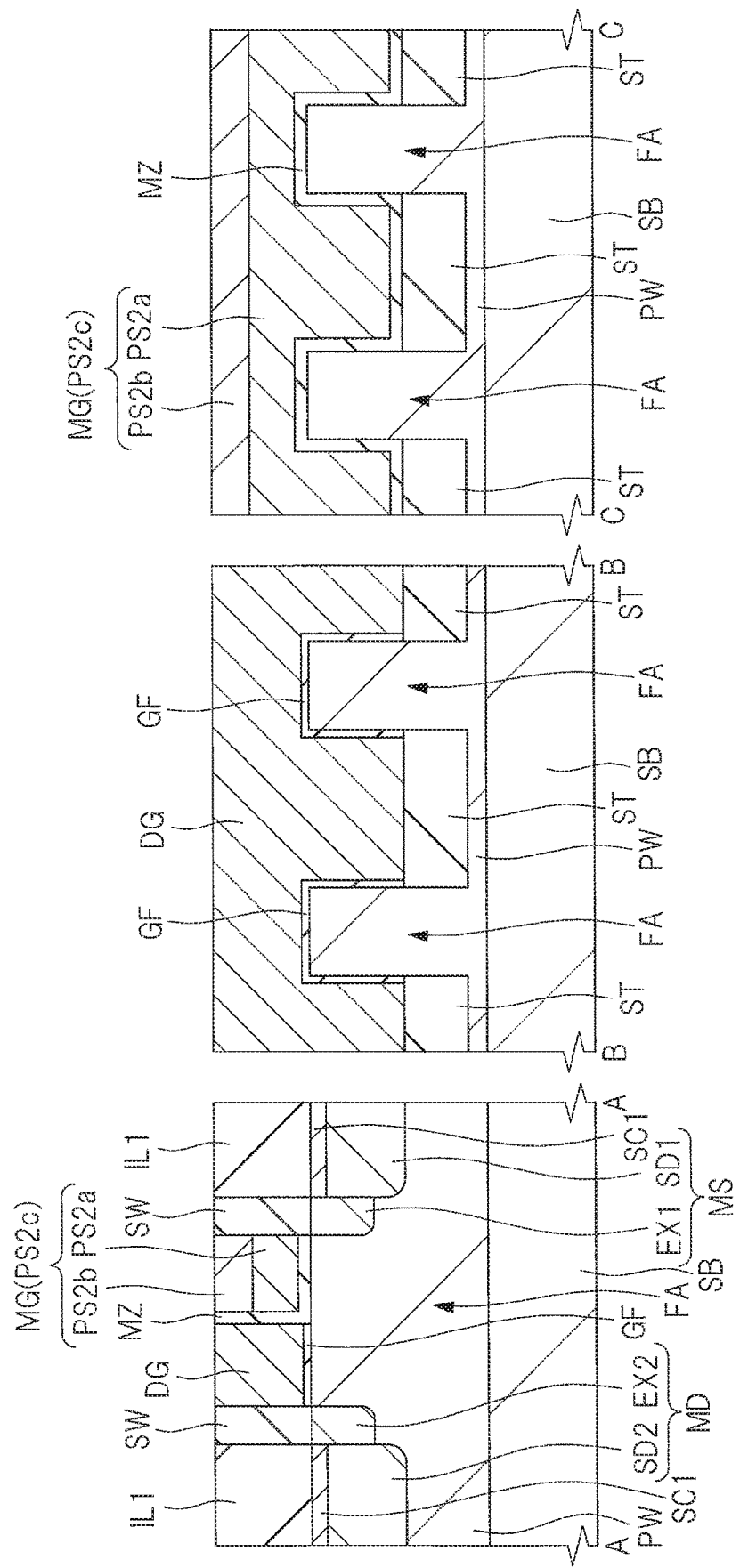
FIG. 49 is a cross-sectional view showing the principal part in the manufacturing process of the semiconductor device continued from FIG. 48.

FIG. 49 shows the same process stage as that of FIG. 26 of the first embodiment described above, and FIG. 50 shows the same process stage as that of FIG. 27 of the first embodiment described above. The process corresponding to "polishing process of FIG. 26" in the first embodiment described above is referred to as "polishing process of FIG. 49" in the second embodiment. Also, the process corresponding to "etching process of FIG. 27" in the first embodiment described above is referred to as "etching process of FIG. 50" in the second embodiment.

In the second embodiment, when the polishing process of FIG. 49 corresponding to the polishing process of FIG. 26 is performed, as shown in FIG. 49, the upper surfaces of the dummy control gate electrode DG and the memory gate electrode MG are exposed, and the upper surface of the silicon film PS2b constituting the memory gate electrode MG is exposed, whereas the silicon film PS2a constituting the memory gate electrode MG is not exposed. Other than that, the polishing process of FIG. 49 in the second embodiment is the same as the polishing process of FIG. 26 in the first embodiment, and thus the repetitive descriptions thereof are omitted here.

Figure 50:
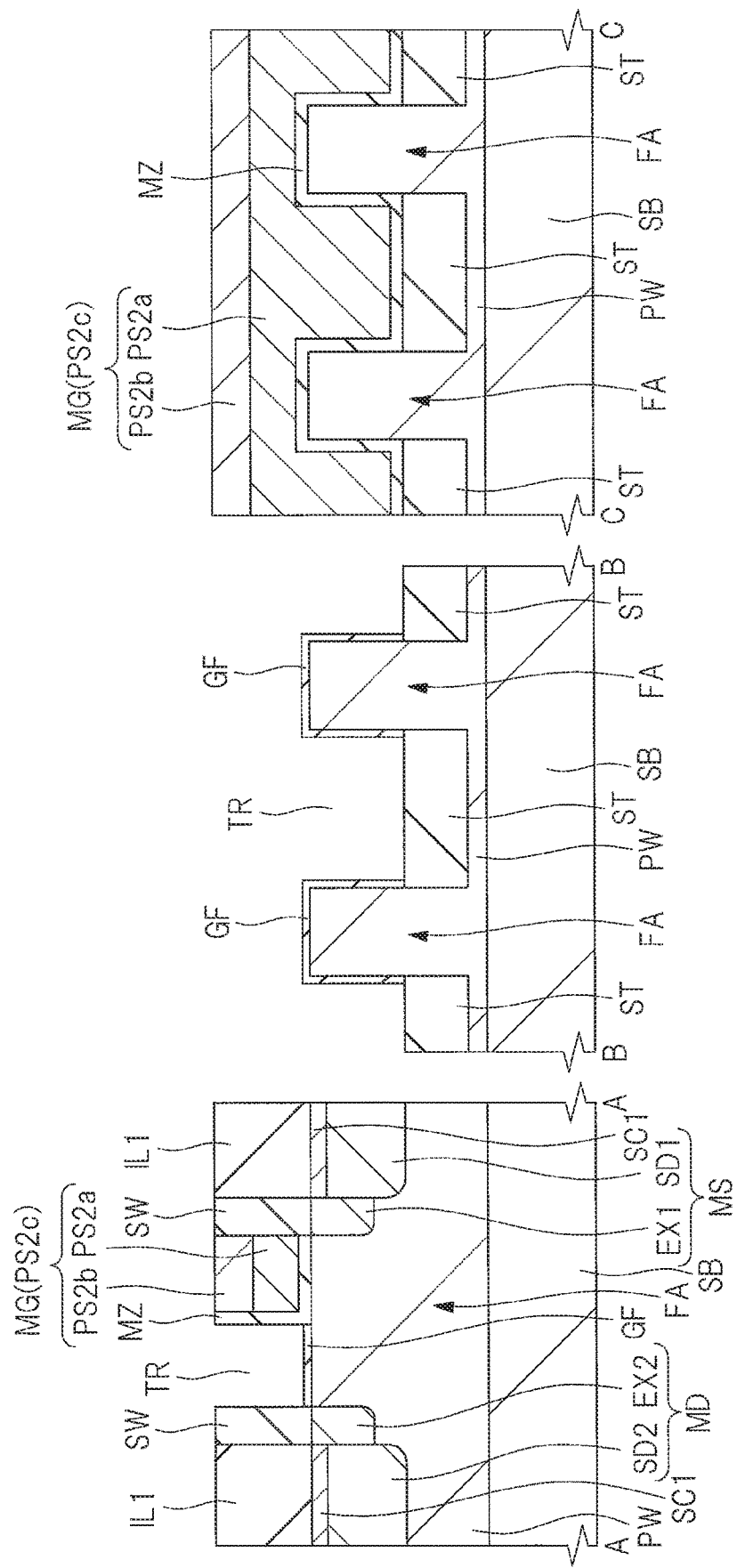
FIG. 50 is a cross-sectional view showing the principal part in the manufacturing process of the semiconductor device continued from FIG. 49.

Further, in the second embodiment, when the etching process of FIG. 50 corresponding to the etching process of FIG. 27 is performed, the dummy control gate electrode DG is selectively etched and removed as shown in FIG. 50.

The etching process of FIG. 50 is performed in the state where (the upper surface of) the silicon film PS2b constituting the memory gate electrode MG and (the upper surface of) the dummy control gate electrode DG are exposed. Therefore, in the second embodiment, the etching is performed under the condition that the p type silicon film PS2b constituting the memory gate electrode MG is less likely to be etched compared with the dummy control gate electrode DG made of a non-doped or n type silicon film in the etching process of FIG. 50. More specifically, in the etching process of FIG. 50, the etching is performed under the condition that the p type silicon film PS2b constituting the memory gate electrode MG, the insulating film GF, the insulating film MZ, the sidewall spacer SW, and the interlayer insulating film IL1 are less likely to be etched compared with the dummy control gate electrode DG. As a result, in the etching process of FIG. 50, the dummy control gate electrode DG can be selectively removed by etching. In the etching process of FIG. 50, the n type silicon film PS2a constituting the memory gate electrode MG is covered with the p type silicon film PS2b and is not exposed, and is thus not etched. Other than that, the etching process of FIG. 50 in the second embodiment is the same as the etching process of FIG. 27 in the first embodiment, and thus the repetitive descriptions thereof are omitted here.

Figure 51:
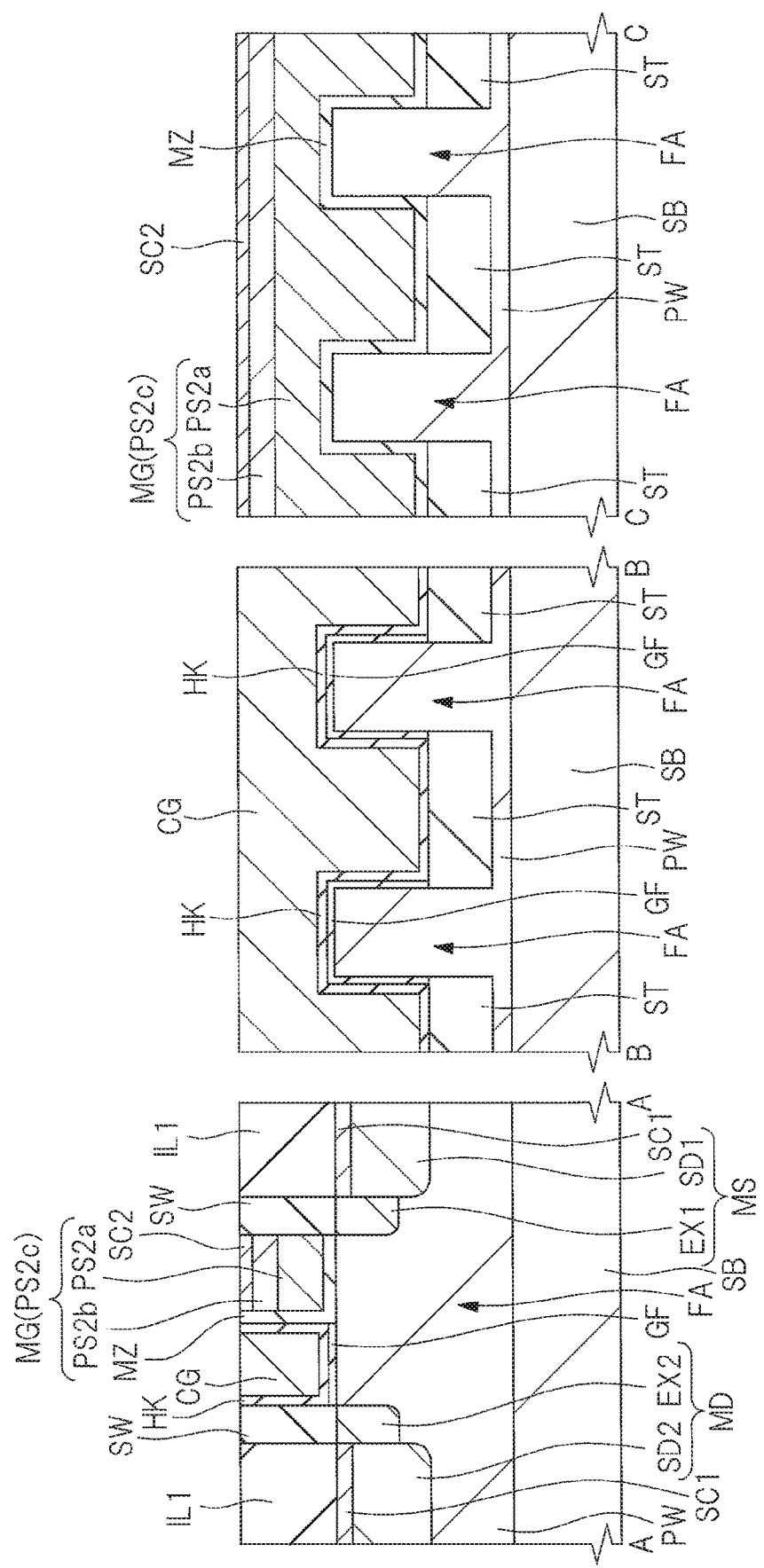
FIG. 51 is a cross-sectional view showing the principal part in the manufacturing process of the semiconductor device continued from FIG. 50.

FIG. 51 shows the same process stage as that of FIG. 31 of the first embodiment described above, and FIG. 52 shows the same process stage as that of FIG. 34 of the first embodiment described above.

Also in the second embodiment, the metal silicide layer SC2 is formed in the upper part (surface layer portion) of the memory gate electrode MG in the same manner as the first embodiment as shown in FIG. 51. However, in the second embodiment, the metal silicide layer SC2 is formed in the upper part (surface layer portion) of the silicon film PS2b constituting the memory gate electrode MG as shown in FIG. 51. Other than that, the forming process of the metal silicide layer SC2 in the second embodiment is the same as the forming process of the metal silicide layer SC2 in the first embodiment, and thus the repetitive descriptions thereof are omitted here.

Figure 52:
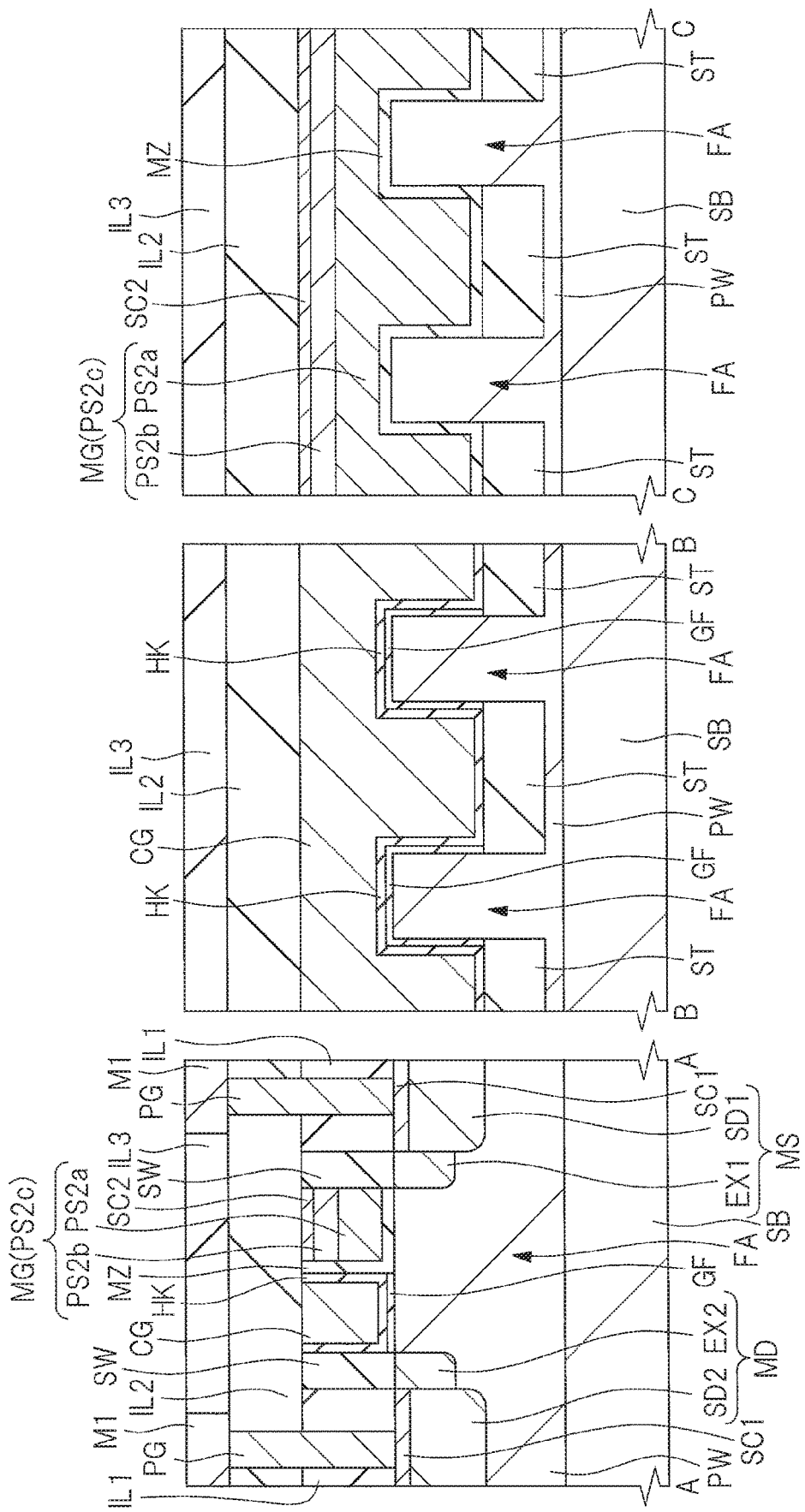
FIG. 52 is a cross-sectional view showing the principal part in the manufacturing process of the semiconductor device continued from FIG. 51.

In the case of the second embodiment, in the manufactured semiconductor device, as shown in FIG. 52, the memory gate electrode MG is composed of the stacked film including the n type silicon film PS2a and the p type silicon film PS2b on the silicon film PS2a, and the metal silicide layer SC2 is formed in the upper part (surface layer portion) of the p type silicon film PS2b constituting the memory gate electrode MG. The metal silicide layer SC2 is in contact with the silicon film PS2b constituting the memory gate electrode MG, but is not in contact with the silicon film PS2a constituting the memory gate electrode MG. Other than that, the structure of the semiconductor device in the second embodiment (FIG. 52) is the same as the structure of the semiconductor device in the first embodiment (FIGS. 1 to 5 and 34), and thus the repetitive descriptions thereof are omitted here.

In the first embodiment described above, the entire memory gate electrode MG is formed of a p type silicon film in the manufactured semiconductor device. However, it is sometimes desired to form the memory gate electrode MG from an n type silicon film in view of characteristics, reliability, operation method, and others, and the second embodiment is preferably applied in such a case. For example, the threshold voltage of the memory transistor can be lowered more in the case where the memory gate electrode is made of an n type silicon film than in the case where the memory gate electrode is made of a p type silicon film.

In the second embodiment, since the lower part of the memory gate electrode MG is formed of the n type silicon film PS2a in the manufactured semiconductor device, it is possible to satisfy the requirement in the case where it is desired to form the memory gate electrode from an n type silicon film. For example, since the lower part of the memory gate electrode MG is formed of the n type silicon film PS2a in the second embodiment, the threshold voltage of the memory transistor can be made lower in the second embodiment than in the first embodiment in which the entire memory gate electrode MG is formed of a p type silicon film. Thus, the second embodiment is suitable for the case where it is desired to lower the threshold voltage of the memory transistor or the like.

Further, in the second embodiment, the dummy control gate electrode DG is formed of the non-doped or n type silicon film, and the memory gate electrode MG is formed of the stacked film including the n type silicon film PS2a and the p type silicon film PS2b on the silicon film PS2a. Accordingly, even when etching is performed in the state where both of the dummy control gate electrode DG and (the silicon film PS2b of) the memory gate electrode MG are exposed in the etching process of FIG. 50, the dummy control gate electrode DG can be selectively removed by etching. Thus, it is possible to reliably remove the dummy control gate electrode DG, while suppressing or preventing the memory gate electrode MG from being etched, without forming what corresponds to the photoresist pattern PR101 described above. Therefore, the effects described in the first embodiment can be achieved also in the second embodiment.

Further, in the case of the second embodiment, since the memory gate electrode MG is formed of the stacked film including the n type silicon film PS2a and the p type silicon film PS2b on the silicon film PS2a, the following effects can be achieved in addition to the effects related to the etching process of FIG. 50.

Namely, in the case where a metal silicide layer is formed on a p type silicon film and an n type silicon film by the salicide process, the metal silicide layer formed on the p type silicon film tends to have lower sheet resistance than that of the metal silicide layer formed on the n type silicon film. In addition, the metal silicide layer formed on the p type silicon film tends to be thinner than the metal silicide layer formed on the n type silicon film. Therefore, the sheet resistance of the metal silicide layer SC2 formed on the memory gate electrode MG can be made lower in the case where the memory gate electrode MG is formed of the stacked film including the n type silicon film PS2a and the p type silicon film PS2b on the silicon film PS2a like in the second embodiment than in the case where the entire memory gate electrode is formed of an n type silicon film. As a result, it is possible to reduce the resistance of the memory gate electrode MG, so that performance of the semiconductor device such as the operation speed can be improved. Further, the thickness of the metal silicide layer SC2 formed on the memory gate electrode MG can be more easily controlled in the case where the memory gate electrode MG is formed of the stacked film including the n type silicon film PS2a and the p type silicon film PS2b on the silicon film PS2a (second embodiment) than in the case where the entire memory gate electrode is formed of the n type silicon film, and it is possible to reduce the risk of the metal silicide layer SC2 coming into contact with the control gate electrode CG. As a result, it is possible to further improve the reliability of the semiconductor device.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device having a memory cell of a non-volatile memory, the method comprising:
    (a) preparing a semiconductor substrate;
    (b) forming a dummy gate electrode on the semiconductor substrate via a first insulating film, and forming a first cap insulating film on the dummy gate electrode;
    (c) forming a first gate electrode for the memory cell on the semiconductor substrate via a second insulating film having a charge accumulating portion therein, and forming a second cap insulating film on the first gate electrode, the first gate electrode being adjacent to the dummy gate electrode;
    (d) forming a first interlayer insulating film so as to cover the first cap insulating film, the second cap insulating film, the dummy gate electrode and the first gate electrode;
    (e) polishing the first interlayer insulating film, the first cap insulating film and the second cap insulating film to expose the dummy gate electrode and the first gate electrode;
    (f) removing the dummy gate electrode by etching after the step (e); and
    (g) forming a second gate electrode for the memory cell in a trench which is a region from which the dummy gate electrode has been removed in the step (f),
    wherein the dummy gate electrode is made of a non-doped or an n type silicon film,
    wherein the first gate electrode is made of a p type silicon film,
    wherein, in the step (f), the dummy gate electrode is removed by performing the etching under a condition that the first gate electrode is less likely to be etched compared with the dummy gate electrode, in a state where the dummy gate electrode and the first gate electrode are exposed.

2. The manufacturing method of a semiconductor device according to claim 1,
    wherein the dummy gate electrode is made of the n type silicon film,
    wherein the method further comprises:
        (c1) after the step (c) and before the step (d), forming a source and a drain of the memory cell in the semiconductor substrate exposed from the first cap insulating film, the second cap insulating film, the dummy gate electrode and the first gate electrode, by implanting an n-type impurity into the semiconductor substrate in a state where the second cap insulating film is formed on the first gate electrode; and
    forming a plurality of fins projecting from the semiconductor substrate to form an active region of the semiconductor substrate,
    wherein the second gate electrode comprises a metal gate electrode.

3. The manufacturing method of a semiconductor device according to claim 2,
    wherein an n type impurity concentration of the dummy gate electrode is $1 \times 10^{20}/cm^3$ or higher.

4. The manufacturing method of a semiconductor device according to claim 1,
    wherein a p type impurity concentration of the first gate electrode is $1 \times 10^{20}/cm^3$ or higher.

5. The manufacturing method of a semiconductor device according to claim 1,
    wherein the dummy gate electrode is removed by wet etching in the step (f).

6. The manufacturing method of a semiconductor device according to claim 1,
wherein the dummy gate electrode is removed by wet etching using ammonia water in the step (f).

7. The manufacturing method of a semiconductor device according to claim 1,
wherein the dummy gate electrode is removed by a first wet etching process using an ammonia-peroxide mixture (APM) and a second wet etching process using ammonia water after the first wet etching process in the step (f).

8. The manufacturing method of a semiconductor device according to claim 1,
wherein the first gate electrode formed in the step (c) is adjacent to the dummy gate electrode via the second insulating film.

9. The manufacturing method of a semiconductor device according to claim 8,
wherein the condition comprises a condition that the first gate electrode, the first insulating film, the second insulating film, and the first interlayer insulating film are less likely to be etched compared with the dummy gate electrode, in the state where the dummy gate electrode and the first gate electrode are exposed.

10. The manufacturing method of a semiconductor device according to claim 1,
wherein the second gate electrode is a metal gate electrode.

11. The manufacturing method of a semiconductor device according to claim 10,
wherein the second gate electrode is formed in the trench via a high dielectric constant insulating film in the step (g).

12. The manufacturing method of a semiconductor device according to claim 1,
wherein the first gate electrode is composed of a stacked film including an n type first silicon film and the p type silicon film is formed on the n type first silicon film, and
wherein the condition comprises a condition that the p type silicon film of the first gate electrode is less likely to be etched compared with the dummy gate electrode, in a state where the dummy gate electrode and the p type silicon film of the first gate electrode are exposed.

13. The manufacturing method of a semiconductor device according to claim 12,
wherein the dummy gate electrode is made of the n type silicon film.

14. The manufacturing method of a semiconductor device according to claim 12, further comprising:
(h) a step of forming a metal silicide layer on the p-type silicon film of the first gate electrode after the step (g).

15. The manufacturing method of a semiconductor device according to claim 1, further comprising: after the step (a) and before the step (b),
(a1) a step of forming a projecting portion, which is made of a part of the semiconductor substrate and extends in a first direction along an upper surface of the semiconductor substrate, on the upper surface of the semiconductor substrate; and
(a2) a step of forming an element isolation film on the semiconductor substrate so as to surround the projecting portion,
wherein, in the step (b), the dummy gate electrode is formed on the projecting portion of the semiconductor substrate via the first insulating film, and
wherein, in the step (c), the first gate electrode is formed on the projecting portion of the semiconductor substrate via the second insulating film so as to be adjacent to the dummy gate electrode via the second insulating film.

16. The manufacturing method of a semiconductor device according to claim 1, wherein the second gate electrode is formed in the trench via a high dielectric constant insulating film in the step (g), and
wherein the high dielectric constant insulating film contacts the second insulating film between the first and second gate electrodes.

17. The manufacturing method of a semiconductor device according to claim 1, wherein the first gate electrode comprises a memory gate electrode of the memory cell, and the second gate electrode comprises a control gate electrode of the memory cell.

18. A manufacturing method of a semiconductor device having a memory cell of a non-volatile memory, the method comprising:
preparing a semiconductor substrate which comprises a projecting portion including a side surface and an upper surface connected to the side surface;
forming a dummy gate electrode on the projecting portion of the semiconductor substrate via a first insulating film, and forming a first cap insulating film on the dummy gate electrode;
forming a first gate electrode for the memory cell on the projecting portion of the semiconductor substrate via a second insulating film having a charge accumulating portion therein, and forming a second cap insulating film on the first gate electrode, the first gate electrode being adjacent to the dummy gate electrode;
forming a first interlayer insulating film so as to cover the first cap insulating film, the second cap insulating film, the dummy gate electrode and the first gate electrode;
polishing the first interlayer insulating film, the first cap insulating film and the second cap insulating film to expose the dummy gate electrode and the first gate electrode;
after the polishing of the first interlayer insulating film, removing the dummy gate electrode by etching to form a trench on the upper surface of the projecting portion and on the side surface of the projecting portion; and
forming a second gate electrode for the memory cell in the trench,
wherein the dummy gate electrode comprises a non-doped silicon film or an n type silicon film,
wherein the first gate electrode comprises a p type silicon film,
wherein the removing of the dummy gate electrode comprises performing the etching under a condition that the first gate electrode is less likely to be etched compared with the dummy gate electrode, in a state where the dummy gate electrode and the first gate electrode are exposed.

19. The manufacturing method of a semiconductor device according to claim 1, wherein the first gate electrode comprises a memory gate electrode of the memory cell, and the second gate electrode comprises a control gate electrode of the memory cell, the control gate comprising a conductive metal layer,
wherein the first gate electrode formed in the step (c) is adjacent to the dummy gate electrode via the second insulating film, and
wherein the first gate electrode is composed of a stacked film including an n type first silicon film and the p type silicon film is formed on the n type first silicon film.

20. The manufacturing method of a semiconductor device according to claim 18, wherein the second gate electrode comprises a conductive metal layer while the first gate electrode is a semiconductor including a stacked film.

* * * * *